US005847566A

United States Patent [19]

Marritt et al.

[11] Patent Number: 5,847,566

[45] Date of Patent: *Dec. 8, 1998

[54] BATTERY CAPACITY CALCULATION METHOD

[75] Inventors: William A. Marritt; Toshihiko Yamazaki, both of Suwa, Japan

[73] Assignee: Seiko Epson Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 472,420

[22] Filed: Jun. 7, 1995

[30] Foreign Application Priority Data

| | | | |
|---|---|---|---|
| Sep. 16, 1994 | [JP] | Japan | 6-222057 |
| Mar. 29, 1995 | [JP] | Japan | 7-072143 |

[51] Int. Cl.[6] .......... G01N 27/416

[52] U.S. Cl. .......... 324/427; 320/218; 320/44; 702/63; 364/483

[58] Field of Search .......... 324/427; 364/481, 364/483; 320/48, 44

[56] References Cited

U.S. PATENT DOCUMENTS

| | | | |
|---|---|---|---|
| 3,886,442 | 5/1975 | Chiku | 324/29.5 |
| 3,906,329 | 9/1975 | Bader | 320/44 |
| 4,193,026 | 3/1980 | Finger et al. | 324/428 |
| 4,573,126 | 2/1986 | Lefebvre et al. | 364/481 |
| 4,595,880 | 6/1986 | Patil | 324/427 |
| 5,151,865 | 9/1992 | Blessing et al. | 364/483 |
| 5,185,566 | 2/1993 | Goedken | 320/48 |
| 5,617,324 | 4/1997 | Arai | 364/483 |

*Primary Examiner*—Vinh P. Nguyen
*Assistant Examiner*—Thomas Valone
*Attorney, Agent, or Firm*—Oliff & Berridge PLC

[57] ABSTRACT

A battery capacity meter and a method for precisely calculating a battery capacity are obtained by measuring a terminal voltage of the battery and sequentially calculating the measured terminal voltages. In a battery capacity meter of the present invention, a calculation process is carried out. After a power source is connected to the battery capacity meter, an initial value $S_0$ under non-consistent charge state $S_i$ is calculated from an initial value $V_0$ of a terminal voltage $V_i$. Next, $V_i$ and $S_i$ are related to a current $I_i$, and an equation for relating a variation amount $\Delta S_i$ of $S_i$ to $S_i$ is formed. Under this relationship, $\Delta S_i$ is obtained from $V_i$ and $S_i$ in a time interval $\Delta t$. A value of $S_i$ is updated. Either a remaining capacity or a fuel-gauge normalized remaining capacity are obtained from the updated value of $S_i$. A process operation is returned to a step where $\Delta S_i$ is calculated, and this process is repeated.

8 Claims, 59 Drawing Sheets

BATTERY CAPACITY CALCULATION METHOD

FIELD OF THE INVENTION

The present invention relates to a battery capacity meter for a battery used to supply power to a drive source of an electric vehicle.

BACKGROUND OF THE RELATED ART

At the present time, the great majority of all operating vehicles in the world are powered by internal combustion engines. An internal combustion engine powered vehicle will be referred to by an abbreviation CV (conventional vehicle) in the following descriptions. In contrast, only a small fraction of all operating vehicles in the world at the present time are powered by electrical energy that is supplied from a battery to an electric motor. In subsequent references to this type of vehicle, the abbreviation EV (electrical vehicle) will be used.

FIG. 3 schematically shows an electric scooter 21 as a concrete example of the EV. The specific structures of the electric scooter 21 include the battery capacity meter 1, the battery 11, the battery charger 13, the motor controller 15 and the electric drive motor 17.

Since an EV is not yet in common use, those features that a potential purchaser of an EV expects and wants to be included in an EV are not yet clearly determined. However, because most potential purchasers of an EV have considerable experience with CVs, their expectations and wants will likely be strongly influenced by their experience with CVs. Potential purchasers of an EV will expect and want the same type of performance out of battery capacity meter component of an EV, as they presently obtain from that component which fulfills the same function in a CV, namely the fuel meter. Before describing the related art with respect to the battery capacity meters, it is worthwhile to elaborate on the similarities and differences between a CV and an EV for those elements that relate closely to the fuel meter and the battery capacity meter.

A source of energy for a CV is generally a liquid fuel capable of burning in an internal combustion engine. A liquid fuel used by a CV is stored in a fuel tank. Typical liquid fuels include gasoline, diesel fuel, methanol, ethanol and so on. In contrast, a source of energy for an EV is electrical energy. The electrical energy used by the EV is stored in a battery. A battery is a device that converts chemical energy contained in its active materials directly into electrical energy by means of an electrochemical oxidation-reduction (redox) reaction. This type of reaction involves the transfer of electrons from one material to another material through an electrical circuit.

The three major components of a battery are the two electrodes, the anode and the cathode, and the electrolyte. When a battery is connected to an external load, the battery discharges with electrons flowing through the external load. Batteries used in EVs are generally rechargeable. They can be recharged electrically to their original condition by passing current through them in the opposite direction to that of the discharge current. Typical rechargeable batteries include the lead-acid battery, the nickel-cadmium battery, the zinc-bromine battery, the sodium-sulfur battery, the nickel-hydrogen battery, the lithium ion battery, the nickel-iron battery, the nickel-zinc battery, the manganese-zinc battery, the silver battery, the air battery and so on. Further, a capacitor or the like, constituting an electric double layer can also be used. As the battery, not only secondary batteries such as described above but also various primary batteries can be adopted. In subsequent references to the batteries used in EVs, "batteries" broadly implies rechargeable type batteries, but also includes non-rechargeable type batteries.

A fuel meter of a CV determines a quantity of liquid fuel remaining in a fuel tank by measuring a variable that is directly proportional to the quantity of liquid fuel remaining in the fuel tank. Such variables include the volume and the weight of the liquid fuel contained within the fuel tank. Generally, the density of a liquid fuel decreases slightly as the temperature increases. As a consequence, determinations of the quantity of liquid fuel, based on measurements of the volume of the liquid fuel, are likely to be less reliable than determinations based on measurements of the weight. In spite of the slight temperature dependence of the volume of the liquid fuel, the typical fuel meter of a CV determines the quantity of liquid fuel by measuring the volume of the liquid fuel contained within the fuel tank. For a regularly shaped fuel tank, the height of the fuel tank is directly proportional to the volume contained in the fuel tank. In actual practice, the typical fuel meter of a CV determines the quantity of liquid fuel by measuring the volume of the liquid fuel by measuring the height of the liquid fuel contained in the fuel tank.

For the fuel tank of a CV, it is easy to define the two limiting conditions: full and empty. For the full condition, the volume of the fuel tank is nearly completely occupied by the liquid fuel, and the corresponding height of the liquid fuel is at its maximum. For the empty condition, the volume of the fuel tank is nearly completely occupied by air with only a small volume of remaining liquid fuel. For this condition, the corresponding height of the liquid fuel is at its minimum.

Operation of the CV, loaded with a full tank of liquid fuel, until the fuel tank is completely exhausted will result in a decrease in height of the liquid fuel from the maximum height to the minimum height. For the measuring component of a fuel meter of a CV, this decrease in height of the liquid fuel is nearly linear with respect to the distance covered by the CV when the CV is operated at a steady rate of speed. The indicator component of the fuel meter of the CV will indicate a value representing the decrease in the quantity of the liquid fuel. The decrease is nearly linear with respect to the distance covered by the CV traveling at a steady rate of speed.

This functioning of the fuel meter of the CV is more easily understood by the following example. A motor scooter with a full tank of liquid fuel is capable of traveling 200 km at a constant speed of 60 km/hr. After completing the first 50 km of the 200 km, the height of the liquid fuel is ¾ of the height of the full tank, and the indicator portion of the fuel meter will indicate that the tank is ¾ full. After completing 100 km of the 200 km, the height of the liquid fuel is ½ of the height of the full tank, and the indicator portion of the fuel meter will indicate that the tank is ½ full. After completing 150 km of the 200 km, the height of the liquid fuel is ¼ of the height of a full tank, and the indicator portion of the fuel meter will indicate that the tank is ¼ full. After completing the 200 km, the fuel tank is empty, and the indicator portion of the fuel meter will indicate that the tank is empty. Furthermore, it should be noted that if the vehicle is stopped for a break at some point during the 200 km run, the indicator portion of the fuel meter will not change from that capacity value that was indicated at the beginning of the break. This is a particular point in comparison with the behavior of a battery.

On the other hand, a battery capacity meter of an EV determines the quantity of electrical energy remaining in the battery. As is well known to anyone skilled in the art concerning battery capacity meters for EVs, there are no simple variables directly proportional to the quantity of electrical energy remaining in a battery. Furthermore, unlike the fuel tank of a CV, it is easy to define only one of the two limiting conditions of a battery: the "full condition." The full condition of a battery is a reproducible condition that can be achieved by charging the battery to the end of the charging procedure using a charger specifically designed for the battery type. At the end of the charging procedure, the open circuit voltage of the battery reaches its maximum value. For a 12 volt sealed lead-acid battery, this value after charging is approximately 13 volts.

As previously explained, the empty condition of a battery is practically difficult to define. As a first step toward developing a meaningful definition of the empty condition of a battery, consider the discharge of a battery at constant current. A typical discharge curve for a 30 Ah 12 volt sealed lead-acid battery that was discharged at 10 A is shown in FIG. 9. The empty condition can be considered to occur after approximately 166 minutes when the terminal voltage drops suddenly from approximately 11 volts to approximately 10 volts in a period of less than 20 minutes. This condition can be readily reproduced in the laboratory and is a useful definition for the empty condition of the battery for discharges under similar conditions in which a constant discharge current is used.

For the purpose of defining the empty condition of a battery being used in an EV, however, such a definition is not completely satisfactory. In the case of an EV, the operating current is typically not constant and depends on the driving conditions.

For an EV, in which a battery provides electrical energy to an electric motor by means of a motor controller, the motor controller will typically not operate below some minimum voltage value. As an example, for an electric scooter equipped with four 12 volt sealed lead-acid batteries connected in series, the minimum operating voltage of the motor controller is 24 volts (½ of the nominal voltage of the four batteries connected in series). When in the course of operating this electric scooter, the motor controller makes power demands on the battery such that the 24 volt minimum voltage level cannot be met for the level of current required, the battery can be considered empty.

This condition may occur when the battery is in a low state of charge, if the head and tail lights are illuminated, the turn signal is activated and the vehicle is accelerating, all at the same time. The above example conditions are not unusual and could typically occur when making a right-angle turn into the face of oncoming traffic.

As is well known to anyone skilled in the art of batteries, even when the output voltage of the batteries drops below the minimum voltage of 24 V under, for example, the above-described conditions, if the load condition is changed to reduce the loads, the battery voltage may return to a voltage higher than 24 V. In other words, the battery voltage reaches the minimum operating voltage, depending upon the load conditions. For example, if under the same initial conditions in which the 24 volt minimum voltage level cannot be met, the head and tail lights are extinguished, the turn signal is deactivated, or the vehicle is deaccelerated, the 24 volt minimum voltage level is likely to be met. It should be obvious, however, that safe vehicle operating practices may not allow the driver to extinguish the head and tail lights, deactivate the turn signal, or deaccelerate the vehicle when making a right-angle turn into the face of traffic in order to achieve an operating voltage greater than or equal to 24 V.

Because safe operation of the EV is extremely important, the empty condition of a battery being used in an EV is defined as follows: the battery is considered to be empty at the first occurrence of the condition in which the motor controller makes power demands on the battery such that the minimum voltage level of the motor controller cannot be met for the level of current required. That is, when such a condition first occurs, it may be recognized that the battery is empty.

Even with reasonable definitions for both the full and empty conditions of a battery being used in an EV, determining the quantity of electrical energy remaining in the battery between the full and empty conditions is not as simple as measuring the height of the liquid fuel contained in the fuel tank of a CV. This is because there are no simple single variables that are directly proportional to the quantity of electrical energy. Furthermore, there are several general characteristics of batteries that make measurement and determination of the quantity of electrical energy difficult. These general characteristic of batteries can be divided into two groups, major and minor. At a minimum, a battery capacity meter of an EV should recognize and be responsive towards those general battery characteristics that belong to at least the major group. A battery capacity meter of an EV that recognizes and is responsive toward those general battery characteristics belonging to the minor group, as well as the major group, is obviously more desirable. Detailed explanations of these general characteristics of batteries are presented below.

There are two below-mentioned characteristics belonging to the major group among the general characteristics of batteries. The first of two general characteristics of batteries that belongs to the major group is the following: For a battery discharged at constant current, the total quantity of current up to the empty condition (battery capacity) decreases as the magnitude of the discharge current increases. Experimental data for a 30 Ah 12 volt sealed lead-acid battery and a curve fitted for an empirical equation are shown in FIG. 10. The capacity can be observed to decrease from 31.1 Ah at a discharge current of 5 A to 13.2 Ah at a discharge current of 90 A. This decrease in battery capacity as the current increases is attributed to the slow rate of diffusion of electrolyte from outside of the electrodes into the pores within the electrodes. Except for extremely small discharge current values, the rate of electrolyte diffusion is too slow to prevent the occurrence of concentration gradients in the electrolyte. The electrical resistance of an electrolyte increases as the magnitude of the concentration gradient increases. Also, the average magnitude of the electrolyte concentration gradients increases as the discharge current increases. Since the average magnitude of the electrolyte concentration gradients increases as the discharge current increases, the electrical resistance of the electrolyte will increase as the discharge current increases. Increases in electrical resistance will result in premature sudden voltage drops, with the time of discharge until the occurrence of the premature sudden voltage drop depending on the increase in electrical resistance.

This first general characteristic of batteries, namely, the capacity decreases as the current increases, is fully applicable to batteries in an EV even when the discharge current is not completely constant. An EV operating at a small value of relatively constant current will cover a greater distance than the same EV operating at a large value of relatively constant current.

The second of two general characteristics of batteries that belongs to the major group is the following: For a battery discharged sequentially at two different constant currents, a large current value and a small current value, the total quantity of current up to the empty condition depends on the order of the sequential discharge. Experimental data for a 6 Ah 12 volt sealed lead-acid battery is shown below in Table 1.

TABLE 1

| Experiment Number | First Step Discharge (A: Ah) | Second Step Discharge (A: Ah) | Total Capacity (Ah) |
|---|---|---|---|
| 1 | 10; 1.00 | 1; 2.71 | 3.71 |
| 2 | 10; 1.33 | 1; 2.35 | 3.68 |
| 3 | 10; 1.67 | 1; 1.93 | 3.60 |
| 4 | 10; 2.08 | 1; 1.51 | 3.59 |
| 5 | 1; 2.66 | 10; 0.15 | 2.81 |
| 6 | 1; 1.97 | 10; 0.63 | 2.60 |
| 7 | 1; 1.33 | 10; 1.01 | 2.34 |
| 8 | 1; 0.50 | 10; 1.67 | 2.17 |

Examination of this data reveals a general trend in which a larger total capacity is obtained when the large current value discharge comes before the small current value discharge than when the large current value discharge comes after the small current value discharge. A close look at the data shows that the quantity of charge for the 10 A first step of Experiment 1 and the 10 A second step of Experiment 7 are nearly identical, yet the total quantity of charge is 1.37 Ah greater for Experiment 1. Another close look at the data shows that the quantity of charge of the 1 A first step of Experiment 6 and the 1 A second step of Experiment 3 are nearly identical, yet the total quantity of charge is 1.00 Ah greater for Experiment 3. A final close look a the data shows that the quantity of charge for the 10 A first step of Experiment 2 and the 1 A first step of Experiment 7 are nearly identical, yet the total quantity of charge is 1.34 Ah greater for Experiment 2.

This general characteristic, in which a larger total capacity is obtained when the large current value discharge comes before the small current value discharge than when the large current value discharge comes after the small current value discharge, has a physical explanation based on the rate of electrolyte diffusion like the one presented above. When the large current value discharge occurs first, large electrolyte concentration gradients occur. These large concentration gradients result in a large increase in the electrical resistance of the electrolyte. When the large value current discharge is changed to the small current value discharge, diffusion of electrolyte, although slow, occurs fast enough over an extended period of time, such that the concentration gradients gradually become smaller. As the concentration gradients become smaller, the electrical resistance decreases. As a result, the onset of the sudden voltage drop is delayed, and a comparatively large total discharge capacity is obtained. This capacity is less than, but close to, the capacity that would be obtained if the discharge was carried out from start to finish at the low current value.

Alternatively, when the small current value discharge occurs first, not so large electrolyte concentration gradients occur. These not so large concentration gradients result in a moderate increase in the electrical resistance of the electrolyte. When the small value current discharge is changed to the large current value discharge, electrolyte diffusion is too slow to prevent the occurrence of large concentration gradients. As the concentration gradient becomes large, the electrical resistance increases. As a result, the sudden voltage drop is advanced, and a comparatively small total discharge capacity is obtained. This capacity is greater than, but close to, the capacity that would be obtained if the discharge was carried out from start to finish at the high current value.

This second general characteristic of batteries, namely, the capacity depends on the sequence of high current discharges and low current discharges as the battery is being discharged, is fully applicable to batteries in an EV. An EV operated initially at relatively high average current values and then at relatively low average current values will cover a greater distance than the same EV operated initially at the same relatively low current values and then at the same relatively high current values.

There are four general characteristics of batteries belonging to the minor category.

The first of four general characteristics of batteries that belongs to the minor group is the following: After discharging a battery until the empty condition, if the battery is set aside for an extended period of time, additional capacity may become available for withdrawal in subsequent discharges. The quantity of additional capacity will depend on the magnitude of the discharge current in reaching the empty condition, the magnitude of the discharge current used in the subsequent discharge, the discharge history of the battery, the temperature of the battery and so on. As an example of this characteristic, as noted above, a 30 Ah 12 volt sealed lead-acid battery yields a capacity of 31.1 Ah at a constant discharge current of 5 A and a capacity of 13.2 Ah at a constant discharge current of 90 A. If the battery is set aside for several hours after the 90 A discharge, a second discharge at a constant current of 90 A yields an additional 8.6 Ah of capacity. If the battery is again set aside for several hours after the second 90 A discharge, a third discharge at a constant current of 90 A yields an additional 5.6 Ah of capacity. If the battery is again set aside for several hours after the third 90 A discharge, a fourth discharge at a constant current of 90 A yields an additional 3.7 Ah of capacity. The combined total capacity of these four 90 A discharges, 31.1 Ah, is the same as that obtained after one 5 A discharge. Of course, there is a limit to the capacity that can be obtained by successively discharging the battery after it has recovered. This limit for total obtainable capacity will be determined by the amount of active material contained in the electrodes in the battery.

This general characteristic, in which a battery can recover and yield additional capacity after resting, has a physical explanation based on the rate of electrolyte diffusion like the ones presented above. After the empty condition has been brought about by an increase in the electrical resistance of the electrolyte, which was due to electrolyte concentration gradients, no current is withdrawn from the battery for an extended period of time. During this extended period of time, as slow diffusion of electrolyte proceeds from outside of the electrodes into the pores within the electrodes, the electrolyte concentration gradients diminish until the equilibrium condition, with no electrolyte concentration gradient, is achieved. When current is again withdrawn from the battery, the average magnitude of the electrolyte concentration gradients increases with a concomitant increase in the electrical resistance of the electrolyte. The increase in electrical resistance brings about the empty condition again when the sudden voltage drop occurs. If again no current is withdrawn from the battery for an extended period of time, the equilibrium condition will again be achieved. Because active material is being converted into inactive material during each discharge step, eventually no active material will remain, and further recovery of capacity becomes impossible.

This characteristic of batteries, namely, after allowing a battery to rest, additional capacity may be withdrawn from the battery, is applicable to batteries in an EV. This characteristic is considered to be a minor characteristic, however, because in actual practice, the additional distance that an EV can travel, after the battery reaches the empty condition and then recovers, is small. This is because the motor controller in an EV does not require relatively large continuous currents throughout the discharge of the battery. It is relatively large continuous currents that result in the empty condition being reached prematurely, and then result in relatively large amounts of battery capacity being recovered, while the battery is at rest. For relatively small continuous currents throughout the discharge of the battery, relatively small amounts of battery capacity are recovered, while the battery is at rest. For typical driving conditions, it is recommended that the battery be recharged once the empty condition is reached and that additional recovered capacity, if any, not be used. Following this general guideline will prolong the lifetime of the EV battery.

The second of four general characteristics of batteries that belongs to the minor group is the following: For a battery discharged at constant current, the total quantity of current up to the empty condition decreases as the temperature decreases. As an example of this characteristic, when a sealed lead-acid battery of 30 AH 12 V is discharged at a constant current of 5 A, the extracted capacity is 31 Ah at 25_C, 24 Ah at 0_C, and 18 Ah at −20_C. This general characteristic has a physical explanation based on the rate of electrolyte diffusion. The decrease in battery capacity as the temperature decreases is attributable to the rate of diffusion of the electrolyte becoming slower as temperature decreases. As a result, the average magnitude of the concentration gradients increases as the temperature decreases. As before, it follows that the electrical resistance of the electrolyte increases as the temperature decreases. The occurrence of the empty condition, which depends on the electrical resistance, will then obviously depend on the temperature.

This characteristic of batteries, that capacity decreases as the temperature decreases, is applicable to batteries in an EV. This characteristic is considered to be a minor characteristic, however, because in actual practice, the effect of temperature is minimal. The above data for the 30 Ah 12 volt sealed lead acid battery was obtained under laboratory conditions in which the temperature of the battery was kept constant throughout the discharge. In actual practice, a discharging battery will gradually become warmer due to internal resistive heating. This warming will tend to minimize the effect of the temperature on capacity. Also in actual practice, the minimum operating temperature is likely to be higher than the −20_C described above for the 30 Ah 12 volt sealed lead acid battery. In the case of an electric scooter, it is unlikely that a user will ride the scooter at temperatures below 0_C.

The third of four general characteristics of batteries that belongs to the minor group is the following: The capacity of a battery charged and discharged repeatedly decreases over time (battery aging). The rate of capacity decrease, with respect to the number of charge-discharge cycles, will depend on the magnitudes of the discharge currents, the charging conditions, the starting points of the charging procedures (empty condition or partially full condition), the temperature of the battery during discharge, the temperature of the battery during charging and so on. Although the specific physical explanation for this general characteristic depends on the battery type, the characteristic generally occurs across all battery types.

This characteristic of batteries, that the capacity decreases as the number of charge-discharge cycles increases, is applicable to batteries in an EV. This characteristic is considered to be a minor characteristic, however, because in actual practice, the effect occurs gradually and unpredictably as the battery ages. Finally, at some point in the lifetime of the battery, the battery can no longer be recharged and the battery must be replaced. Although an ideal battery capacity meter will recognize and be responsive toward the changes in capacity over the lifetime of the battery, in practice it is very difficult to achieve.

The last of four general characteristics of batteries that belongs to the minor group is the following: For batteries connected in series, slight variations in capacity, which are present for new batteries, will become greater as the battery is charged and discharged repeatedly over time (unbalancing). The variations increase over time because of the unpredictable nature of the battery aging process noted above. Because the increase in capacity variations will depend on the same factors noted above for battery aging. Unbalancing of batteries connected in series will occur in EV batteries, because every conceivable battery for use in an EV contains batteries connected in series. It should be noted that even the standard 12 V sealed lead-acid battery is composed of six 2 volt batteries connected in series.

This characteristic of batteries, that capacity variations in series connected batteries increase as the number of charge-discharge cycles increases, is applicable to batteries in an EV. This characteristic is considered to be a minor characteristic, however, because as was noted above for battery aging, the effect occurs gradually and unpredictably. Although an ideal battery capacity meter will recognize and be responsive toward the changes in capacity variations over the lifetime of the battery, in practice it is very difficult to achieve.

From the above-described general characteristic of batteries, both major and minor, one can readily understand that determining the quantity of electrical energy remaining in the battery between the full and empty conditions is not simple. Furthermore, a device that determines the quantity of electrical energy, which remains available for a user until the empty condition is reached, is probably not exactly what the potential purchaser of an EV wants or expects from the battery capacity meter component of the EV. As stated previously, potential purchasers of an EV will expect and want the same type of performance from the battery capacity meter, as they presently obtain from that component that fulfills the same function in a CV, namely the fuel meter. As noted above, the fuel meter of the CV will indicate a value representing the decrease in the quantity of the liquid fuel that is nearly linear with respect to the distance covered by the CV traveling at a steady rate of speed. Accordingly, the potential purchaser of an EV will expect and want the battery capacity meter to indicate a value representing a decrease in the quantity of the electrical energy that is nearly linear with respect to the distance covered by the EV traveling at a steady rate of speed.

As previously mentioned, there are no simple single variables directly proportional to the quantity of electrical energy remaining in a battery between the full and empty conditions. Nevertheless, some variable or variables are better than others for the purpose of determining the quantity of electrical energy remaining in the battery. When determining the quantity of electrical energy by measuring and analyzing some variable or variables, it is generally true that the greater the number of variables measured and analyzed, the greater the potential accuracy in determining the quantity of electrical energy. However, keeping in mind that the potential purchaser of an EV only expects and wants the same type of performance from the battery capacity meter as presently obtained from the fuel meter in a CV, it may be possible to provide that type of performance from a device that only measures and analyzes one variable.

The measurable variables indicative of a condition of a battery are classified as follows:

1) The terminal voltage of the battery;

2) A discharge current of the battery;

3) An internal property of the battery such as electrolyte density, electrolyte refractive index, internal pressure, electrolyte acidity, electrolyte viscosity, relative humidity, electrode absorbance, etc.; and 4) Multiple variables such as voltage and current, current and electrolyte density, voltage and internal pressure, etc.

As one of these four classifications of the measurable variables, the terminal voltage is the most advantageous for several reasons. First, compared to the other classifications, it can be measured the most accurately and reliably. Second, compared to the other classifications, the terminal voltage contains the most useful information about the state of the battery. Third, compared to the other classification, it can be measured with the lowest cost measuring devices.

It is well known that the initial cost of an EV is projected to be twice that of a comparable CV. In order to minimize the cost difference between EVs and CVs so that EVs can become marketable, it is necessary to minimize the costs of all the important components of the EV, including the motor, the motor controller, the batteries, the battery charger, the battery capacity meter and so on. Unless a significant performance advantage for a particular component can be demonstrated with respect to cost, whether to install that particular component in the EV will be decided primarily based on cost.

For all the above reasons, and especially low cost, several battery capacity meters that use only the battery terminal voltage as an input variable, have been disclosed. In U.S. Pat. No. 4,193,026 to Finger et al., a battery capacity meter is described that resets to the full condition when the battery is properly charged. When the device resets to the full condition, a reference voltage value is initialized. Whenever the instantaneous battery terminal voltage value drops below the reference voltage value, the time duration of the voltage drop is measured, accumulated, and stored in memory. The memory output adjusts the reference voltage value to a lower voltage. The memory output also represents the state of charge of the battery, which gradually changes the indicator output from full to empty, as the reference voltage value is adjusted downward.

In U.S. Pat. No. 4,573,126 to Lefebvre et al., a battery capacity meter is described that measures a noload voltage of the battery during the initial connection to the battery. This initial voltage corresponds to the electromotive force. The terminal voltage is measured at a time "t," and the difference between the newly measured voltage and the electromotive force is determined. A new electromotive force is computed by the equation $E(T_1)=E(T_0)-f(\Delta V)\cdot t$. The function $f(\Delta V)$ is a predetermined law having the following form: $f(\Delta V)=I/I_0$. This relation between $f(\Delta V)$ and $I/I_0$ is claimed to be independent of the nominal state of charge of the battery.

In U.S. Pat. No. 5,151,865 to Blessing et al., a battery capacity meter is described that determines the energy content value of a battery under operating conditions by the method comprised of the following steps:

1) the battery is connected to the measuring instrument;

2) the terminal voltage of the battery is sampled during a measurement time using the measuring instrument;

3) a relative remaining capacity of the battery is provided;

4) at least three individual reference values, which relate the terminal voltage to the sum currents for the provided relative remaining capacity, are retrieved from memory;

5) an assumed sum current is interpolated automatically for the sum currents that correspond to the at least three individual reference values;

6) an absolute capacity is calculated by multiplying the assumed sum current by the measurement time;

7) a maximum capacity corresponding to the assumed sum current for a maximum obtainable discharge time is derived using stored characteristics of the battery; and 8) a new remaining capacity is calculated by subtracting from the initial remaining capacity a ratio of the absolute capacity to the maximum capacity. The result of the calculation is the energy content of the battery.

However, in general-purpose conventional capacity meters, although the remaining capacity representation value is lowered as current is withdrawn from the battery, either one or both of the characteristics belonging to the major group of battery characteristics are not considered. When either one or both of the characteristics belonging to the major group are not considered, depending on the order and magnitude of the discharge currents, a general-purpose conventional capacity meter will not reliably indicate the empty condition when the battery is actually empty.

Furthermore, the above-described conventional battery capacity meters do not provide the same type of performance as can be obtained presently from the fuel meter that fulfills the same function in a CV. The battery capacity meters using the above-cited methods do not yield display device values that decrease nearly linearly with respect to the distance covered by the EV traveling at a steady rate of speed.

The battery capacity meter described in U.S. Pat. No. 4,193,026 only responds to terminal voltage drops below a reference voltage value regardless of the magnitudes of the voltage drops below the reference voltage value. The battery capacity meter, using this method, is not very responsive towards decreases in battery capacity as the current increases. The battery capacity meter using this method is not very responsive towards the dependence of battery capacity on the sequence of high current discharges and low current discharges as the battery is being discharged.

The battery capacity meter described in U.S. Pat. No. 4,193,026 determines the state of charge of the battery by calculating the electromotive force using an equation of the form $E(T_1)=E(T_0)-f(\Delta V)\cdot t$ in which $f(\Delta V)=I/I_0$. According to this US patent, for the discharge of a battery with a capacity of 330 Ah at a discharge current of 16.5 A, the display device will show a 0% remaining capacity value at the end of the discharge. For the discharge of the same battery at a discharge current of 65 A, the display device value will show a 24% remaining capacity value even though additional capacity cannot be withdrawn at that current value. For the discharge of the same battery at a discharge current of 165 A, the display device will show a 36% remaining capacity value even though additional capacity cannot be withdrawn at that current value. For the discharge of the same battery at a discharge current of 330 A, the display device will show a 45% remaining capacity value even though additional capacity cannot be withdrawn at that current value. As can be seen from these examples, the battery capacity meter, using this method, is not responsive toward the decreases in battery capacity as the current increases. Using this method, the meter also is not responsive towards the dependence of battery capacity on the sequence of high current discharges and low current discharges as the battery is being discharged.

The battery capacity meter described in U.S. Pat. No. 5,151,865 determines the energy content value of a battery by a multi-step method, the last step of which is the calculation of a new remaining capacity by subtracting from the initial remaining capacity a ratio of the absolute capacity to the maximum capacity. For constant current discharges, the battery capacity meter, using this method, is responsive toward the decreases in battery capacity as the current increases. However, the battery capacity meter, using this method, is not responsive toward the dependence of battery capacity on the sequence of high current discharges and low current discharges as the battery is being discharged. This is because the calculation uses a ratio of the absolute capacity to the maximum capacity regardless of whether the state of charge of the battery is near the full condition or near the empty condition.

Accordingly, the present invention has been made to solve the various problems occurred in the above-described prior art.

SUMMARY OF THE INVENTION

It is an object of the present invention to provide a battery capacity meter that only requires measurement of the terminal voltage of the battery, is low in cost, is simple to manufacture and is reliable.

It is another object of the present invention to provide a method of determining the battery capacity using only the terminal voltage as an input variable. The battery capacity meter recognizes and is responsive to both of the two general battery characteristics belonging to the major group such that the empty condition is accurately and reliably determined regardless of the discharge conditions.

Another object of the present invention is to provide a representation of a battery remaining capacity fitted to a characteristic easily understandable by a user. In particular, it is very important to obtain such a characteristic similar to a display characteristic of a fuel meter of a CV as a battery capacity representation for driving an electric vehicle. Concretely speaking, a further object of the present invention is to provide a method for calculating a value relative to a battery remaining capacity, which exhibits a characteristic linearly decreasing in proportion to a drive distance when an EV is driven at a certain constant speed.

A still further object of the present invention is to provide calculation methods having these features that can be constituted as simple data processing steps. The calculations can immediately and easily be executed by a low-cost microcomputer.

Among the various sorts of measurable variables that are varied in accordance with the conditions of the battery, the terminal voltage of the battery represents the most precise and reliable variable that can be measured at low cost. Accordingly, the present invention is constructed to calculate the battery remaining capacity by essentially measuring the terminal voltage and analyzing the measured terminal voltage.

Since the battery capacity meter of the present invention can be arranged by employing a minimum number of simple and low-cost constructive components, the meter can be made simpler and more reliable. To reduce the difference between EV's cost and CV's cost, all of the major constructive apparatuses for the EV must be made at minimum cost. Since, in the present invention, only the terminal voltage is measured, the low-cost battery capacity meter can be constructed at low cost.

In the present invention, the steps for measuring the remaining capacity of the battery can be executed by such a hardware structure of, for instance, a voltage measuring apparatus, an analog-to-digital converter (A/D-converter), a microcomputer, and a display apparatus. In particular, when the microcomputer for controlling the power source of the EV motor is commonly used to calculate/display the remaining capacity, the overall cost of IC chips is reduced, so that the cost of constructing the battery capacity meter can be further reduced. In an embodiment of the present invention, a major function of the microcomputer is to control the power supplied to the electric motor, and a second function of this microcomputer is to execute the program required to calculate/display the remaining capacity of the battery.

According to the present invention, the battery capacity may be calculated by employing various methods. In these methods, the terminal voltage is employed as the input variable. In any of these methods, the values of the display apparatus are smoothly and precisely reduced in accordance with the consumption of the battery. When the EV is used under the same conditions as a CV, the display value according to the present invention has a higher reliability than that of the conventional battery capacity meter. The superior reliability is caused by recognizing the important characteristics of the battery, and incorporates an algorithm fitted to the important characteristics for capacity calculation. The invention recognizes that the battery capacity is decreased as the discharge current is increased, and the battery capacities differ depending on the combinations of continuous discharge currents. A basic structure and a basic operation of the algorithm according to the present invention will now be explained.

All of the embodiments of the present invention, for determining the remaining capacity of the battery, use a value S that indicates the state of charge of the battery. S is defined to be equal to 0 when the battery is in the fully charged state. Furthermore, S is defined to be equal to 1 when the battery reaches the empty condition as defined previously. This indication value S increases smoothly and monotonically during the battery discharging operation from a value equal to 0, when the starting condition is a fully charged battery, and becomes 1 or nearly 1 at the same time the battery reaches the empty condition. To obtain a highly reliable indication value S indicative of the state of charge of the battery, the above described value setting operations should be achieved independent of the magnitudes and orderings of the discharge currents during the battery discharging operation.

A description will now be made of a method, which can satisfy the above described conditions for calculating the S value. According to the present invention, first an initial value of the indication value S is calculated. For this initial value of S, a change in the value of the state of charge $\Delta S$ is calculated for a time interval $\Delta t$. The change in the value of the state of charge $\Delta S$ is added to the initial value of S to yield a new value of S which is the new state of charge at the end of the time interval $\Delta t$. This procedure is then repeated interactively with a change in the value of the state of charge $\Delta S$ being calculated for each succeeding time interval $\Delta t$ and the value of S being updated for each succeeding time interval $\Delta t$.

The objectives of the present invention are accomplished by means of a battery capacity meter which includes a voltage measuring apparatus. Based on measurements of the terminal voltage of the battery, the meter is able to calculate the initial sate of charge, the value of the discharge current for a time interval Δt, the change in the state of charge for a time interval Δt, and the value of updated state of charge.

When a value S is defined as an indication value of the state of charge, the initial value $S_0$ of the state of charge is defined as follows:

$$S_0=K_0+K_1V_0^1+K_2V_0^2+\ldots+K_nV_0^n \qquad (1)$$

$V_0$ is an initial value of terminal voltage $V_i$ and $K_0$, $K_1$, $K_2$ . . . are constants depending on the battery.

The discharge current $I_i$ is calculated according to the following equation:

$$I_i=\{A-B\times(S_i-S_{ZONE1})-C\times(S_i-S_{ZONE2})^2-V_i\}\div R \qquad (2)$$

A, B, C, R, $S_{ZONE1}$ and $S_{ZONE2}$ are constants that depend upon the particular battery employed The change amount $\Delta S_i$ of the state of charge condition for a time interval Δt, is calculated using the following equation:

$$\Delta S_i=\{I_i\times\Delta t\times f(I_i,S_i)\}\div M \qquad (3)$$

M is a constant dependent upon the value of the battery. The function f(I,S) is a function such that when S=0 f(I,S)=1, when S=1 f(I,S)_1 if the value of I is low, f(I,S)_$(I\div I_0)^Y$ if the value of I is high, and f(I,S) increases monotonically when the value of S is increased from 0 to 1, and M, $I_0$ and Y are constants specific to the battery.

The present value of the state of charge of the battery $S_{i+1}$ is calculated from the following equation:

$$S_{i+1}=S_i+\Delta S_i \qquad (4)$$

where $\Delta S_i$ is calculated based on equation 3 above.

An index value of the battery capacity is calculated based upon the formula:

$$\text{capacity}=(1-S_{i+1})\times n \qquad (5)$$

where "n" is an arbitrary real number.

A correction process may be carried out for the indication value $S_i$, according to the following equation:

$$\text{capacity}=\{1-h(S_{i+1})\}\times n \qquad (6)$$

in which h(S) increases when S is increased from zero to one. When S=0, h(S)=0 and when S=1, h(S)=1. When S=½, ½<h(S)<3½/2.

The above objects are achieved when a battery capacity meter employing equations 1–6 is employed. Further objects are achieved as described in the detailed description that follows.

As one method for calculating the change amount ΔS of S, the general-purpose formula below, which expresses S in terms of current, may be utilized:

$$\Delta S=(I\times\Delta t\times F)/M \qquad (7)$$

In this equation, I is the discharge current in the time interval Δt, M is a constant that depends on the battery type, and F is a correction factor that should correct for changes in battery capacity which are dependent on the magnitudes and orderings of the discharge currents as the battery is discharged. (In this equation, a current I is employed as an input variable. In accordance with the method of the present invention, the current I need not be directly detected, but instead may be obtained indirectly from the terminal voltage). Because the battery capacity depends strongly on the magnitude of the discharge current, the correction factor must be a function of the current so that the indication value S becomes 1 or nearly 1 at the end of the discharging operation even when the battery is discharged at various discharge currents. To recognize the end of the discharging operation only from the discharging current, it is necessary but not sufficient to grasp a relationship between the discharging current and the battery capacity. This relationship is factored into the correction factor, so that S becomes 1 when the discharging operation is ended for constant current discharging. A relationship between the discharging current and battery capacity is represented and a correction factor is computed based on this relationship in the following description.

A correction factor, which corrects for decreases in battery capacity as current increases when the discharge current is constant, can be derived simply from the famous Peukert equation. The Peukert equation, which can be fit to experimental data for many different battery types, is of the following form:

$$I^n\times t=D \qquad (8)$$

(since discharge capacity is calculated by multiplying discharge current by discharge time, this equation also represents the relationship between discharge current and battery capacity). This equation and the meaning of the symbols are presented on page 3–9 in the "Handbook of Battery and Fuel Cells," David Linden, Editor-in-Chief, McGraw-Hill, 1984 where "I" is the constant discharge current "t" is the time to the end of the constant current discharge, "D" is an empirically determined constant, and the exponent "n" is another empirically determined constant.

The Peukert equation can be rearranged into the following form:

$$I^{n-1}\cdot I\cdot t=D \qquad (9)$$

For a constant current value $I_0$, which is the smallest constant current value for a set of constant current discharge data, the rearranged form of the Peukert equation has the following form:

$$I_0^{n-1}\cdot I_0\cdot t_0=D \qquad (10)$$

Combining these two equations and rearranging yields the following equation:

$$I_0\cdot t_0=I\cdot t\cdot(I\div I_0)^{n-1} \qquad (11)$$

Renaming $I_0\cdot t_0$ as M and normalizing the equation to a dimension-less value of 1 yields the following equation:

$$1=[I\cdot t\cdot(I\div I_0)^{n-1}]/M \qquad (12)$$

The Peukert equation corresponds to a relative equation between time "t" and current "I" until the discharge operation is completed. According to the present invention, the fact that S is defined to be 1 at the end of discharge operation is utilized, and the above-described equation may be rewritten into the following form:

$$S=[I\cdot t\cdot(I/I_0)^{n-1}]/M \qquad (13)$$

This equation, which has been derived for battery discharges at constant current, can be subdivided into ΔS because the value of I is constant throughout the discharge:

$$\Delta S=[I\cdot\Delta t\cdot(I\div I_0)^{n-1}]/M \quad (14)$$

By comparison with the general expression given above, $\Delta S=(I\cdot\Delta t\cdot F)/M$, a correction factor F, which is applicable for constant current discharges, is:

$$(I\div I_0)^{n-1} \quad (15)$$

For the experimental data for a 30 Ah 12 volt sealed lead-acid battery shown in FIG. 10, the Peukert equation can be fitted to yield a value of "n" equal to 1.279. Selecting the 5 A discharge as $I_0$, the value of M is 30.9 and the value of the correction factors are as follows: 5 A, 1.00; 10 A, 1.21; 20 A, 1.47; 30 A, 1.65; 40 A, 1.79; 50 A, 1.91; 60 A, 2.01; 70 A, 2.09; and 80 A, 2.17. To correct for decreases in battery capacity as current increases when the discharge current is constant, the correction factor must increase. Examination of the above series of calculated correction factors shows that this requirement is met.

This general form for the correction factor F based on the Peukert equation can be rewritten as:

$$(I\div I_0)^{Y} \quad (16)$$

where Y=n−1. This form, $(I\div I_0)^Y$, has often been used in conventional capacity meters. A correction factor having this general form is used in U.S. Pat. No. 5,151,865 to Blessing et al. in which a new remaining capacity is calculated by subtracting from the initial remaining capacity a ratio f, representing the ratio of the absolute capacity to the maximum capacity.

However, based upon experiments, the significant difference in capacities, depending on the order in which a low continuous discharge current and a high continuous discharge current are combined, cannot be corrected by the correction factor $(I/I_0)^Y$ obtained from the experimental equation when a constant current is discharged. (In this case, the currents must be averaged over time to obtain a usable value of I).

A correction factor that corrects for the second general battery characteristic, in which a larger total capacity is obtained when the large current value discharge comes before the small current value discharge than when the large current value discharge comes after the small current value discharge, must be a function of not only the discharge current but also a function of the battery state of charge. The correction factor $(I\div I_0)^Y$ does not contain information about the battery state of charge and, therefore, is not appropriate as a correction factor for battery discharges in which the current is varied.

Therefore, according to the present invention, the charge state S is incorporated as a variable in the correction factor, and this correction factor is varied in response to the charge state S. In the present invention, the correction factor in equation (3), f(I, S) is a function of both the discharge current and the battery's current state of charge S. This correction function f(I, S) is equal to 1 when S=0 regardless of the value of I. This function increases monotonically as S increases from 0 to 1. Furthermore, this function is equal to or nearly equal to 1 when S=1 for small values of I. And finally, this function is equal to or nearly equal to $(I\div I_0)^Y$ when S=1 for large values of I in which $I_0$ and Y are constants that depend on the battery type.

A correction factor having the above-described characteristics functions in the following way for discharge current values that are relatively small. Near the full charge condition with S being close to 0, the change amount in the battery's state of charge ΔS during a predetermined time interval Δt will be nearly equal to [I·Δt]÷M in which "M" is a constant, which depends on the battery type. M can be defined as the maximum capacity that can be obtained from the battery for an infinitesimal discharge current. Near the empty condition with S approaching 1, the change in the battery's state of charge ΔS during a time interval Δt also will be nearly equal to [I·t]÷M. This behavior is the same as that of the correction factor derived from the Peukert equation, $(I\div I_0)^Y$, for the special case in which I is equal to $I_0$. In that case, the value of the correction factor is 1 for all values of the battery state of charge and the change in the battery's state of charge ΔS during a time interval Δt will be equal to [I·Δt]÷M.

However, the correction factor of the present invention functions differently from the correction factor simply derived from the Peukert equation, namely, $(I\div I_0)^Y$. In case of discharge current values that are relatively large (I greater than $I_0$), the correction factor according to the present invention functions as follows. Near the full charge condition with S being close to 0, the change amount in the battery's state of charge ΔS during a predetermined time interval Δt will be nearly equal to [I·Δt]÷M. In other words, the correction coefficient is equal to or nearly equal to 1, near the full charge condition with S being close to 0, for all current values, small or large. On the other hand, when the discharge current values are relatively large, near the empty condition with S approaching 1, the change amount in the battery's state of charge ΔS during a time interval Δt will be nearly equal to $[I\cdot\Delta t\cdot(I\div I_0)^Y]\div M$. In other words, when the discharge current values are relatively large, near the empty condition with S approaching 1, the correction factor is of the same form as that of the correction factor derived from the Peukert equation $(I\div I_0)^Y$.

Since the correction factor of the present invention increases monotonically as S increases from 0 to 1, for relatively large discharge current values, the correction factor will change gradually from one with little or no contribution having a form derived from the Peukert equation to one with a large contribution having a form derived from the Peukert equation. For relatively small discharge current values, as S increases from 0 to 1, the correction factor will increase only slightly from a value of 1 and will contain only a small contribution having a form derived from the Peukert equation at the end of the discharge.

A three-dimensional graph of one embodiment of the correction factor in equation 3 of the present invention is shown in FIG. 52. The current ranges from 0 to 80 A on one horizontal axis, and S ranges from 0 to 1 on the other horizontal axis.

As stated above, the correction factor having the form, $(I\div I_0)^Y$, which is simply derived from the Peukert equation, is not appropriate for correcting the change in the battery capacities caused by varying the order of a high current discharge and a low current discharge as a battery is discharged to the empty condition. In contrast, the correction factor of the present invention, f (I, S), can correct for the second general battery characteristic, in which a larger total capacity is obtained when the large current value discharge comes before the small current value discharge than when the large current value discharge comes after the small current value discharge. A comparison will now be made of behaviors of the S values when the correction factor f (I, S) of the present invention is actually used, and when a correction factor with the form $(I/I_0)^Y$ derived from the Peukert equation is used. When a battery is continuously discharged at a constant current, if the values of M, $I_0$ and Y are optimized and the correction factor of the present invention is utilized, then the value of S becomes 1 or near 1 at the end of discharge operation. Using a correction factor derived from the Peukert equation having the form, $(I \div I_0)^Y$, with appropriately optimized values of $M_{(PEUKERT)}$, $I_{0(PEUKERT)}$, and $Y_{(PEUKERT)}$, an S value equal to or nearly equal to 1 also will be obtained at the end of current any constant discharge.

Using the correction coefficient of the present invention, with the same optimized values of M, $I_0$ and Y, an S value equal to or nearly equal to 1 will be obtained at the end of any discharge in which a small current discharge occurs before a large current discharge. However, using a correction factor derived from the Peukert equation and having the form $(I \div I_0)^Y$, an S value less than 1 will always be obtained at the end of any discharge in which a small current discharge occurs before a large current discharge. Further, using the correction coefficient of the present invention, with the same optimum values of M, $I_0$ and Y, an S value equal to or nearly equal to 1 will be obtained at the end of any discharge in which a large current discharge occurs before a small current discharge. However, using a correction factor derived from the Peukert equation and having the form $(I \div I_0)^Y$, an S value greater than 1 will always be obtained at the end of any discharge in which a large current discharge occurs before a small current discharge.

As apparent from the above-described results, the correction coefficient of the present invention performs the correction operation such that S is equal to or nearly equal to 1 at the end of a discharge, regardless of the way in which the battery is discharged. A correction factor based on the Peukert equation results in (1) S values equal to or nearly equal to 1 at the end of constant current discharges, (2) S values less than 1 at the end of discharges in which a large current discharge occurs after a small current discharge and (3) S values greater than 1 at the end of discharges in which a small current discharge occurs after a large current discharge.

When the correction coefficient based upon only the Peukert equation is employed, a state of charge at the end of discharge that has one value for one set of discharge conditions and a larger different value for another different set of conditions, is not consistent. Since the correction coefficient of the present invention works such that S is equal to or nearly equal to 1 at the end of a discharge, for all different types of discharge conditions, S can be considered not just a state of charge, but a self-consistent state of charge.

In accordance with the present invention, the change amount ΔS of the indication value S is calculated by employing equation (3) which is a function of the indication value S indicative of the charge state of the battery and also a function of the discharge current I. The value of the discharge current may be measured by employing a predetermined detecting device. However, as previously described, according to the present invention, a prediction value of the battery discharge current during Δt may be calculated by using equation (2) without requiring actual measurement of the value of the discharge current. Equation (2) represents the relationship among the discharge current I, the measured terminal voltage V, and the indication value S of the state of charge. It contains several constants A, B, C, P, $S_{ZONE1}$ and $S_{ZONE2}$ that depend on the battery type. Equation (2) is a more complex form of the well known simple equation, $I=[E_0-V] \div R$ in which $E_0$ is the electrochemical potential (electromotive force) and R is the internal resistance of the battery. Depending on the battery type, $E_0$, R or both $E_0$ and R will depend on the state of charge of the battery. In equation (2) of the present invention, these dependencies of $E_0$ and R on the state of charge are not included separately. Instead, they are simplified in the following two ways. First, R is arbitrarily set to a fixed constant value. Second, the dependence of R on the state of charge and the dependence of $E_0$ on the state of charge are combined into a three term approximation of $E_0$:

$$E_0=A-B\cdot(S-S_{ZONE1})-C\cdot(S-S_{ZONE2})^2 \quad (17)$$

The dependence of the electromotive force $E_0$ with respect to S, calculated with employment of the above-described polynominal, may be divided into three regions, depending upon the magnitude of S. The first region is a region of constant electromotive force and ranges from S=0 to $S=S_{ZONE1}$. The second region is a region of linearly decreasing electromotive force and ranges from $S=S_{ZONE1}$ to $S=S_{ZONE2}$. The third region is a region of non-linear decreasing electromotive force and ranges from $S=S_{ZONE2}$ to S=1. In three conceivable embodiments of the present invention, three graphs are shown in FIG. 53 that indicate the relationship between $E_0$ and S represented by the above-described polynominal. In FIG. 53(*a*), the values of $S_{ZONE1}$ and $S_{ZONE2}$ are 0.30 and 0.60, respectively. In FIG. 53(*b*), the values of $S_{ZONE1}$ and $S_{ZONE2}$ are 0.00 and 0.10, respectively. In FIG. 53(*c*), the values of $S_{ZONE1}$ and $S_{ZONE2}$ are 0.00 and 0.95, respectively. Both of the constants, the value of $S_{ZONE1}$ and the value of $S_{ZONE2}$ are properly selected in order to set the starting and ending limits of the respective regions to be fitted to the battery characteristics. Thus, the electromotive forces of any type of battery may be normalized by way of the three term polynomial approximation, and the currents may be predicted by using equation (2) which incorporates this polynominal approximation. Although equation (2) is an approximation equation, the current value when S is increased from 0 to 1 can be computed with reasonable accuracy. As previously explained, the current value can be predicted by employing the measured voltage and the charge state S, and then the change in state of charge ΔS value can be sequentially calculated by using this current value.

Next, in the method for calculating an index value which is representative of the quantity of capacity remaining in the battery, the indication value S is simply converted into an index value of remaining battery capacity using equation (5). In this equation, an inverse relationship exists between the indication value S and the index value of remaining capacity. As the indication value S is increased from 0 to 1 during discharge of the battery, the index value is decreased from "n" to "0" (e.g., in the case of an index of remaining battery capacity expressed as a percentage value with n=100, the index value decreases from 100% to 0%). Since this index value of remaining battery capacity has a linear relationship with the indication value S, this index value represents the amount of electrical energy which remains in the battery based on the two general battery characteristics belonging to the major group. Here, the above-described index value may be displayed in an arbitrary scale by selecting the value of "n" contained in equation (5). For example, the full charge state may be represented as 1 or 10.

As previously described, the method for calculating the battery capacity according to the present invention can be realized by employing only the terminal voltage as the input value. Since this calculation method recognizes and is responsive with respect to the two general characteristics of a battery belonging to the major group, the battery empty condition can be correctly grasped with high reliability irrespective of the discharge conditions.

According to the present invention, another means is provided for calculating an index value which is representative of the quantity of capacity remaining in the battery. In this method for calculating an index value, the index value is calculated using equation (6). Similar to equation (5), when equation (6) is used to calculate an index value of remaining battery capacity, there is an inverse relationship between the indication value S and the index value of remaining capacity. In other words, when the indication value of the charge state is increased from 0 to 1 during the battery discharge operation, the normalized index value is decreased from "n" to "0". The most important factor of the equation (6) is the specific function h(S). This function can be thought of as a correction function that linearizes S with respect to the distance covered by the EV traveling at a steady rate of speed. With respect to S, the function h(S) must be non-linear for the following two reasons. The first reason is that the increase in S with respect to time is intrinsically non-linear, for constant current discharges. This conclusion follows from equation (3) in which the change in S depends on S, which increases from 0 to 1 as the battery is being discharged. The second reason is that the power demands of the motor require that the discharge current increase with respect to time. In order for the EV to maintain a steady rate of speed, the electric motor must be operated at constant power (the product of the discharge current and the battery terminal voltage). Because the terminal voltage of any battery type decreases monotonically as the battery is discharged, the discharge current must be increased in order to maintain a constant power level. Because the change in S, according to equation (3), is also non-linear with respect to current, S must be non-linear with respect to the distance covered by the EV traveling at a constant power level and steady rate of speed. Due to the above-described two reasons, in order for the correction function h(S) to linearize S with respect to the distance covered by the EV traveling at a steady rate of speed, it must necessarily be non-linear. The form of the non-linearity of h(S), however, must be opposite and complementary to that of S. Because this index of remaining capacity linearized according to equation (6) is not an actual representation of the amount of electrical energy remaining in the battery as defined in terms of the general characteristics of batteries, it is difficult to specify the exact form of the correction function h(S) In the present invention, the correction function h(S) is specified to have the following four characteristics. First, it must increase monotonically as S increases from 0 to 1. Second, in order for the full condition to be the same for both S and h(S), h(S) is restricted to be equal to 0 when S=0. Third, in order for the empty condition to be the same for both S and h(S), h(S) is restricted to be equal to 1 when S=1. Fourth, in order for h(S) to have a non-linear form, which is opposite and complementary to that of S, h(S) is restricted at one interior point between S=0 and S=1. This restriction is that when S is equal to ½, h(S) must be greater than ½ and less than or equal to 3½/2.

A curve that meets these four requirements will have a non-linear form opposite (e.g., different sign of the secondary differential coefficient) and complementary to that of S for an EV traveling at a steady rate of speed. As stated above, specifying the exact form of h(S) is difficult. Determining a usable form of h(S) is probably best accomplished using experimental data and empirical methods. A graph of one potential embodiment of function h(S) of the present invention is shown in FIG. 54. S is shown on the horizontal axis and h(S) is shown the vertical axis.

Also, according to the present invention, the calculation of the change amount ΔS of the state of charge of the battery is executed by using a look-up table containing values that have been previously calculated and stored into memory. The remaining capacity calculating device of the present invention sequentially calculates the change amount ΔS in a stepwise manner. At a first step "b", a current is obtained. At a second step "c", the change amount ΔS is calculated by using the current obtained in the first step. Although the values may be calculated by employing a program in which the change amount ΔS is stepwise-calculated, such a calculation cannot be quickly and readily processed by low-cost 4-bit, or 8-bit microcomputers. On the other hand, a program, which determines the change amount ΔS of the self-consistent state of charge using a look-up table, will use a relatively small number of simple programming steps and, thus, can be executed quickly and easily on low-cost microcomputers. Although the determination using a look-up table will be fast, some sacrifice may occur in terms of accuracy.

According to the present invention, both the calculation to obtain the initial value of the state of charge and the calculation to obtain an index value of the remaining battery capacity from the indication value of the state of charge may be similarly executed by employing a look-up table containing values stored in memory. A program that determines either one or both of these values using a look-up table will use a relatively small number of simple programming steps and, thus, can be executed quickly and easily on low cost microcomputers. Although the determination using a look-up table will be fast, some sacrifice may occur in terms of accuracy.

BRIEF DESCRIPTION OF THE DRAWINGS

The invention will be described in detail with reference to the following drawings in which like reference numerals refer to like elements and wherein:

FIGS. 12(*a*) and 12(*b*) are relationship diagrams between experimental discharge voltage vs. time and calculated discharge voltage vs. time of a 30 Ah 12 V lead battery with constant discharge current of 80A.

FIGS. 13(*a*) and 13(*b*) show a relationship between time, experimental discharge voltages, and calculated discharge voltages under a constant current discharge operation of 70 A with employment of 30 Ah 12 V lead battery.

FIGS. 14(*a*) and 14(*b*) show a relationship between time, experimental discharge voltages, and calculated discharge voltages under a constant current discharge operation of 60 A with employment of 30 Ah 12 V lead battery.

FIGS. 15(*a*) and 15(*b*) show a relationship between time, experimental discharge voltages, and calculated discharge voltages under a constant current discharge operation of 50 A with employment of 30 Ah 12 V lead battery.

FIGS. 16(*a*) and 16(*b*) show a relationship between time, experimental discharge voltages, and calculated discharge voltages under a constant current discharge operation of 40 A with employment of 30 Ah 12 V lead battery.

FIGS. 17(*a*) and 17(*b*) show a relationship between time, experimental discharge voltages and calculated discharge voltages under a constant current discharge operation of 30 A with employment of 30 Ah 12 V lead battery.

FIGS. 18(*a*) and 18(*b*) show a relationship between time, experimental discharge voltages and calculated discharge voltages under a constant current discharge operation of 20 A with employment of 30 Ah 12 V lead battery.

FIGS. 19(*a*) and 19(*b*) show a relationship between time, experimental discharge voltages, and calculated discharge voltages under a constant current discharge operation of 10 A with employment of 30 Ah 12 V lead battery.

FIGS. 20(*a*) and 20(*b*) show a relationship between time, experimental discharge voltages and calculated discharge voltages under a constant current discharge operation of 5 A with employment of 30 Ah 12 V lead battery.

FIGS. 21(*a*) and 12(*b*) show a relationship between time, experimental discharge voltages, and calculated discharge voltages under a constant current discharge operation of 80 A with employment of 30 Ah 12 V lead battery.

FIGS. 22(*a*) and 22(*b*) show a relationship between time, experimental discharge voltages and calculated discharge voltages under a constant current discharge operation of 70 A with employment of 30 Ah 12 V lead battery.

FIGS. 23(*a*) and 23(*b*) show a relationship between time, experimental discharge voltages, and calculated discharge voltages under a constant current discharge operation of 60 A with employment of 30 Ah 12 V lead battery.

FIGS. 24(*a*) and 24(*b*) show a relationship between time, experimental discharge voltages and calculated discharge voltages under a constant current discharge operation of 50 A with employment of 30 Ah 12 V lead battery.

FIGS. 25(*a*) and 25(*b*) show a relationship between time, experimental discharge voltages and calculated discharge voltages under a constant current discharge operation of 40 A with employment of 30 Ah 12 V lead battery.

FIGS. 26(*a*) and 26(*b*) show a relationship between time, experimental discharge voltages, and calculated discharge voltages under a constant current discharge operation of 30 A with employment of 30 Ah 12 V lead battery.

FIGS. 27(*a*) and 27(*b*) show a relationship between time, experimental discharge voltages, and calculated discharge voltages under a constant current discharge operation of 20 A with employment of 30 Ah 12 V lead battery.

FIGS. 28(*a*) and 28(*b*) show a relationship between time, experimental discharge voltages and calculated discharge voltages under a constant current discharge operation of 10 A with employment of 30 Ah 12 V lead battery.

FIGS. 29(*a*) and 29(*b*) show a relationship between time, experimental discharge voltages and calculated discharge voltages under a constant current discharge operation of 5 A with employment of 30 Ah 12 V lead battery.

DETAILED DESCRIPTION OF PREFERRED EMBODIMENTS

In embodiments 1 to 10, there are represented various features of the present invention and the operation of these features when the present invention is applied to data acquired using a battery discharging apparatus. Various behaviors of the battery capacity meter of the present invention will be illustrated in examples 1–22. The discharge data for these examples were actually acquired from an electric scooter driven on public roads.

In accordance with the first embodiment of the present invention, a calculation is made of a charge state S of a battery employing the equations (3) and (4). After an initial value of S has been first determined, a change amount ΔS of the state of charge S at a preselected time interval Δt is calculated by using the equation (3). This value is used in the equation (4) to add ΔS to the old value S, thereby obtaining a new value S.

In accordance with this embodiment, an optimization is carried out so that the parameters contained in the equation (3) are made coincident with the actual measurement results for constant discharge currents using an evaluation apparatus employed in a laboratory. Using the optimized function, the major battery characteristic in which capacities vary depending on the order of a high discharge current and a low discharge current, may be realized in accordance with the calculations of the present invention.

Figure 11:
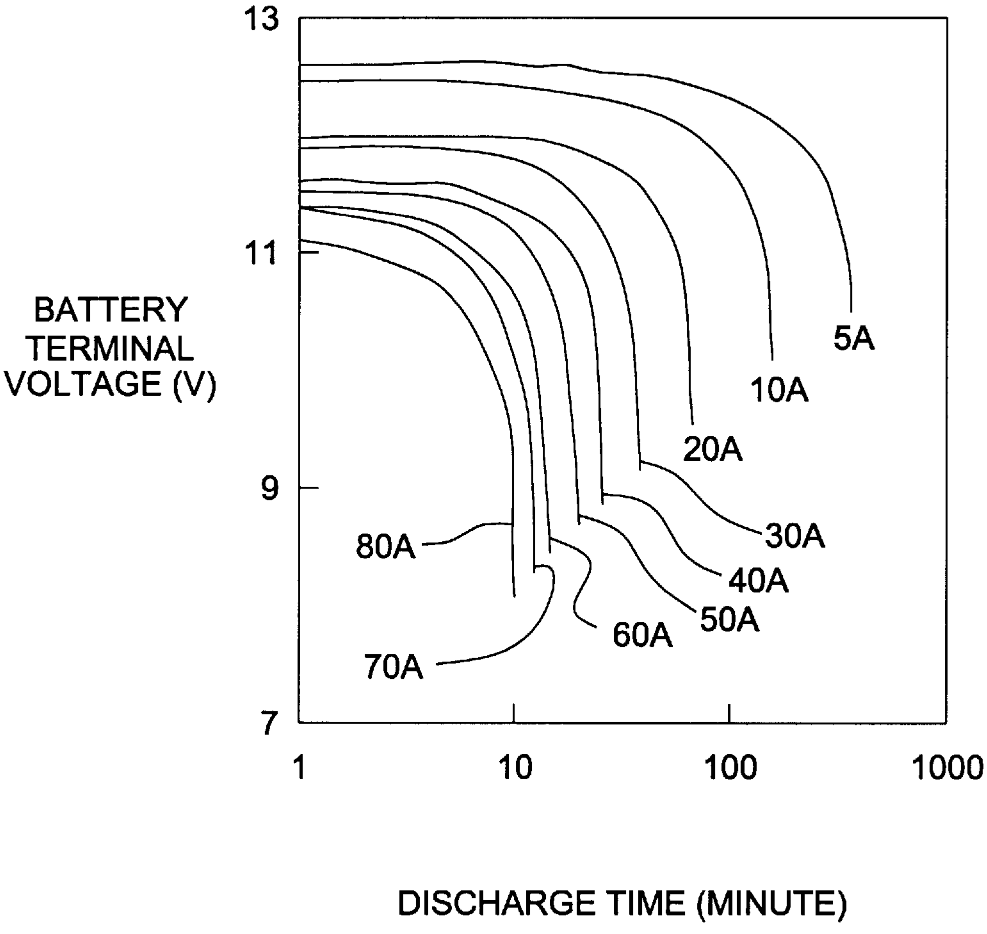
FIG. 11 is a diagram for showing a relationship between discharge voltage vs. time curves of a 30 Ah 12 V lead battery for 80 A, 70 A, 60 A, 50 A, 40 A, 30 A, 20 A, 10 A, 5 A constant current discharges with time shown using a logarithmic scale.

A 12 V 30 Ah sealed lead acid battery was discharged from the full condition to the empty condition using each of the discharge currents of 5, 10, 20, 30, 40, 50, 60, 70, and 80 A. A figure showing the discharge curves with time being plotted on a logarithmic scale as the abscissa and a voltage being plotted as the ordinate is shown in FIG. 11. The battery capacity obtained for each current was calculated by multiplying the discharge time by the current. The results are as follows: 5 A, 30.91 Ah; 10 A, 27.79 Ah; 20 A, 22.78 Ah; 30 A, 19.57 Ah; 40 A, 18.02 Ah; 50 A, 17.16 Ah; 60 A 15.45 Ah; 70 A, 15.04 Ah; and 80 A, 13.80 Ah.

Subsequently, the elapsed times from the full charge state S=0 to the empty charge state S=1 are calculated by using the equations (3) and (4) under each of these current values during the experiments. The discharge amount can be arithmetically obtained by multiplying the discharge current by the discharge time. The respective parameters contained in the equation (3) were optimized by using a so-called "table calculation" software (which will be referred to as a "spreadsheet program" hereinafter) for calculating a large number of data groups so that the discharge amounts calculated under the respective currents according to the present invention are made coincident with the actually measured capacities (in this embodiment, since a constant current is discharged, if the calculated discharge times are made coincident with the measured discharge times, then the discharge capacities are identical to each other. Accordingly, the discharge times should be made coincident so as to actually optimize the parameters).

The function f(I, S) contained in the equation (3) corresponds to the function defined by the present invention, and is expressed as follows:

$$f(I, S)=(1-S)+S\times(I/I_0)^Y/\{1-\exp[-(I/I_0)^Y]\} \quad (18)$$

This function increases monotonically as S increases from 0 to 1, is equal to 1 when S=0 regardless of the value of I, is equal to or nearly equal to 1 when S=1 for small values of I, is equal to or nearly equal to $(I\div I_0)^Y$ when S=1 for large values of I. ΔS was calculated for time intervals of 0.1 minute for the 80, 70, 60, 50, 40, 30, and 20 A discharges. For the 10 A discharge, a time interval of 0.2 minute was used. For the 5 A discharge, a time interval of 0.4 minute was used. The new value of S was recalculated at the end of each time interval by adding ΔS to the previous value of S. In order that the calculated discharge time is made coincident with the actually measured discharge time at the end of the discharge operation when S becomes 1, S is calculated for the actually measured end time of the discharge operation under each of the constant current discharges, and then the parameters $I_0$, Y, M were adjusted so as to make this calculated value close to 1 (a difference is calculated between the S value calculated under each current value and 1, and parameters were optimized so as to minimize a square summation of them). As a result, the optimized values of $I_0$, Y, M become 4.02 A, 0.624, 40.61 Ah, respectively.

Using the optimized parameters, in accordance with the method for calculating the battery capacity of the present invention, the times required to reach a value of S=1 starting from S=0 were calculated for 80, 70, 60, 50, 40, 30, 20, 10, and 5 A discharges. The same time intervals as used above were used in calculating the discharge times. The battery capacity obtained for each current was calculated by multiplying the calculated discharge time by the current.

These results are shown in Table 2 below. The experimental data are also included in Table 2. As can be seen from this table, the calculated battery capacities are substantially equal to the experimental battery capacities.

Using the same optimized values of $I_0$, Y and M as above, the times required to reach a value of S=1 starting from S=0 were calculated for two conditions in which the battery is discharged sequentially at two different currents.

In the first condition, the battery is discharged for 10 Ah at a discharge current of 5 A, and then discharged to the empty condition at a discharge current of 80 A. In the second condition, the battery is first discharged for 10 Ah at a discharge current of 5 A. For the 80 A portion of the discharge, a 0.1 minute time interval Δt was used in the calculation, and for the 5 A portion of the discharge, a 0.4 minute time interval Δt was used in the calculation. The battery capacity for each condition was calculated by adding to 10 Ah the product of the time of the second step of the discharge and the current value of the second step of the discharge.

As a result, for the 5 A followed by 80 A case, a battery capacity of 17.5 Ah was calculated. For the 80 A followed by 5 A case, a battery capacity of 22.8 Ah was calculated. These results are in agreement with the second general characteristic of batteries, which is that a larger total capacity is obtained when the large current value discharge comes before the small current value discharge than when the large current value discharge comes after the small current value discharge. As can be seen, the 22.8 Ah capacity of the 80 A followed by 5 A case is greater than the 17.5 Ah of the 5 A followed by 80 A case.

In a second embodiment of the present invention, the variation amount ΔS was calculated by employing the below-mentioned function:

$$f(I,\ S)=(S\times I/I_0)^Y/\mathrm{TANH}\ [(S\times I/I_0)^Y] \quad (19)$$

The function increases monotonically as S increases from 0 to 1, is equal to 1 when S=0 regardless of the value of I, is equal to or nearly equal to 1 when S=1 for small values of I, is equal to or nearly equal to $(I\div I_0)^Y$ when S=1 for large values of I.

In comparison with the actually measured values, a calculation was made to obtain optimum values of $I_0$, Y, M with employment of the same method as the embodiment 1. These values were 2.97 A, 0.462, and 38.89 Ah, respectively. Using these values, the battery capacities obtained for 80, 70, 60, 50, 40, 30, 20, 10, and 5 A discharges were calculated as described in the embodiment 1. These results are shown in Table 2 below. As can be seen from this table, the correspondence between calculated battery capacities and the experimental battery capacities is excellent.

Using the above-described optimum values of $I_0$, Y and M, the battery capacities for the 5 A followed by 80 A case and the 80 A followed by 5 A case were calculated as described in the first embodiment. For the 5 A followed by 80 A case, a battery capacity of 18.0 Ah was calculated. For the 80 A followed by 5 A case, a battery capacity of 21.4 Ah was calculated. These results are in agreement with the second important general characteristic of batteries in which a larger total capacity is obtained when the large current value discharge comes before the small current value discharge than when the large current value discharge comes after the small current value discharge.

In a third embodiment of the present invention, instead of the function f(I, S) in the above-described embodiment, a variation amount ΔS was calculated by using the following function:

$$f(I,\ S)=(I-S^2)+S^2\times(I/I_0)^Y/(1-\exp[-1\times(I/I_0)^Y]) \quad (20)$$

This function increases monotonically as S increases from 0 to 1, is equal to 1 when S=0 regardless of the value of I, is equal to or nearly equal to 1 when S=1 for small values of I and is equal to or nearly equal to $(I\div I_0)^Y$ when S=1 for large values of I.

First, optimum values of $I_0$, Y and M were calculated in comparison with the actually measured values by employing the same method as in the first embodiment. These values were 6.20 A, 0.929 and 34.37 Ah, respectively. Using these values, the battery capacities obtained for 80, 70, 60, 50, 40, 30, 20, 10 and 5 A discharges were calculated as described in the first embodiment. These results are shown in Table 2 below. As can be seen from the table, the correspondence between the calculated battery capacities and the experimental battery capacities is excellent.

Using the above-described optimum values of $I_0$, Y and M, the battery capacities for the 5 A followed by 80 A case and the 80 A followed by 5 A case were calculated as described in the first embodiment. For the 5 A followed by 80 A case, a battery capacity of 16.0 Ah was calculated. For the 80 A followed by 5 A case, a battery capacity of 26.3 Ah was calculated. These results are in agreement with the second important general characteristic of batteries in which a larger total capacity is obtained when the large current value discharge comes before the small current value discharge than when the large current value discharge comes after the small current value discharge.

In a fourth embodiment of the present invention, instead of the function f(I, S) in the above-described first embodiment, a variation amount ΔS was calculated by employing the following function:

$$f(I,\ S)=\mathrm{COS}\ (S)+\mathrm{SIN}\ (S)\times(I/I_0)^Y/\mathrm{TANH}\ [(I/I_0)^Y] \quad (21)$$

This function increases monotonically as S increases from 0 to 1, is equal to 1 when S=0 regardless of the value of I, is equal to or nearly equal to 1 when S=1 for small values of I, is equal to or nearly equal to $(I\div I_0)^Y$ when S=1 for large values of I.

First, optimum values of $I_0$, Y and M were obtained by employing the same method as in the first embodiment in comparison with the actually measured values. These values were 3.98 A, 0.653, and 44.97 Ah, respectively. Using these best fit values, the battery capacities obtained for 80, 70, 60, 50, 40, 30, 20, 10, and 5 A discharges were calculated as described in the first embodiment. These results are shown in Table 2. As can be seen from this table, the correspondence between calculated battery capacities and the experimental battery capacities is excellent.

Using the above-described optimum values of $I_0$, Y and M, the battery capacities for the 5 A followed by 80 A case and the 80 A followed by 5 A case were calculated as described in the first embodiment. For the 5 A followed by 80 A case, a battery capacity of 17.3 Ah was calculated. For the 80 A followed by 5 A case, a battery capacity of 22.7 Ah was calculated. These results are in agreement with the second important general characteristic of batteries in which a larger total capacity is obtained when the large current value discharge comes before the small current value discharge than when the large current value discharge comes after the small current value discharge.

In a fifth embodiment of the present invention, instead of the function f(I, S) in the above-explained first embodiment, a variation amount ΔS was calculated by employing the below-mentioned function:

$$f(I,\ S)=(1-S^{1/2})+S^{1/2}\times(I/I_0)^Y/\{1-\exp[-(I/I_0)^Y]\} \quad (22)$$

This function increases monotonically as S increases from 0 to 1, is equal to 1 when S=0 regardless of the value of I, is equal to or nearly equal to 1 when S=1 for small values of I, is equal to or nearly equal to $(I\div I_0)^Y$ when S=1 for large values of I.

First, a calculation was made of the optimum values for $I_0$, Y and M in comparison with the actually measured values by employing the same method as in the first embodiment. These values were 3.97 A, 0.516, and 44.44 Ah, respectively. Using these optimum values, the battery capacities obtained for 80, 70, 60, 50, 40, 30, 20, 10, and 5 A discharges were calculated as described in the first embodiment. These results are shown in Table 2. As can be seen from this table, the correspondence between calculated battery capacities and the experimental battery capacities is excellent.

Using the above-described optimum values of $I_0$, Y and M, for the battery capacities for the 5 A followed by 80 A case and the 80 A followed by 5 A case, a battery capacity of 18.5 Ah was calculated. For the 80 A followed by 5 A case, a battery capacity of 20.4 Ah was calculated. These results are in agreement with the second important general characteristic of batteries in which a larger total capacity is obtained when the large current value discharge comes before the small current value discharge than when the large current value discharge comes after the small current value discharge.

The following comparison illustrates the advantages of the present invention. In accordance with this comparison example, instead of the function f(I, S) in the first embodiment, a variation amount ΔS of a charge condition was calculated by using the following function:

$$f(I)=(I/I_0)^Y/\mathrm{TANH}\,[(I/I_0)^Y] \quad (23)$$

This function is independent of S value and, thus, does not fall within the scope of the claims of this invention.

First, the same method as in the first embodiment was employed and the optimum values of $I_0$, Y and M were calculated in comparison with the actually measured values. These values were 6.50 A, 0.406, and 39.14 Ah, respectively. Using these optimum values, the battery capacities obtained for 80, 70, 60, 50, 40, 30, 20, 10 and 5 A discharges were calculated as described in the first embodiment. These results are shown in Table 2. As can be seen from the table, the calculated battery capacities and the experimental battery capacities are substantially equal to each other. When studying only this result, the above-described function "f" need not be a function of S, and does not completely require that the function "f" be monotonically increasing as S increases from 0 to 1, be equal to 1 when S=0 regardless of the value of I, be equal to or nearly equal to 1 when S=1 for small values of I, and be equal to or nearly equal to $(I \div I_0)^Y$ when S=1 for large values of I.

However, when the function $$f(I)=(I/I_0)^Y/\mathrm{TANH}\,[(I/I_0)^Y]$$

is employed, the calculation result of the discharge capacity does not reflect the second important general characteristic of the battery. Using the above-described optimized values of $I_0$, Y and M during the constant discharge current, the battery capacities for the 5 A followed by 80 A case and the 80 A followed by 5 A case were calculated as described in the first embodiment. For the 5 A followed by 80 A case, a battery capacity of 19.7 Ah was calculated. For the 80 A followed by 5 A case, a battery capacity of 18.7 Ah was calculated. These results are in contrast to the results obtained in the embodiments 1 to 5 shown above. When the function $$f(I)=(I/I_0)^Y/\mathrm{TANH}\,[(I/I_0)^Y]$$

is employed, a smaller total capacity is obtained when the large current value discharge comes before the small current value discharge than when the large current value discharge comes after the small current value discharge. Thus, this function is clearly inferior to the functions used in the first to fifth embodiments for cases in which the battery is discharged continuously at different currents.

TABLE 2

Measured and Calculated Capacities for Constant Current Discharges of a 30 Ah Lead Acid Battery (Ah)

| | 80A | 70A | 60A | 50A | 40A | 30A | 20A | 10A | 5A |
|---|---|---|---|---|---|---|---|---|---|
| Measured Capacity | 13.8 | 15.0 | 15.5 | 17.2 | 18.0 | 19.6 | 22.8 | 27.8 | 30.9 |
| embodiment 1 | 14.0 | 14.8 | 15.7 | 16.8 | 18.1 | 20.0 | 22.7 | 17.2 | 31.0 |
| embodiment 2 | 14.1 | 14.8 | 15.7 | 16.8 | 18.1 | 20.0 | 22.7 | 27.2 | 31.2 |
| embodiment 3 | 14.1 | 14.8 | 15.7 | 16.8 | 18.2 | 20.1 | 22.9 | 27.1 | 30.2 |
| embodiment 4 | 14.1 | 14.8 | 15.7 | 16.8 | 18.1 | 20.0 | 22.7 | 27.4 | 31.0 |
| embodiment 5 | 14.0 | 14.8 | 15.6 | 16.8 | 18.1 | 20.0 | 22.7 | 27.2 | 31.2 |
| Comparison 1 | 14.1 | 14.8 | 15.7 | 16.8 | 18.2 | 20.0 | 22.8 | 27.3 | 31.2 |

In the first through fifth embodiments, different functions f(I, S) were used, which fall within the scope of the claims of the present invention. Since the functions are different, the fitted parameters, $I_0$, Y and M and the coincidence degree between the experimental capacities and the experimental capacities are not the same for each function. Since all of the functions have the same general characteristics, however, the fitted parameters and the goodness of fit are similar. For the embodiments 1–5, values of $I_0$ range from 2.97 to 6.20, values of Y range from 0.462 to 0.929, and values of M range from 34.37 to 44.97. To comprehensively evaluate the coincidence degree, or the goodness of fit when the respective functions are employed, the calculations were performed in the respective embodiments such that square-summed difference between the measured capacities and the calculated capacities of the embodiments under the respective current values were minimized. The square-summed difference of the third embodiment having the lowest coincidence degree was about 5.6 times greater than that of the embodiment having the highest coincidence degree. In all of the examples for the embodiments, results were obtained for two-step discharges, first through fifth which are in rough agreement with the second general characteristic of batteries, in which a larger total capacity is obtained when the large current value discharge comes before the small current value discharge than when the large current value discharge comes after the small current value discharge.

In the following sixth through eighth embodiments, explicit numerical agreement with the second general characteristic of batteries is shown in the fitting of functions f(I, S), which fall within the scope of the claims of the present invention, to the experimental data in Table 1 for a 6 Ah 12 volt sealed lead-acid battery.

In the sixth embodiment, an indication value S of a battery remaining capacity is calculated in the same calculation steps as in the first embodiment.

It should be noted that in this embodiment, in order to optimize the parameters contained in the equation (3), the results obtained from the combination of the different current values contained in the table 1 under the continuous discharge operation are employed, whereas the measured values under the constant current discharge conditions are used in the first embodiment. As the correction function within the equation (3), the following function is utilized:

$$f(I, S)=(1-S^2)+S^2\times(I/I_0)^Y/1-\exp[-(I/I_0)^Y]\} \quad (24)$$

This function increases monotonically as S increases from 0 to 1, is equal to 1 regardless of the value of I, is equal to or nearly equal to 1 when S=1, when S=0 for small values of I and is equal to or nearly equal to $(I \div I_0)^Y$ when S=1 for large values of I.

In the experiment, first, a 12 V 6 Ah sealed lead acid battery was continuously discharged from the full condition to the empty condition at two different constant currents, a large current value and a small current value, as shown previously in Table 1. The total quantity of current for the eight different continuous discharges is given in Table 1.

The respective parameters were optimized by using a spreadsheet program on a personal computer in the same method as in the first embodiment. For optimization, the initial S value was 0. ΔS was calculated according to equation (3) using a time interval of 0.06 minutes for the 10 A discharge and a time interval of 0.6 minutes for the 1 A discharge. The value of S was recalculated at the end of each time interval by adding ΔS to the previous value of S. The parameters $I_0$, Y and M were optimized so as to minimize the difference square-sum between 1 and the values of S at the end of the eight discharges.

For the above function, the optimum values of $I_0$, Y and M were 6.23 A, 3.08, and 3.85 Ah, respectively. Using these optimum values, the times required to reach a value of S=1 starting from S=0 were calculated for the eight cases. The same time intervals as used above in optimizing the function were used in calculating the discharge times. The battery capacity for each case was calculated by adding the experimental quantity of charge for the first step of the discharge to the product of the time of the second step of the discharge and the current value of the second step of the discharge.

The results are shown in Table 3 below. The experimental data are also included in Table 3. As can be seen from this table, the calculated battery capacities and the experimental battery capacities are substantially equal to each other. With the exception of the experiment 4, the calculated values differ from the experimental values by less than 0.25 Ah.

In a seventh embodiment of the invention, the correction function of the sixth embodiment was changed into the below-mentioned equation, and the parameters contained in the equation were optimized by using a spreadsheet program on a personal computer in order that these parameters are fitted to the actually measured values in the Table 1:

$$f(I, S)=(S\times I/I_0)^Y/\mathrm{TANH}\,[(S\times I/I_0)^Y] \quad (25)$$

This function increases monotonically as S increases from 0 to 1, is equal to 1 when S=0 regardless of the value of I, is equal to or nearly equal to 1 when S=1 for small values of I and is equal to or nearly equal to $(I \div I_0)^Y$ when S=1 for large values of I.

A calculation was made of the optimum values for $I_0$, Y and M by using the general means as described in connection with the sixth embodiment. These values were 3.87 A, 1.75, and 3.78 Ah, respectively. Using these optimum values, the battery capacities obtained for the eight different discharges were calculated as described in the sixth embodiment. These results are shown in Table 3. As can be seen from this table, the calculated battery capacities and the experimental battery capacities are substantially the same values. With the exception of the fourth experiment, the calculated values differ from the experimental values by less than 0.15 Ah.

In an eighth embodiment of the present invention, the correction function of the preceding sixth embodiment was changed into the below-mentioned equation, and the parameters contained in the equation were optimized by using a spreadsheet program on a personal computer in order that these parameters are fitted to the actually measured values in the table 1:

$$f(I, S)=(1-S^3)+S^3\times(S\times I/I_0)^Y/\mathrm{TANH}\,[(I/I_0)^Y] \quad (26)$$

This function increases monotonically as S increases from 0 to 1, is equal to 1 when S=0 regardless of the value of I, is equal to or nearly equal to 1 when S=1 for small values of I, is equal to or nearly equal to $(I \div I_0)^Y$ when S=1 for large values of I.

The optimum values of $I_0$, Y and M were obtained by employing the general means as described in the sixth embodiment. These values were 5.34 A, 2.94, and 3.78 A, respectively. Using these best fit values, the battery capacities obtained for the eight different discharges were calculated as described in the sixth embodiment. These results are shown in Table 3. As can be seen from this table, the calculated battery capacities and the experimental battery capacities are substantially equal to each other. With the exception of the experiment 4, the calculated values differ from the experimental values by less than 0.15 Ah.

The following second comparison example illustrates advantages of the sixth through eighth embodiments of the present invention.

The correction function of the preceding sixth embodiment was changed into the below-mentioned equation, and the parameters contained in the equation were optimized by using a spreadsheet program on a personal computer in order that these parameters are fitted to the actually measured values in the table 1:

$$f(I)=(I/I_0)^Y/\mathrm{TANH}\,[(I/I_0)^Y] \quad (27)$$

This function is independent of the S value and, thus, does not fall within the scope of the claims of this invention.

The optimum values of $I_0$, Y and M were calculated by using the general means as described in the sixth embodiment. These values were 3.03 A, 0.042, and 4.20 Ah, respectively. Using these optimum values, the battery capacities obtained for the eight different discharges were calculated as described in the sixth embodiment. These results are shown in Table 3. As can be seen from this table, the calculated battery capacities and the experimental battery capacities are not substantially equal to each other. For all of the experiments, the calculated values differ from the experimental values by at east 0.40 Ah.

TABLE 3

Measured and Calculated Capacities (Ah) of a 6 Ah Lead Acid Battery for Two-Step Discharge Under Conditions Shown in Table 1.

| | EXP. 1 | EXP. 2 | EXP. 3 | EXP. 4 | EXP. 5 | EXP. 6 | EXP. 7 | EXP. 8 |
|---|---|---|---|---|---|---|---|---|
| MEAS. | 3.71 | 3.68 | 3.60 | 3.59 | 2.81 | 2.60 | 2.34 | 2.17 |
| EMB. | | | | | | | | |
| EX. 6 | 3.77 | 3.63 | 3.39 | 2.71 | 3.04 | 2.67 | 2.41 | 2.28 |
| EX. 7 | 3.77 | 3.63 | 3.55 | 2.97 | 2.96 | 2.57 | 2.36 | 2.31 |

TABLE 3-continued

Measured and Calculated Capacities (Ah) of a 6 Ah Lead Acid Battery for Two-Step Discharge Under Conditions Shown in Table 1.

| | EXP. 1 | EXP. 2 | EXP. 3 | EXP. 4 | EXP. 5 | EXP. 6 | EXP. 7 | EXP. 8 |
|---|---|---|---|---|---|---|---|---|
| EX. 8 | 3.77 | 3.62 | 3.55 | 3.00 | 2.96 | 2.58 | 2.38 | 2.32 |
| COMP. Ex. 2 | 3.23 | 3.13 | 3.20 | 3.18 | 3.24 | 3.22 | 3.18 | 3.15 |

In the embodiments 6–8, three different functions f(I, S) were used that fall within the scope of the claims of the present invention. Since these functions are different from each other, the optimized parameters, $I_0$, Y and M, and the coincidence degree between the experimental capacities and the experimental capacities are not the same for each function. Because all of the functions have the same general characteristics, however, the optimized parameters and the coincidence degree are similar to each other. For the embodiments 6–8, values of $I_0$ range from 3.87 to 6.23, values of Y range from 1.79 to 3.08, and values of M range from 3.78 to 3.85. With the exception of experiment 4 and of experiment 5 of the sixth embodiment, all of the calculated capacity results are in agreement with the second general characteristic of batteries in which a larger total capacity is obtained when the large current value discharge comes before the small current than when the large current value discharge comes after the small current value discharge.

In contrast, for this second comparison example, the calculated capacity results show no dependence on the order of the sequential discharge when the battery is continuously discharged at two different constant currents, one large and one small. As can be seen from the embodiments 1–5 and 6–8, in order to obtain good agreement with both general characteristics of batteries that belong to the major group, the functions f(I, S) must fall within the scope of the claims of the present invention.

In this ninth embodiment, a discharge curve based on actually measured values is compared with a discharge curve of calculated values in order to show the usefulness of the method for predicting the battery discharge current I using the method for calculating the battery capacity according to the present invention, especially the equation (2).

The same discharge data for a 12 V 30 Ah sealed lead acid battery as was used in the embodiments 1–5 is used in this embodiment and in the tenth embodiment. The discharge currents of 5, 10, 20, 30, 40, 50, 60, 70, and 80 A are shown with time being plotted on a logarithmic scale in FIG. 11.

Since the discharge currents are known for these nine constant current discharges, it is more appropriate to show the utility of equation (2) indirectly using a rearranged form thereof. The simple rearrangement of equation (2) to a form in which the battery terminal voltage is a function of I and S is shown below in the equation (28).

$$V_i = A - B\cdot(S_i - S_{ZONE1}) - C\cdot(S_i - S_{ZONE2})^2 - I_i\cdot R \quad (28)$$

Since equation 28 is a simple rearrangement of equation (2), the same restrictions that are made in this invention apply. Thus, in equation (2) and equation (28), A, B, C, R, $S_{ZONE1}$, $S_{ZONE2}$ are constants dependent on the battery type $S_{ZONE1}$ falls within the range from 0 to 0.99 depending on the battery type, $S_{ZONE2}$ falls within the range from $S_{ZONE1}$ to 0.99 depending on the battery type and the two terms $(S-S_{ZONE1})$ and $(S-S_{ZONE2})$ are restricted to be greater than or equal to 0.

With employment of a spread sheet program on a personal computer, the equation (28) was fitted to the actually measured data. First, the constants $S_{ZONE1}$ and $S_{ZONE2}$ contained in this equation were arbitrarily fixed to 0.1 and 0.45, respectively in the fitting process. Since $(S-S_{ZONE1})$ is restricted to be greater than or equal to 0 in the present invention, for S values between 0 and 0.1, $(S-S_{ZONE1})$ must be equal to zero. Similarly, because $(S-S_{ZONE2})$ is restricted to be greater than or equal to 0, for S values between 0 and 0.45, $(S-S_{ZONE2})$ must be equal to zero. As a result of such restrictions, as the value of S increases from 0 to 0.1, $(S-S_{ZONE1})$ is unchanged from 0, but as the value of S increases from 0.1 to 1, $(S-S_{ZONE1})$ increases linearly from 0 to 0.9.

In the same way, as the value of S increases from 0 to 0.45, $(S-S_{ZONE2})$ is unchanged from 0, but as the value of S increases from 0.45 to 1, $(S-S_{ZONE2})$ increases linearly from 0 to 0.55.

In fitting equation (28), the indication value S is also required. In the calculation method of the present invention, after the initial value of S has been first set in the equation (1), the current is calculated by using the equation (2), ΔS is calculated and than a new value S is calculated by the equation (4). Since the discharge is commenced from the full charge state in this embodiment, the initial value of S is 0. As the current value in the equation (3), the actually measured values are employed. Then, the value of ΔS was calculated by substituting into equation (3) using the below-mentioned function identical to the function used in the fourth embodiment:

$$f(I, S) = \mathrm{COS}\,(S) + \mathrm{SIN}\cdot(S)\times(I/I_0)^Y/\mathrm{TANH}\,[(I/I_0)^Y] \quad (21)$$

The optimum values of the parameters $I_0$, Y and M were 3.98A, 0.653 and 44.97 Ah, respectively, as were those calculated in the fourth embodiment. In fitting equation (28), ΔS was calculated for time intervals of 0.1 minute for the 80, 70, 60, 50 A discharges, 0.2 minute for the 40 A discharge, 0.25 minute for the 30 A discharge, 0.4 minute for the 20 A discharge, 1 minute for the 10 A discharge and 2 minutes for 5 A discharge. The value of S was recalculated at the end of each time interval by adding ΔS to the previous value of S. The S value calculated in the above-described manner was substituted into equation (28).

In fitting equation (28), the parameters A, B, C and R were adjusted to minimize the differences between the calculated values of terminal voltage V and the experimental terminal voltages for all of the time intervals of the nine discharges. For the above conditions, the best fit values of A, B, C and R were 12.49 V, 1.386 V, 2.10 V, and 0.02027 ohms, respectively.

Figure 12A:
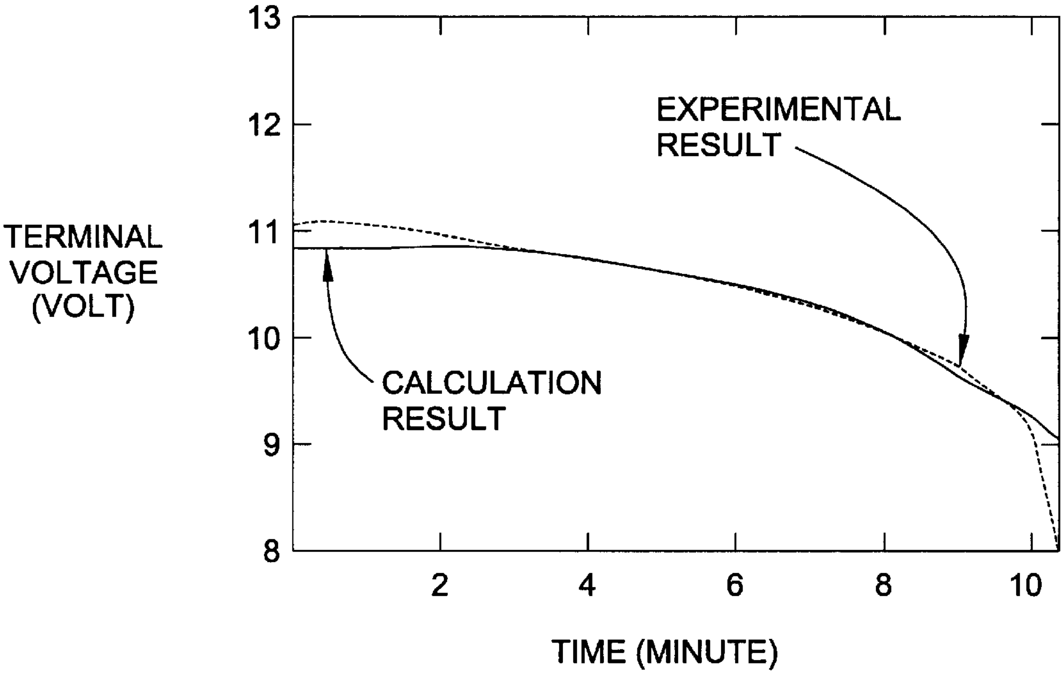
FIG. 12*a* is a relationship of experimental discharge voltage vs. time and calculated discharge voltage according to the means of the embodiment 9.
Figure 12B:
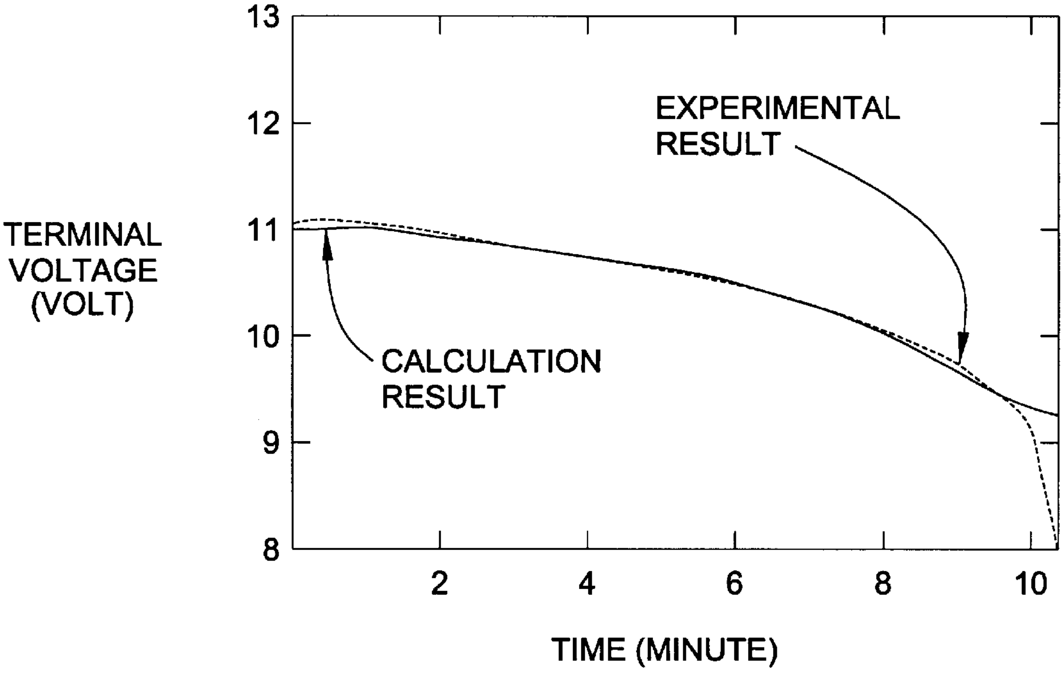
FIG. 12*b* is a relationship of experimental discharge voltage vs. time and calculated discharge voltage according based on comparison example 3.
Figure 13A:
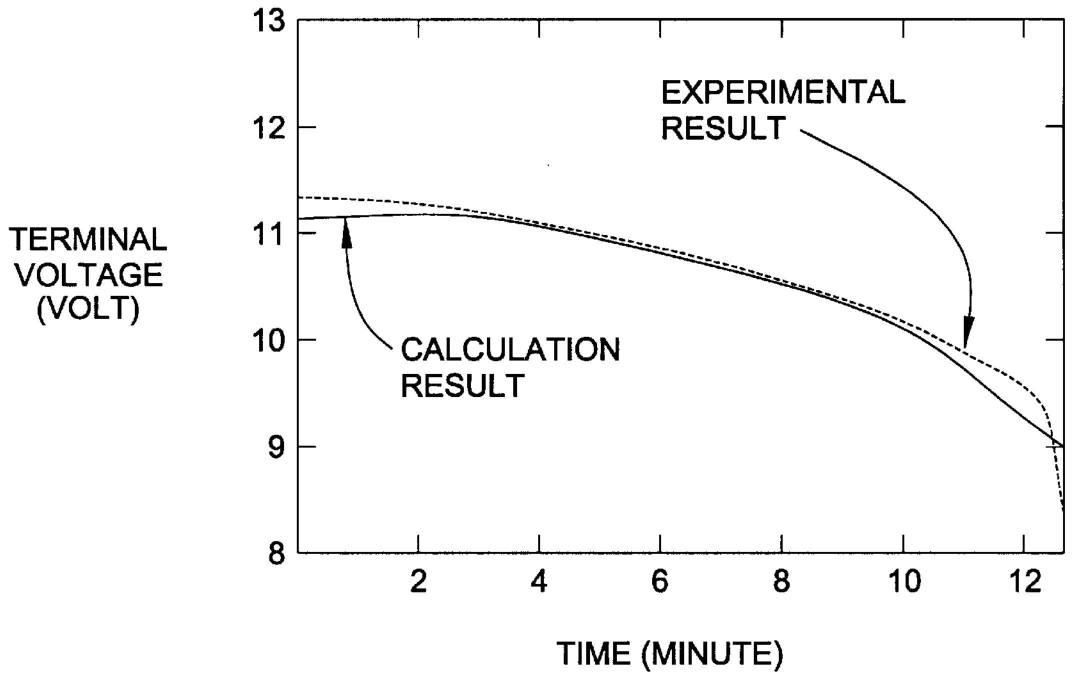
FIG. 13*a* is a relationship diagram between time, experimental discharge voltages and calculated discharge voltages based on embodiment 9.
Figure 13B:
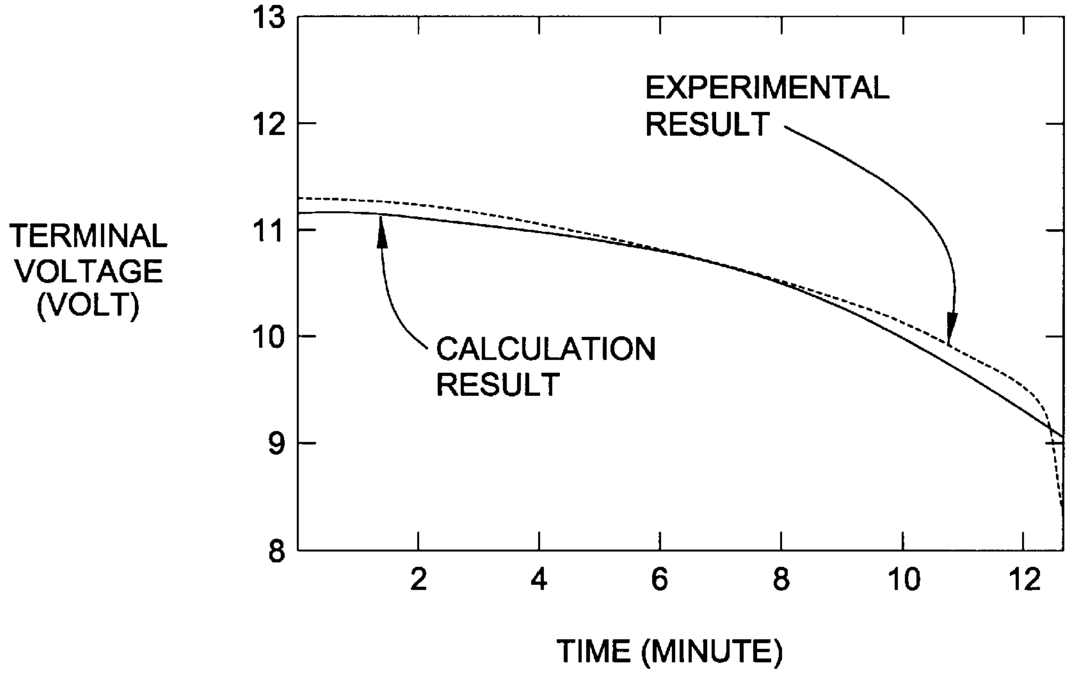
FIG. 13*b* is a relationship diagram between time, experimental discharge voltages and calculated discharge voltages based on comparison example 3.
Figure 14A:
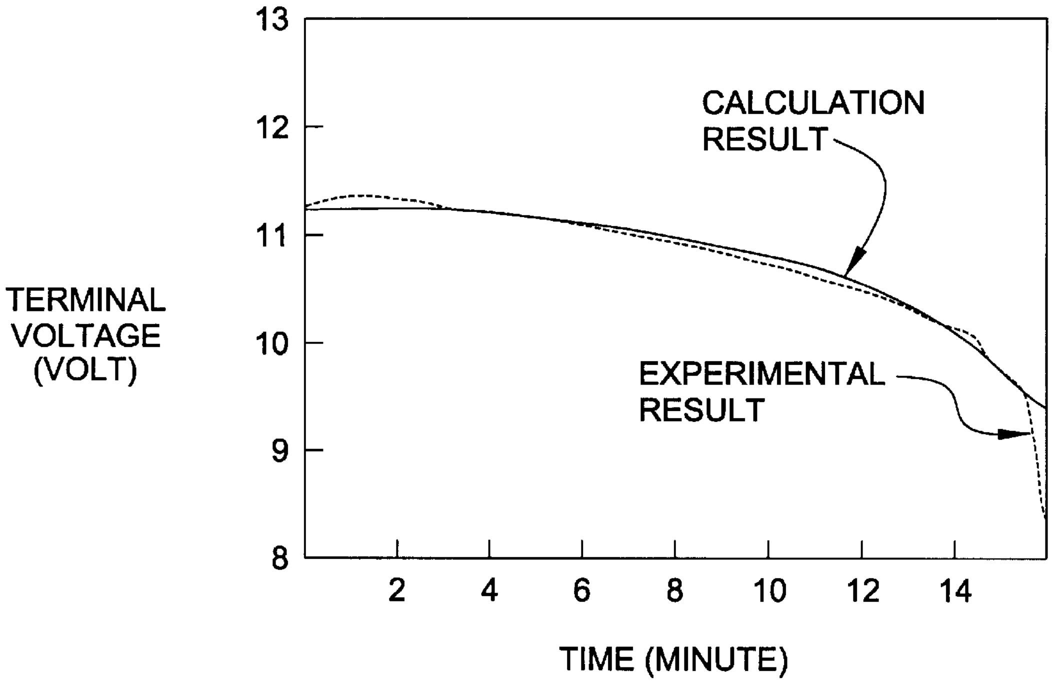
FIG. 14*a* is a relationship diagram between time, experimental discharge voltages and calculated discharge voltages based on embodiment 9.
Figure 14B:
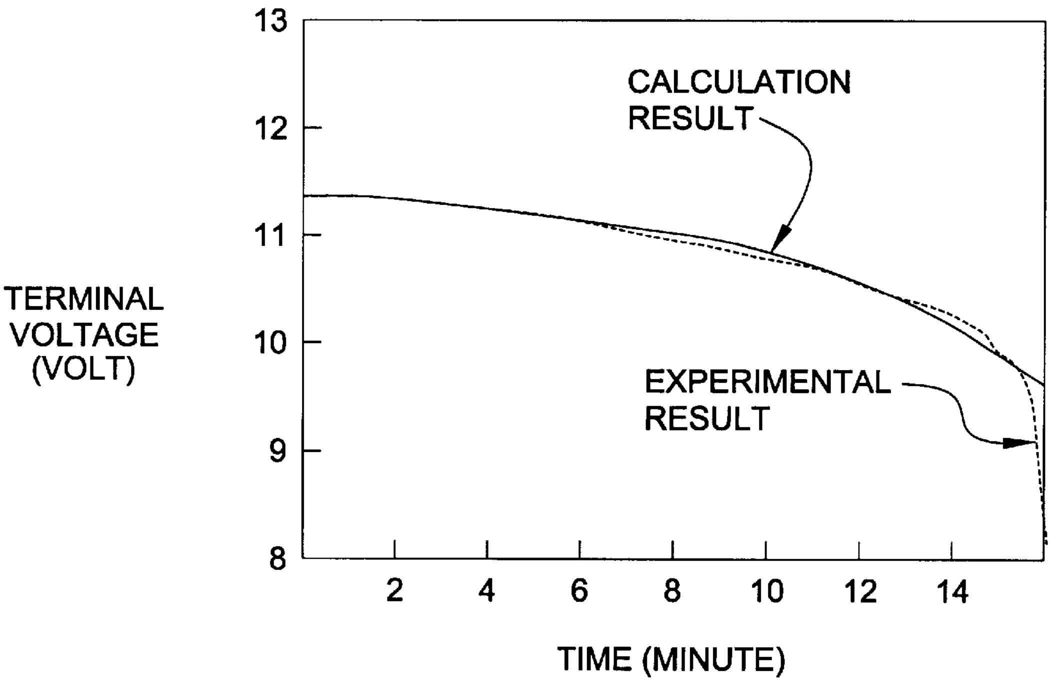
FIG. 14*b* is a relationship diagram between time, experimental discharge voltages and calculated discharge voltages based on comparison example 3.
Figure 15A:
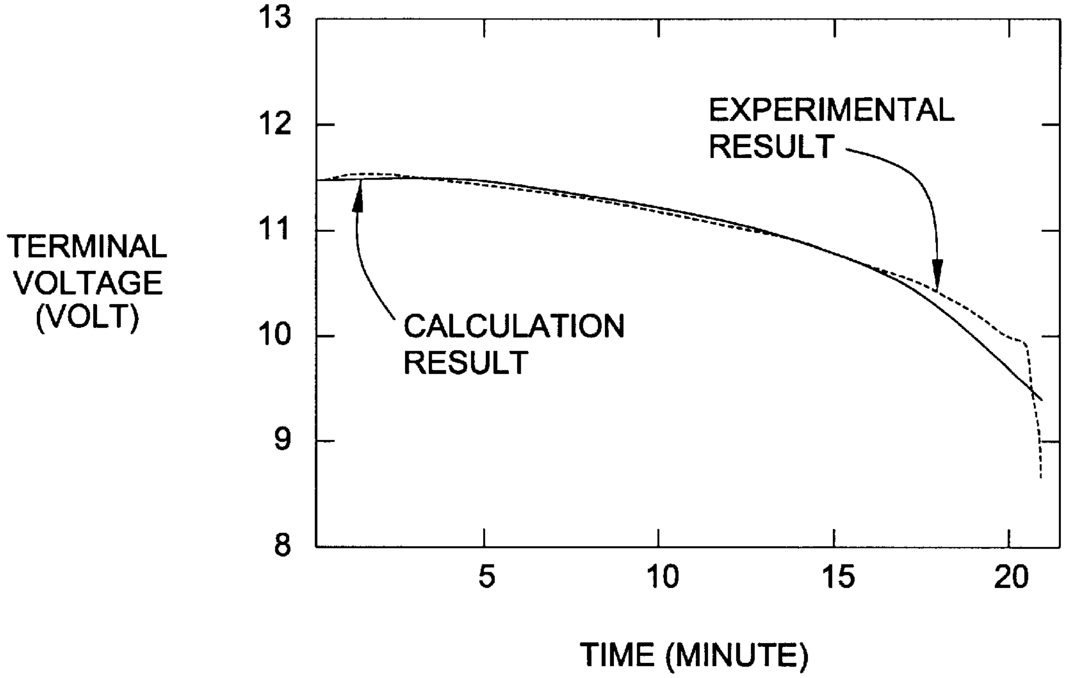
FIG. 15*a* is a relationship diagram between time, experimental discharge voltages, and calculated discharge voltages based on embodiment 9.
Figure 15B:
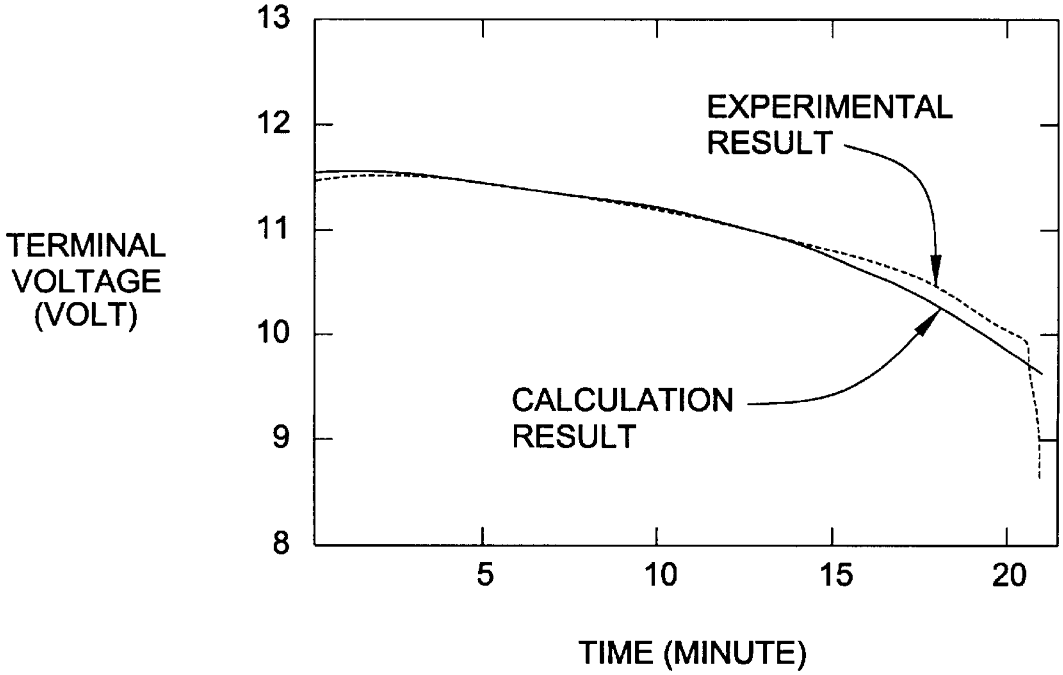
FIG. 15*b* is a relationship diagram between time, experimental discharge voltages and calculated discharge voltages based on comparison example 3.
Figure 16A:
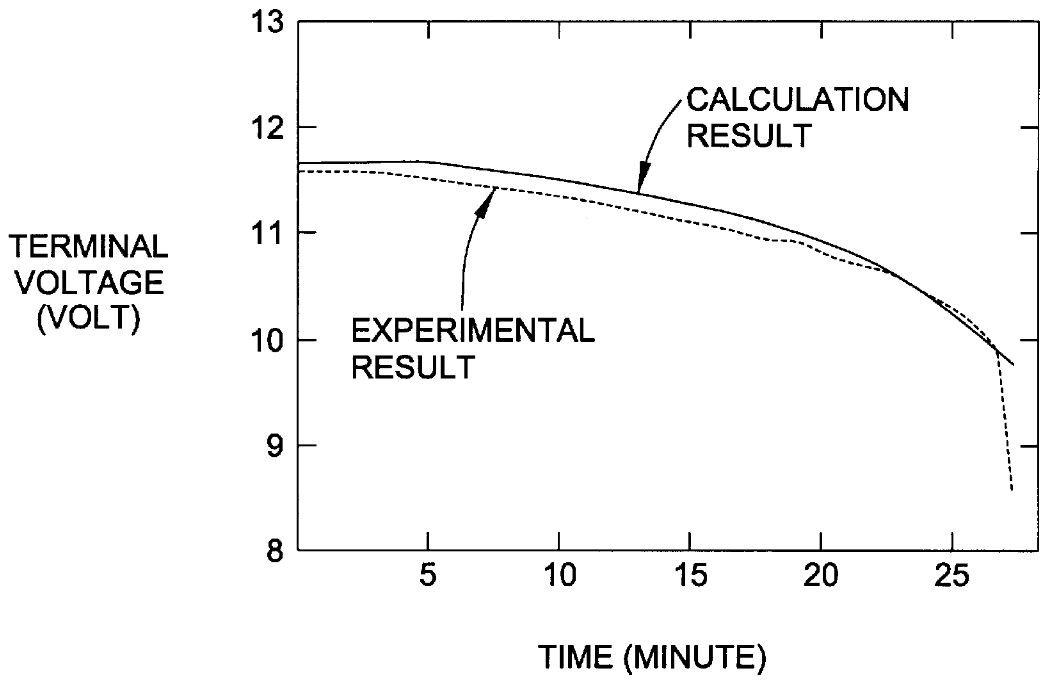
FIG. 16*a* is a relationship diagram between time, experimental discharge voltages and calculated discharge voltages based on embodiment 9.
Figure 16B:
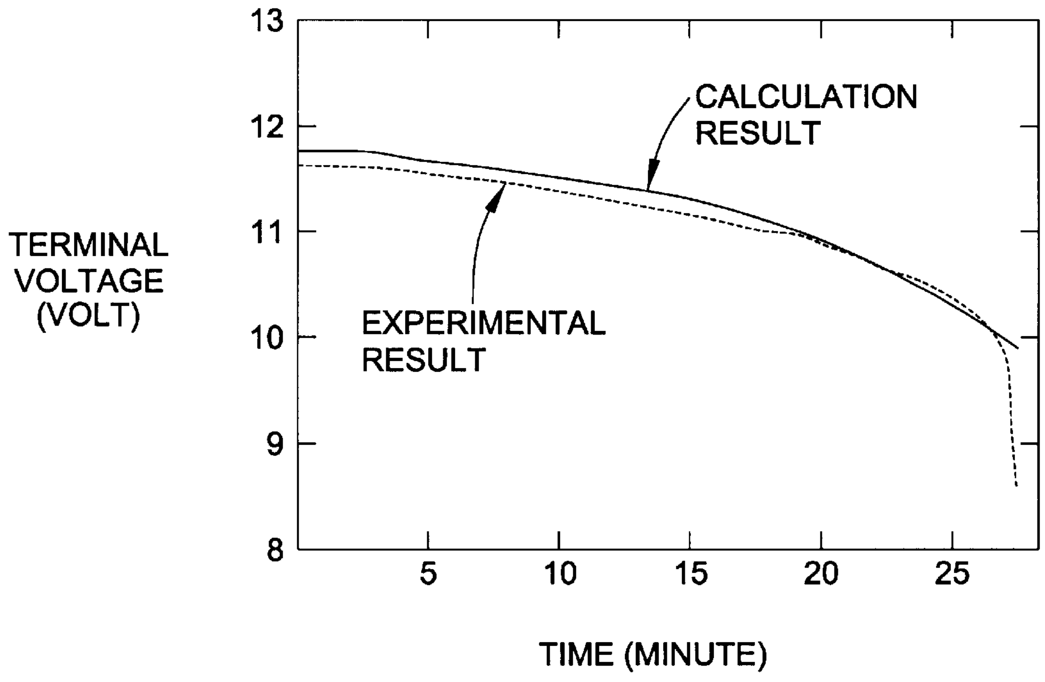
FIG. 16*b* is a relationship diagram between time, experimental discharge voltages and calculated discharge voltages based on comparison example 3.
Figure 17A:
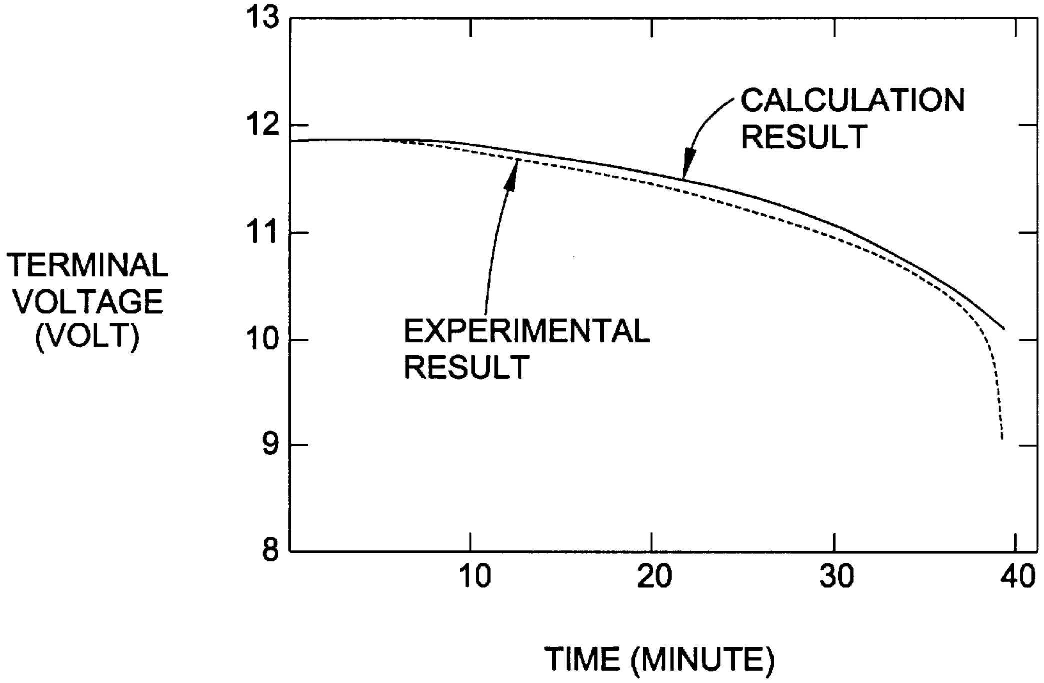
FIG. 17*a* is a relationship diagram between time, experimental discharge voltages and calculated discharge voltages based on embodiment 9.
Figure 17B:
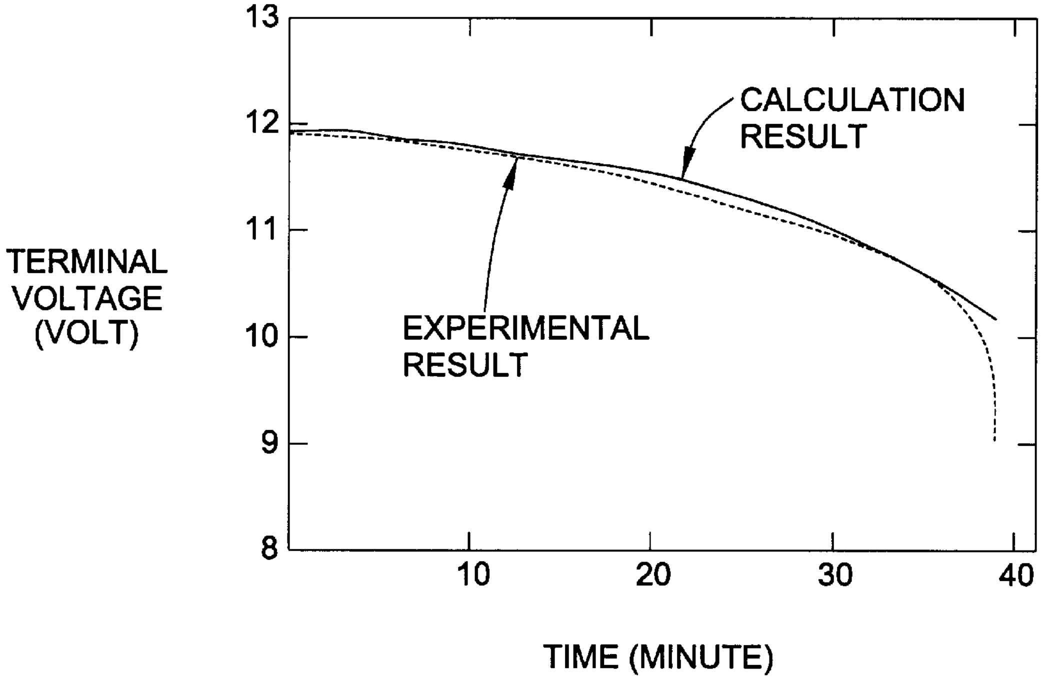
FIG. 17*b* is a relationship diagram between time, experimental discharge voltages and calculated discharge voltages based on comparison example 3.
Figure 18A:
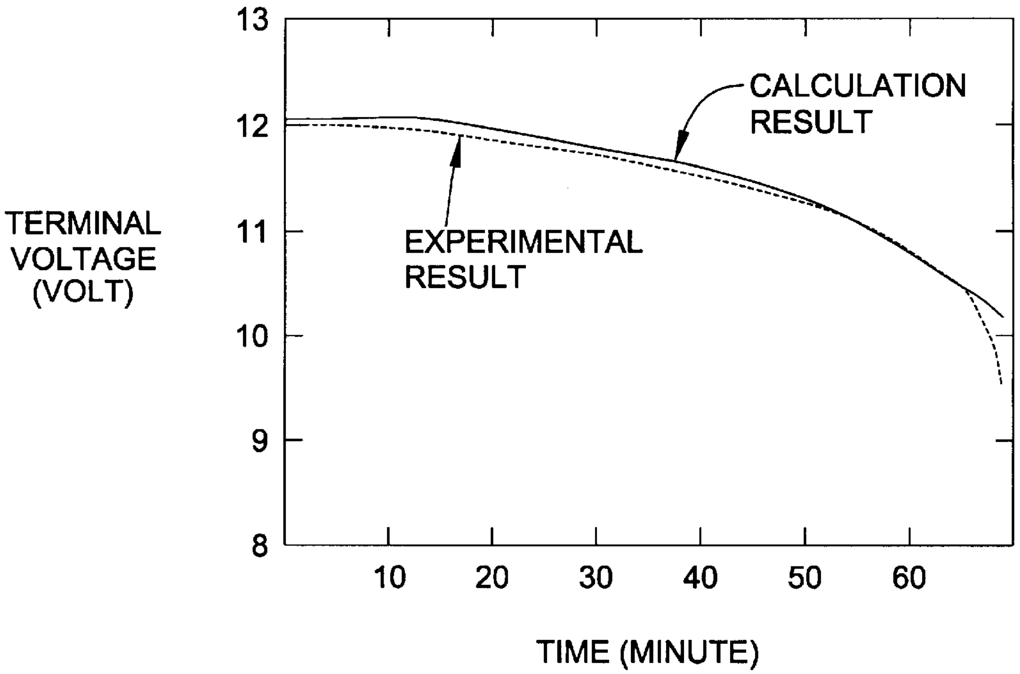
FIG. 18*a* is a relationship diagram between time, experimental discharge voltages and calculated discharge voltages based on embodiment 9.
Figure 18B:
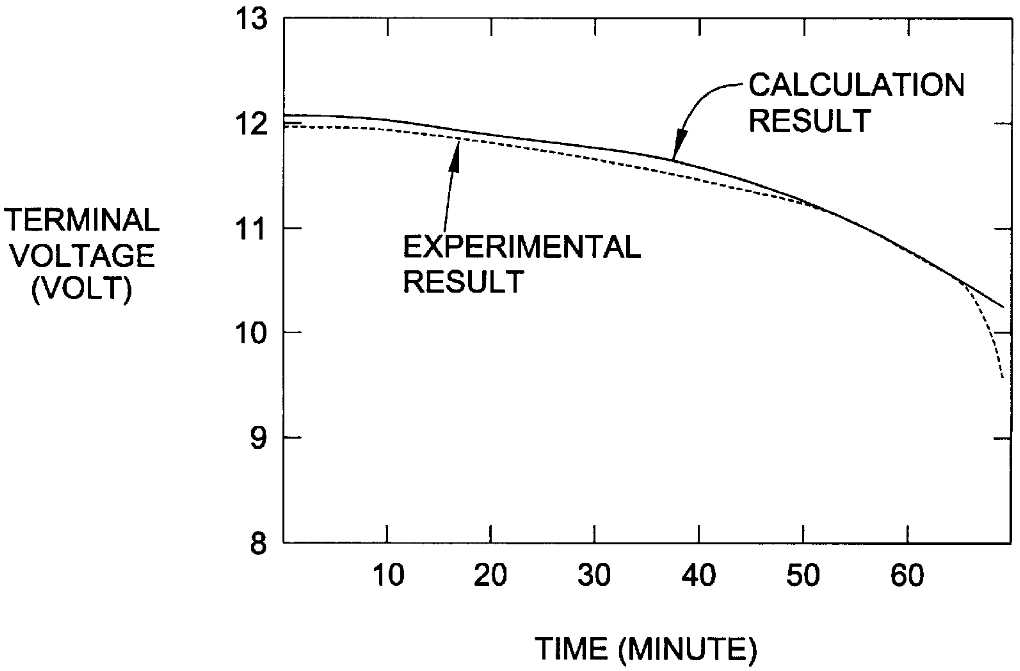
FIG. 18*b* is a relationship diagram between time, experimental discharge voltages and calculated discharge voltages based on comparison example 3.
Figure 19A:
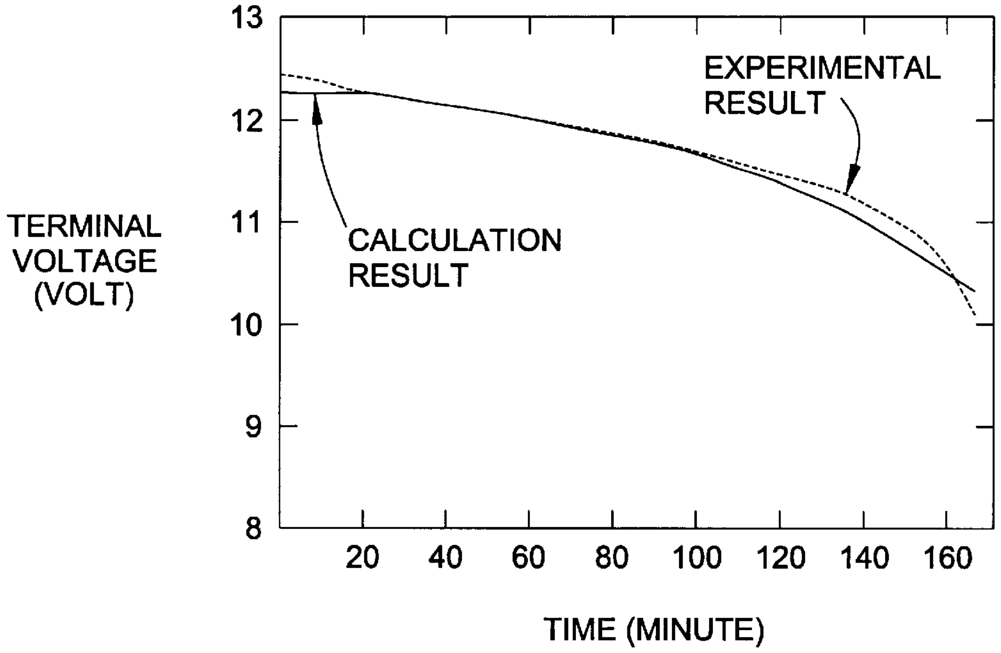
FIG. 19*a* is a relationship diagram between time, experimental discharge voltages and calculated discharge voltages based on embodiment 9.
Figure 19B:
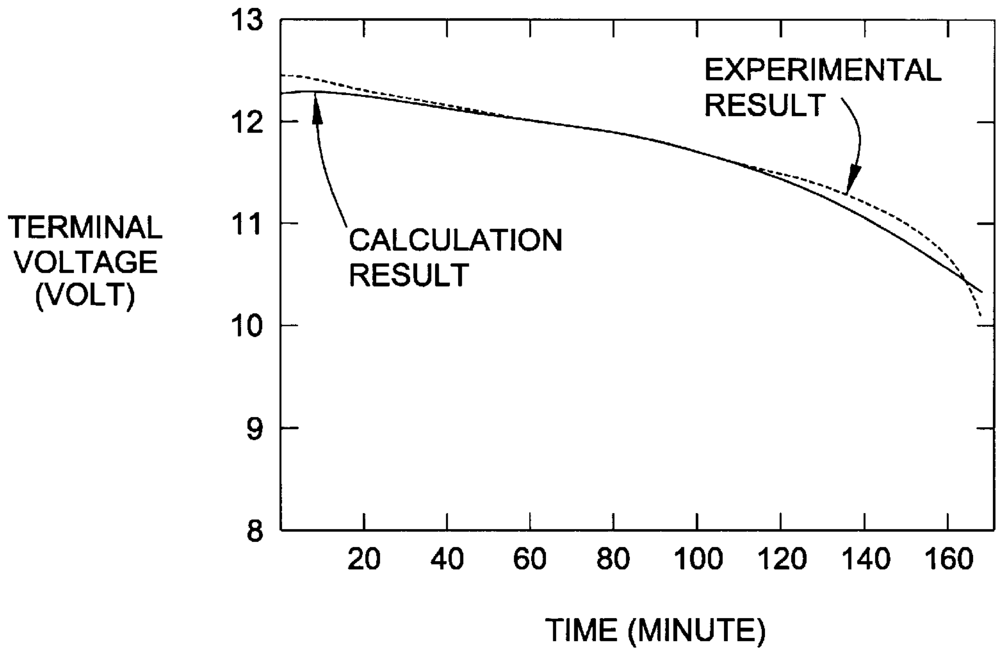
FIG. 19*b* is a relationship diagram between time, experimental discharge voltages and calculated discharge voltages based on means of comparison example 3.
Figure 20A:
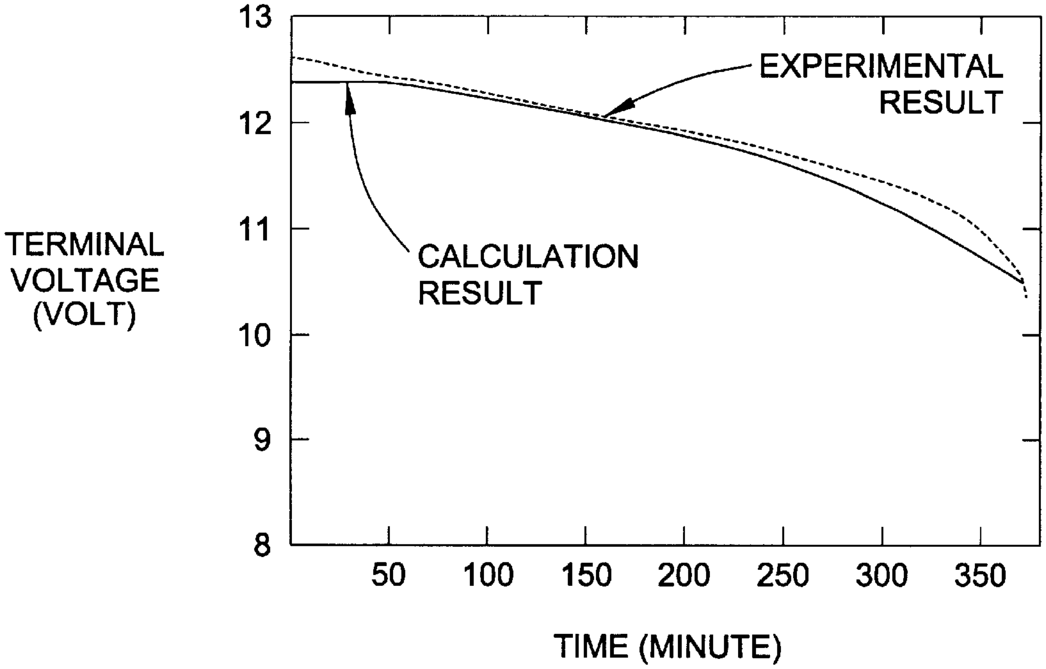
FIG. 20*a* is a relationship diagram between time, experimental discharge voltages, and calculated discharge voltages based on embodiment 9.
Figure 20B:
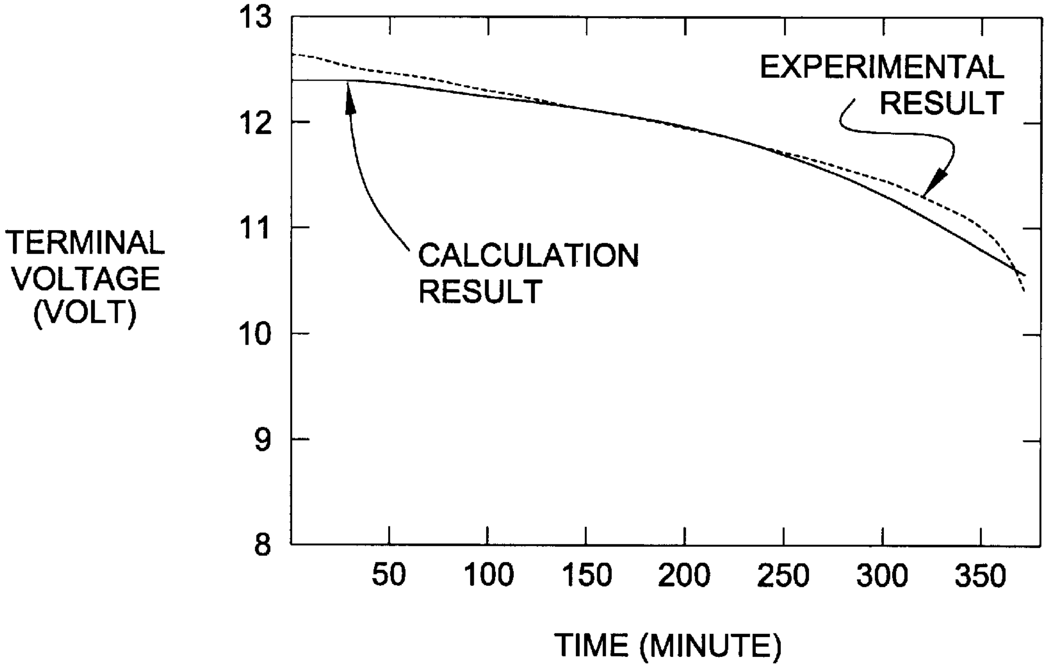
FIG. 20*b* is a relationship diagram between time, experimental discharge voltages and calculated discharge voltages based on comparison example 3.

Subsequently, using these values, the terminal voltages were calculated for the time intervals noted above for the nine constant current discharges. A plot showing the calculated and experimental terminal voltages vs. time for the 80 A discharge is shown in FIG. 12(*a*). A plot showing the same results for the 70 A discharge is shown in FIG. 13(*a*). A plot showing the same results for the 60 A discharge is shown in FIG. 14(*a*). A plot showing the same results for the 50 A discharge is shown in FIG. 15(*a*). A plot showing the same results for the 40 A discharge is shown in FIG. 16(*a*). A plot showing the same results for the 30 A discharge is shown in FIG. 17 (*a*). A plot showing the same results for the 20 A discharge is shown in FIG. 18(*a*). A plot showing the same results for the 10 A discharge is shown in FIG. 19(*a*). A plot showing the same results for the 5 A discharge is shown in FIG. 20(*a*). As can be seen in the figures, the calculated terminal voltages and the experimental terminal voltages substantially coincide with each other.

Thus, when using the function $f(I, S)=COS(S)+SIN(S)(I/I_0)^Y/TANH\{(I/I_0)^Y\}$ and the selected values of $S_{ZONE1}$ and $S_{ZONE2}$, the equation (28) is a useful equation for estimating the battery terminal voltage using I and S. Since the equation (28) is a simple rearrangement of equation (2), it follows that equation (2) is a useful equation for estimating the battery discharge current using V and S.

The following third comparison further illuminates the usefulness of equation (2) for estimating the battery discharge current using V and S. In this comparison example, a comparison is made between an actually measured discharge curve and a calculated discharge curve by employing the following function f(I) used in the first comparison example:

$$f(I)=(I/I_0)^Y/TANH[(I/I_0)^Y] \quad (23)$$

Using a spreadsheet program on a personal computer and the same general means as described above in the ninth embodiment, the equation (28) was again fit to the 12 V 30 Ah lead acid battery constant current discharge data. For the purpose of comparison with embodiment 9, $S_{ZONE1}$ is fixed arbitrarily as 0.1 and $S_{ZONE2}$ is fixed arbitrarily as 0.45. As was shown above in the first comparison example, this function, using the optimum value of $I_0$=6.50 A, Y=0.406 and M=39.14 Ah, gives substantial agreement between calculated battery capacities and experimental capacities for constant current discharge. The function $f(I, S)=(I/I_0)^Y$ did not represent, however, the second general characteristic of batteries that belongs to the major group.

The general method as described in the ninth embodiment was used to obtain the optimum values of A, B, C and R. These values were 12.46 V, 0.900 V, 3.47 V and 0.01810 ohms, respectively. Using these optimum values, the terminal voltages were calculated for the time intervals noted above in the ninth embodiment for the nine constant current discharges. A plot showing the calculated and experimental terminal voltage vs. time for the 80 A discharge is shown in FIG. 12(*b*). A plot showing the same results for the 70 A discharge is shown in FIG. 13(*b*). A plot showing the same results for the 60 A discharge is shown in FIG. 14(*b*). A plot showing the same results for the 50 A discharge is shown in FIG. 15(*b*). A plot showing the same results for the 40 A discharge is shown in FIG. 16(*b*). A plot showing the same results for the 30 A discharge is shown in FIG. 17(*b*). A plot showing the same results for the 20 A discharge is shown in FIG. 18(*b*). A plot showing the same results for the 10 A discharge is shown in FIG. 19(*b*). A plot showing the same results for the 5 A discharge is shown in FIG. 20(*b*). As can be seen in these figures, the calculated terminal voltages and the experimental terminal voltages substantially coincide with each other.

Thus, to make coincidence between calculated terminal voltages and experimental voltages using equation (7) and the above arbitrary values of $S_{ZONE1}$ and $S_{ZONE2}$, it is not absolutely necessary to use S values calculated using a function f(I, S) that increases monotonically as S increases from 0 to 1, is equal to 1 when S=1 regardless of the value of I, is equal to or nearly equal to 1 when S=1 for small values of I, and is equal to or nearly equal to $(I \div I_0)^Y$ when S=1 for large values of I. As was shown in the first and second comparison examples, the results do not represent the second general characteristic of batteries, which belongs to the major group. Such a result is not obtained, using a function such as $f(I)=(I/I_0)^Y/TANH\{(I/I_0)^Y\}$, which does not fall within the scope of the claims of this invention.

From this comparison example, it can be seen that equation (28) is a useful equation for estimating the battery terminal voltage as a function of I and S, but that the equation is not very sensitive to the value of S. Since equation (28) is a simple rearrangement of equation (2), it follows that equation (2) is a useful equation for estimating the battery discharge current I as a function of V and S. As for equation (28), it follows that equation (2) is not very sensitive to the value of S.

In a tenth embodiment, the effectiveness of employing the equation (2) has been evaluated in a similar manner to the ninth embodiment by changing the function f(I, S) used in the ninth embodiment into the following function:

$$f(I, S)=(S\times I/I_0)^Y/TANH[(S\times I/I_0)^Y] \quad (29)$$

Using a spreadsheet program on a personal computer and the general means as described above in the ninth embodiment, the equation (28) was again fit to the 12 V 30 Ah lead acid battery constant current discharge data. In this embodiment, both $S_{ZONE1}$, and $S_{ZONE2}$ are fixed arbitrarily as 0. For all S values, $(S-S_{ZONE1})$ will be equal to S. Similarly, for all S values, $(S-S_{ZONE2})$ will be equal to S. In fitting equation (7), ΔS was calculated using equation (3) with the same function as was used in the second embodiment, $f(I, S)=(S\times I/I_0)^Y/TANH\{(S\times I/I_0)^Y\}$. The optimum values of the parameters, $I_0$, Y and M, were the same as those determined in the second embodiment. Those values are 2.97 A, 0.462 and 38.89 Ah, respectively.

Figure 21A:
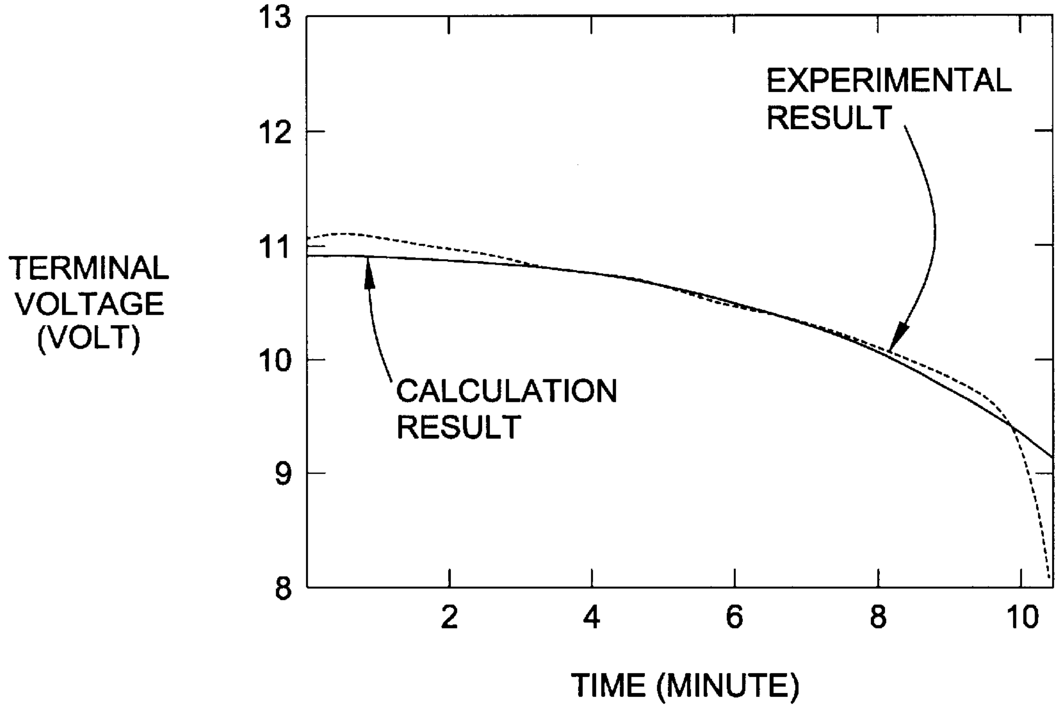
FIG. 21*a* is a relationship diagram between time, experimental discharge voltages and calculated discharge voltages based on embodiment 10.
Figure 21B:
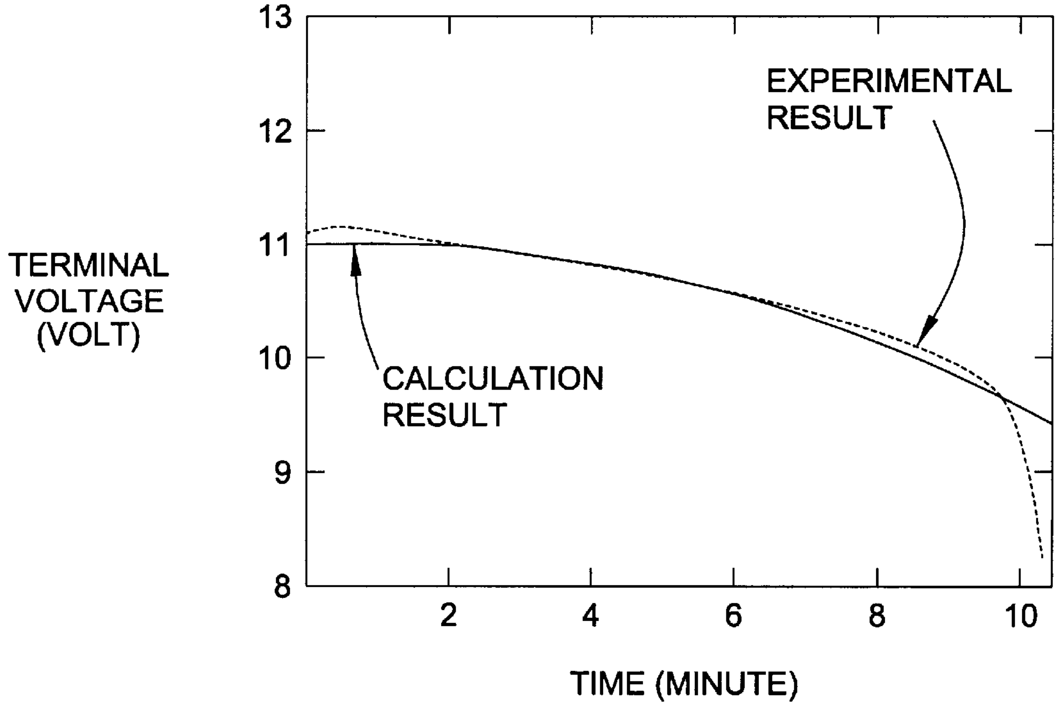
FIG. 21*b* is a relationship diagram between time, experimental discharge voltages and calculated discharge voltages based on comparison example 4.
Figure 22A:
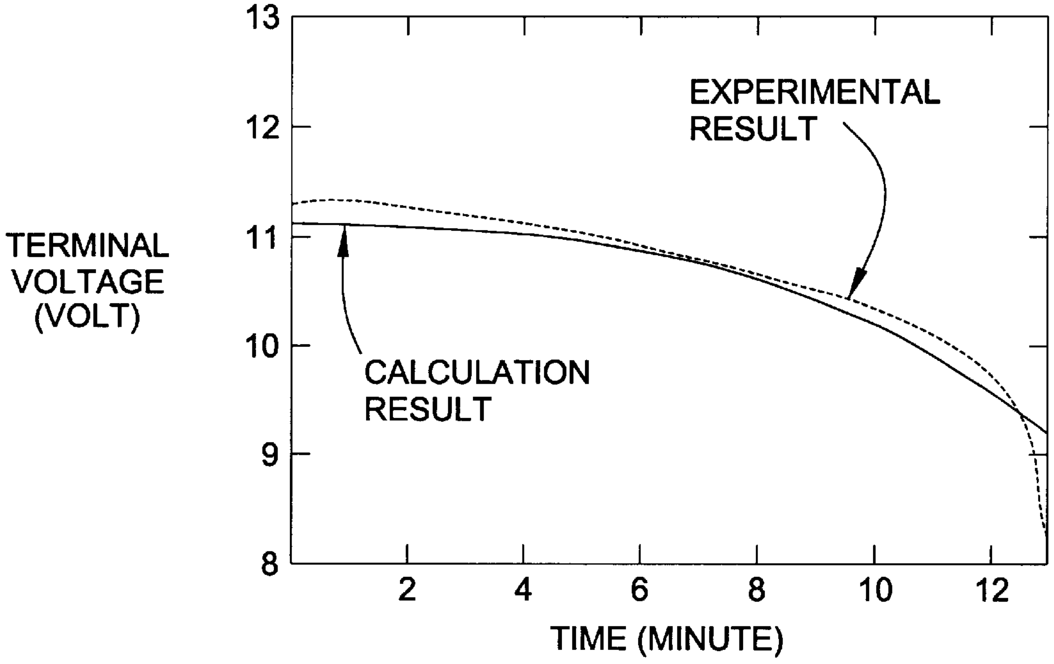
FIG. 22*a* is a relationship diagram between time, experimental discharge voltages and calculated discharge voltages based on embodiment 10.
Figure 22B:
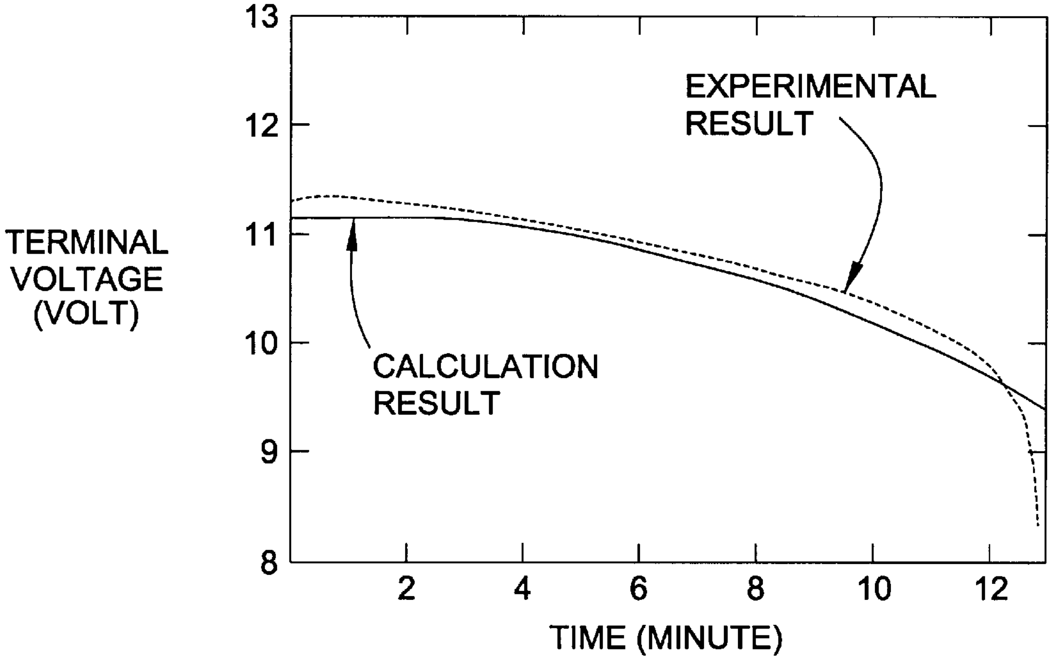
FIG. 22*b* is a relationship diagram between time, experimental discharge voltages and calculated discharge voltages based on comparison example 4.
Figure 23A:
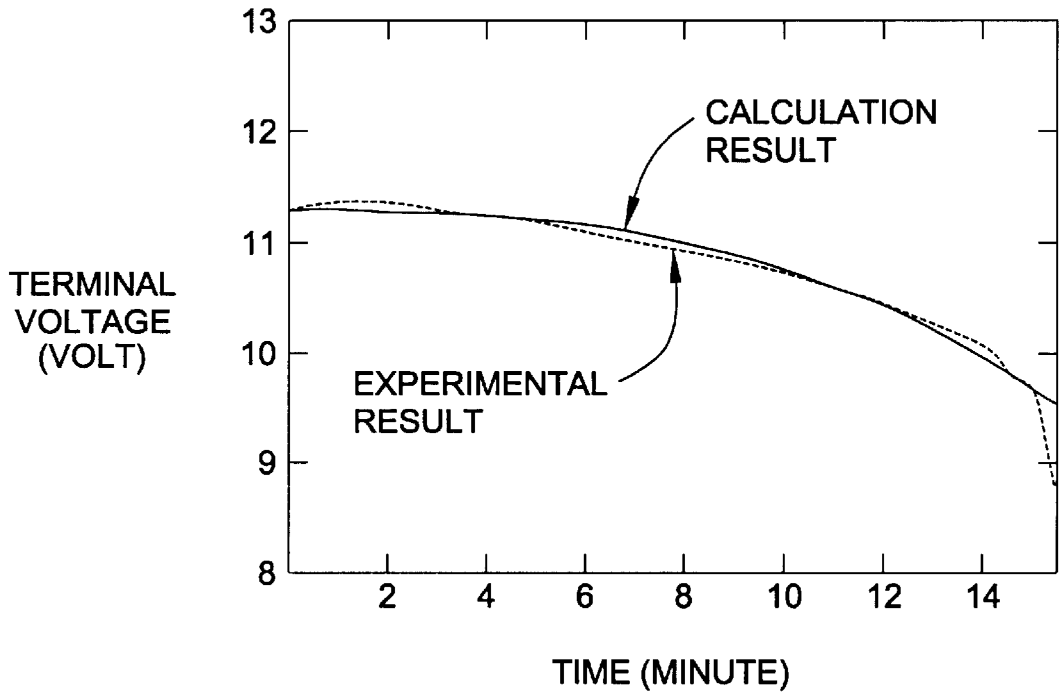
FIG. 23*a* is a relationship diagram between time, experimental discharge voltages, and calculated discharge voltages based on embodiment 10.
Figure 23B:
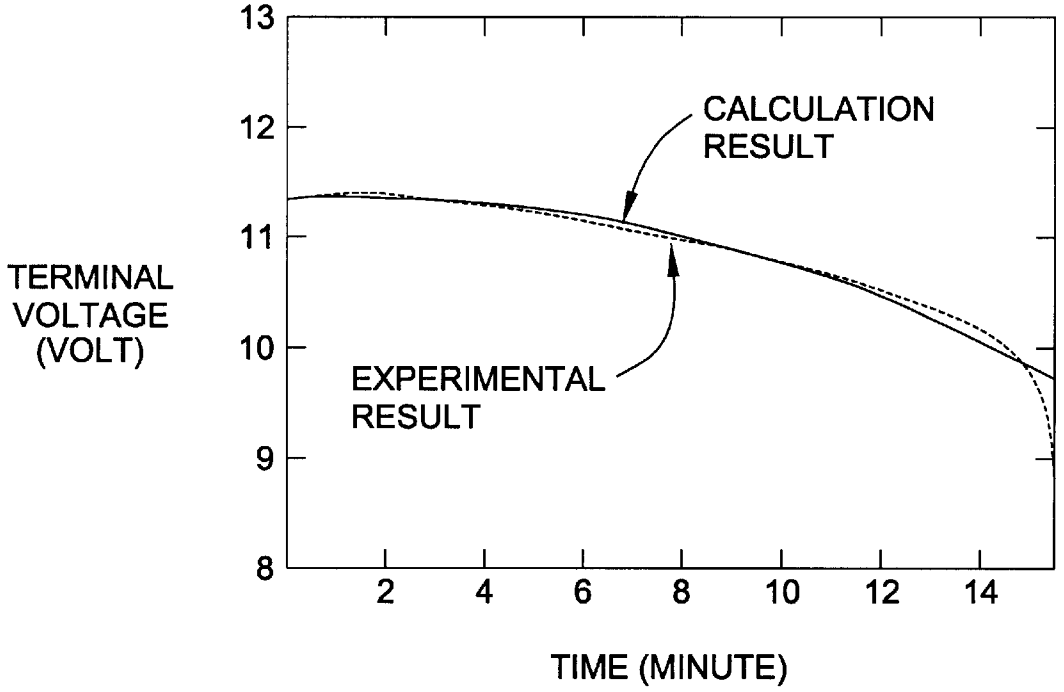
FIG. 23*b* is a relationship diagram between time, experimental discharge voltages and calculated discharge voltages based on means of comparison example 4.
Figure 24A:
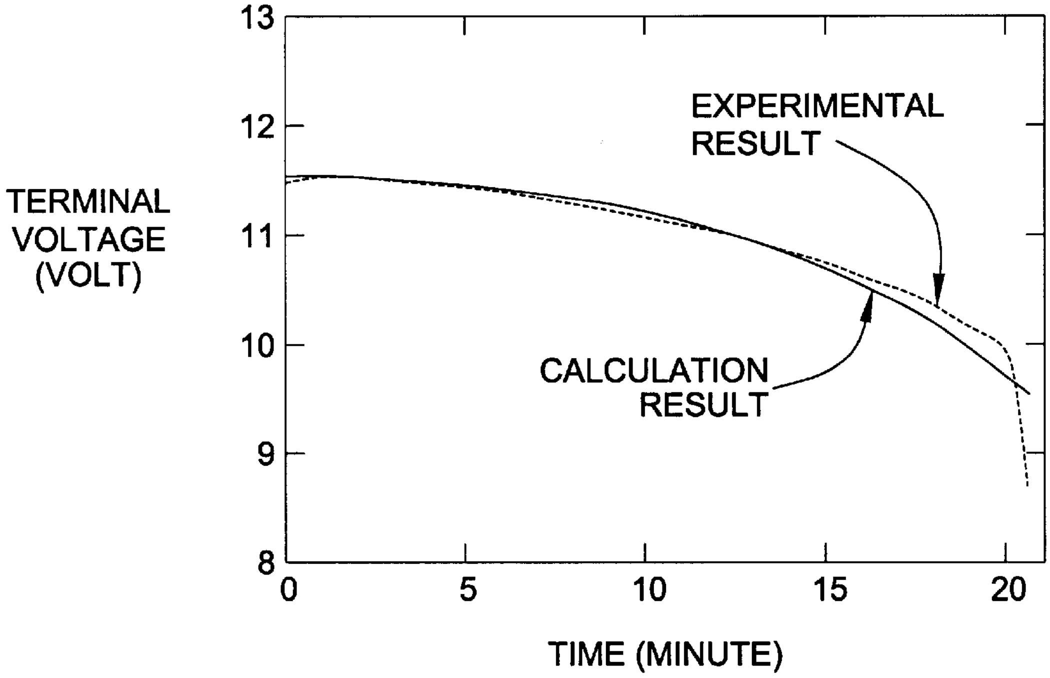
FIG. 24*a* is a relationship diagram between time, experimental discharge voltages and calculated discharge voltages based on means of embodiment 10.
Figure 24B:
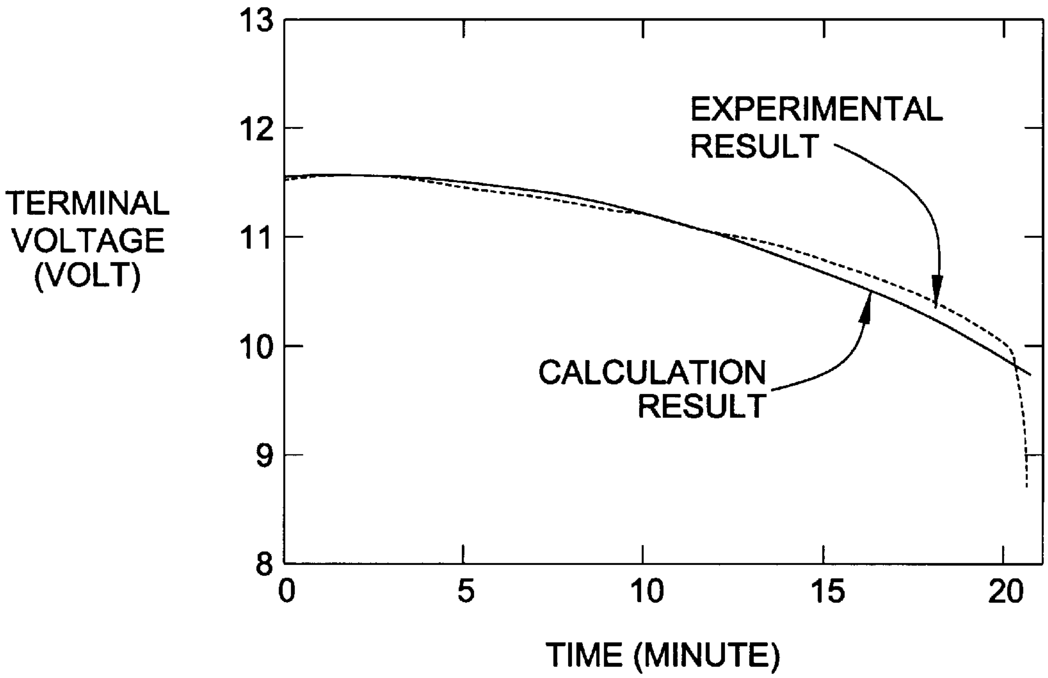
FIG. 24*b* is a relationship diagram between time, experimental discharge voltages and calculated discharge voltages based on comparison example 4.
Figure 25A:
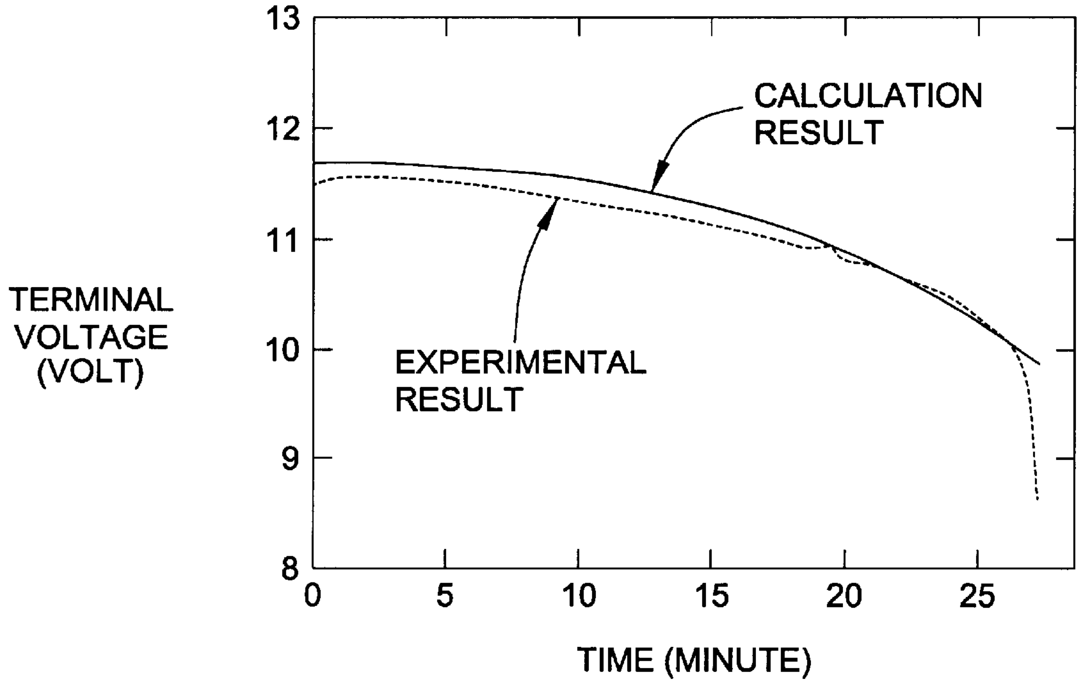
FIG. 25*a* is a relationship diagram between time, experimental discharge voltages, and calculated discharge voltages based on embodiment 10.
Figure 25B:
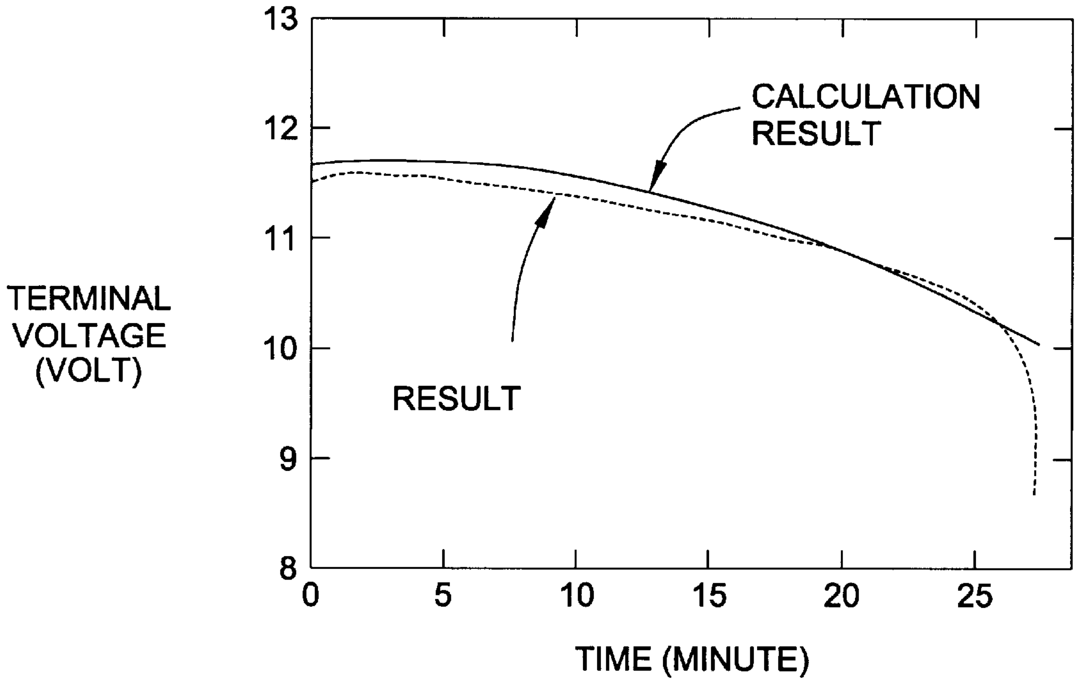
FIG. 25*b* is a relationship diagram between time, experimental discharge voltages and calculated discharge voltages based on means of comparison example 4.
Figure 26A:
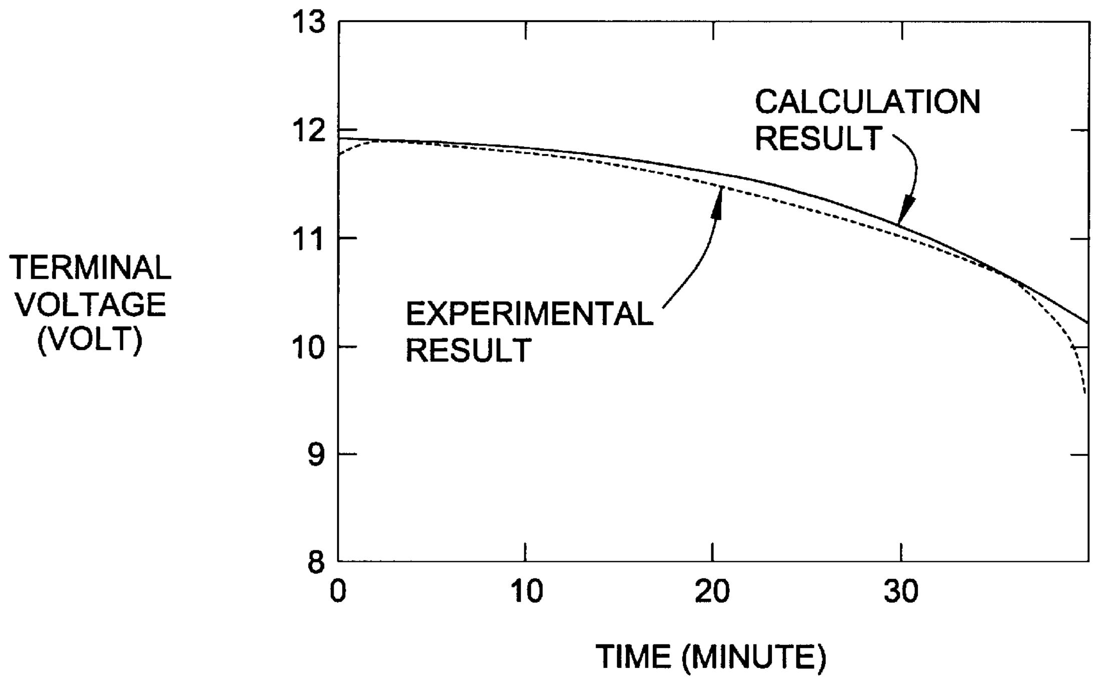
FIG. 26*a* is a relationship diagram between time, experimental discharge voltages, and calculated discharge voltages based on embodiment 10.
Figure 26B:
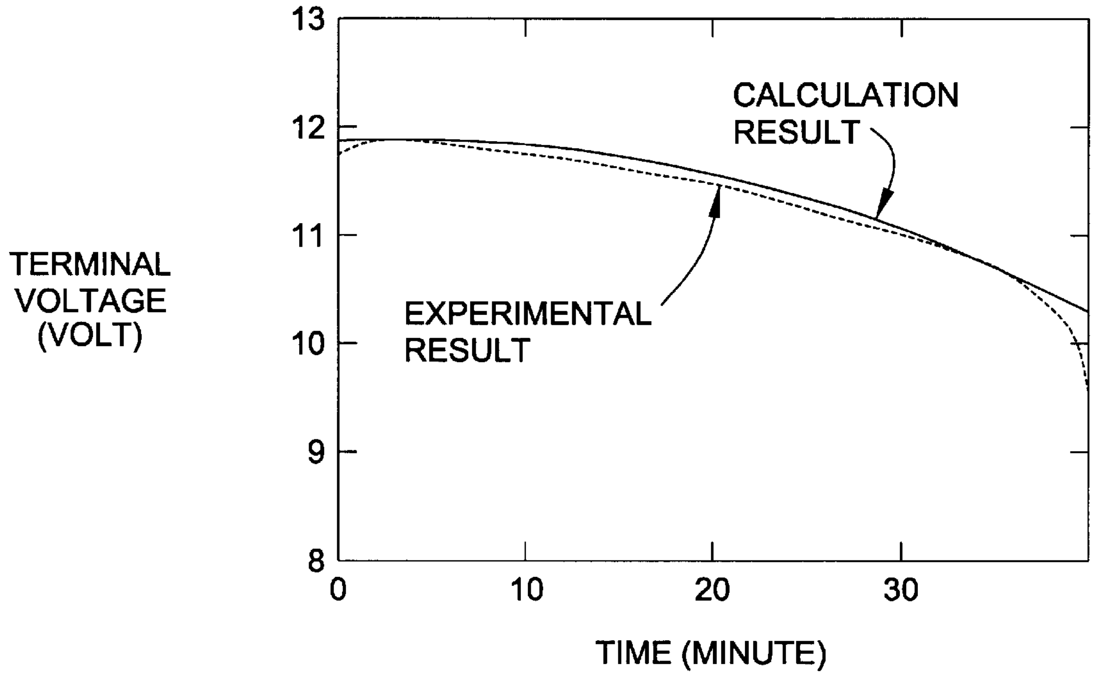
FIG. 26*b* is a relationship diagram between time, experimental discharge voltages and calculated discharge voltages based on comparison example 4.
Figure 27A:
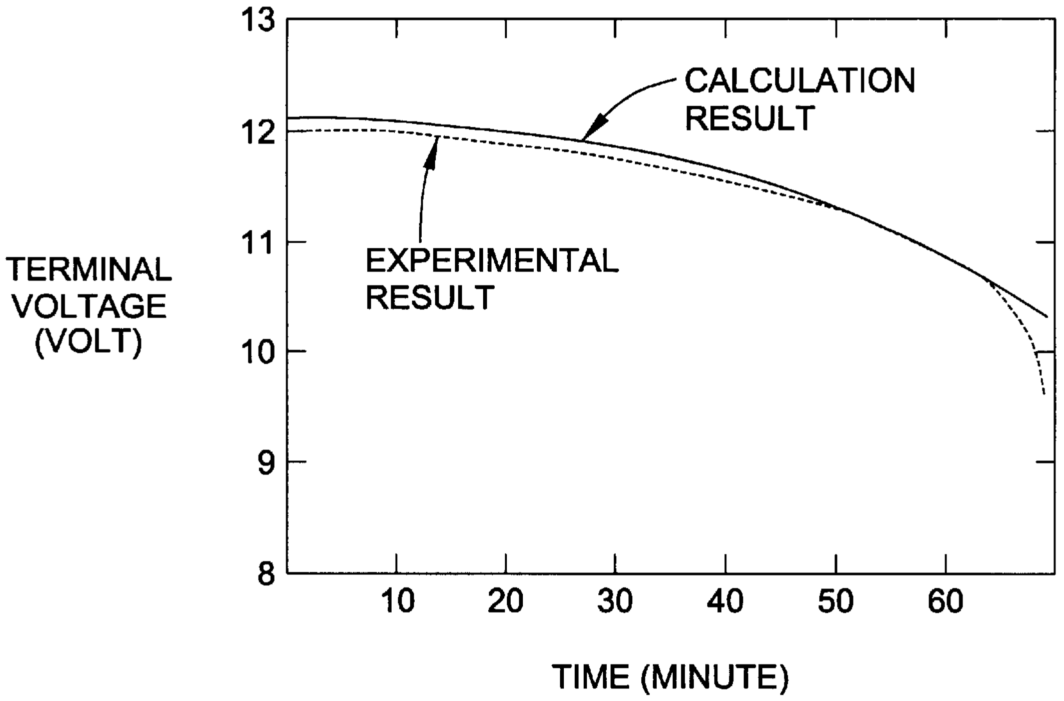
FIG. 27*a* is a relationship diagram between time, experimental discharge voltages and calculated discharge voltages based on embodiment 10.
Figure 27B:
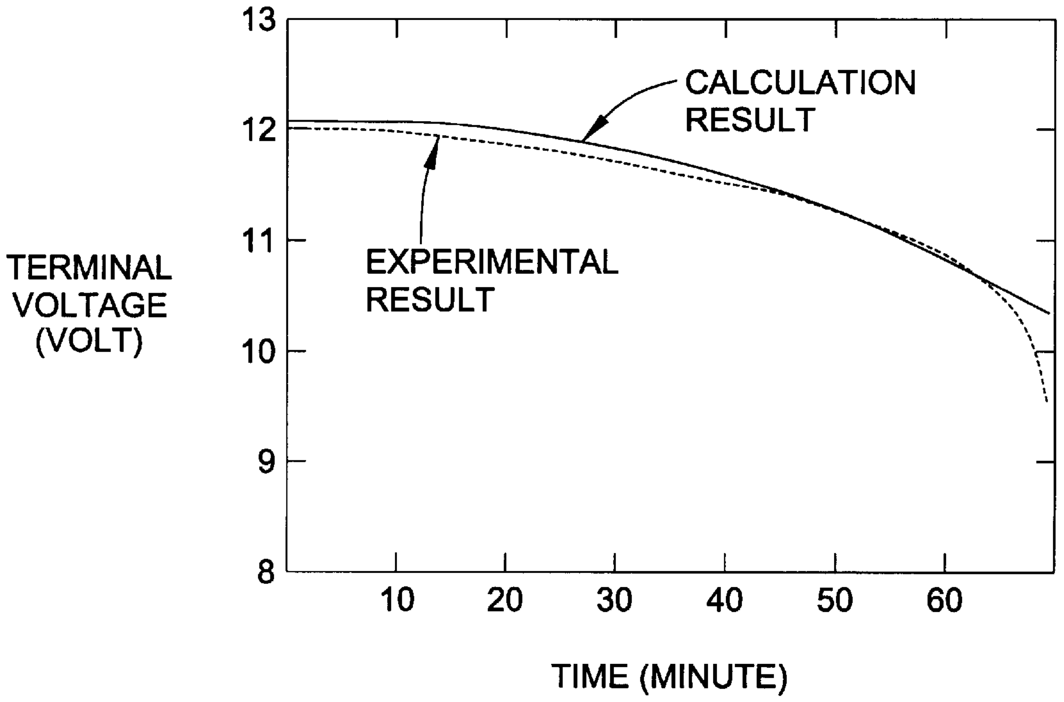
FIG. 27*b* is a relationship diagram between time, experimental discharge voltages and calculated discharge voltages based on means of comparison example 4.
Figure 28A:
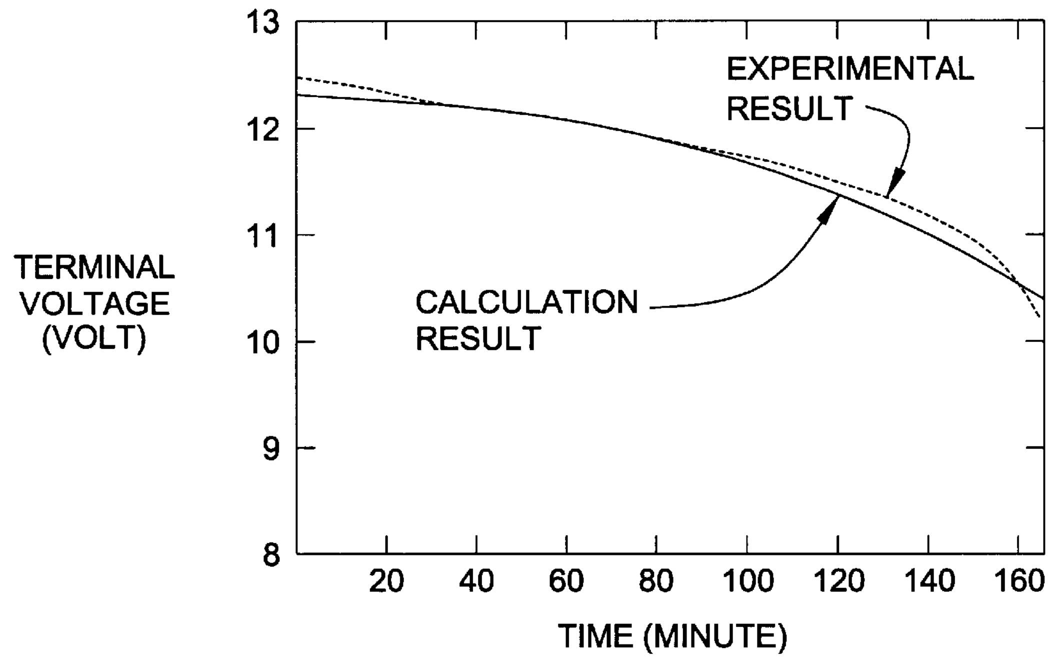
FIG. 28*a* is a relationship diagram between time, experimental discharge voltages and calculated discharge voltages based on embodiment 10.
Figure 28B:
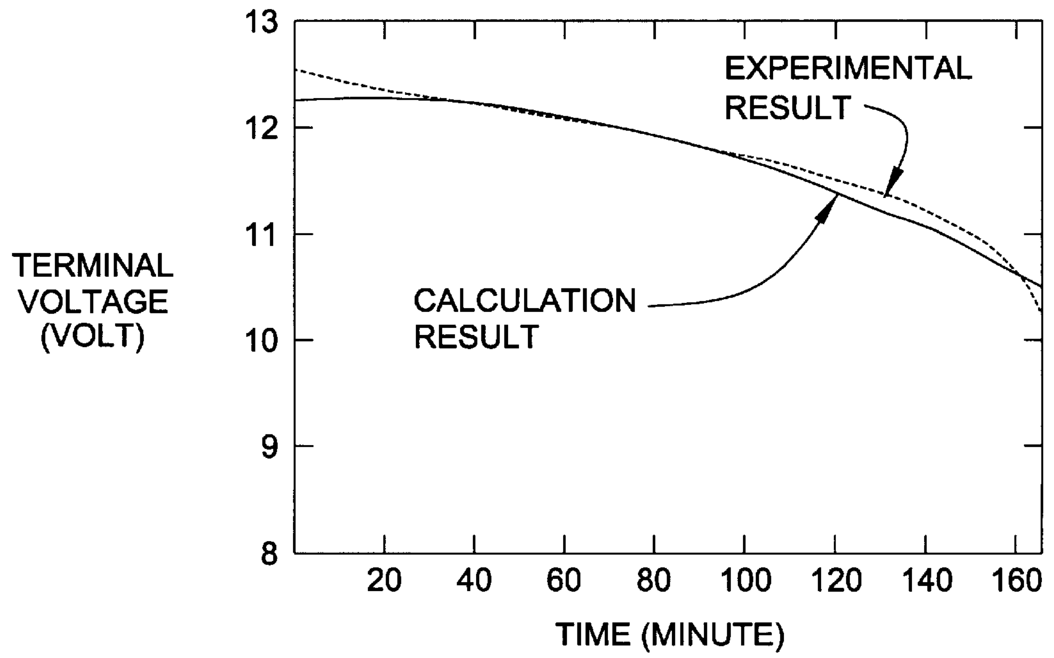
FIG. 28*b* is a relationship diagram between time, experimental discharge voltages and calculated discharge voltages based on comparison example 4.
Figure 29A:
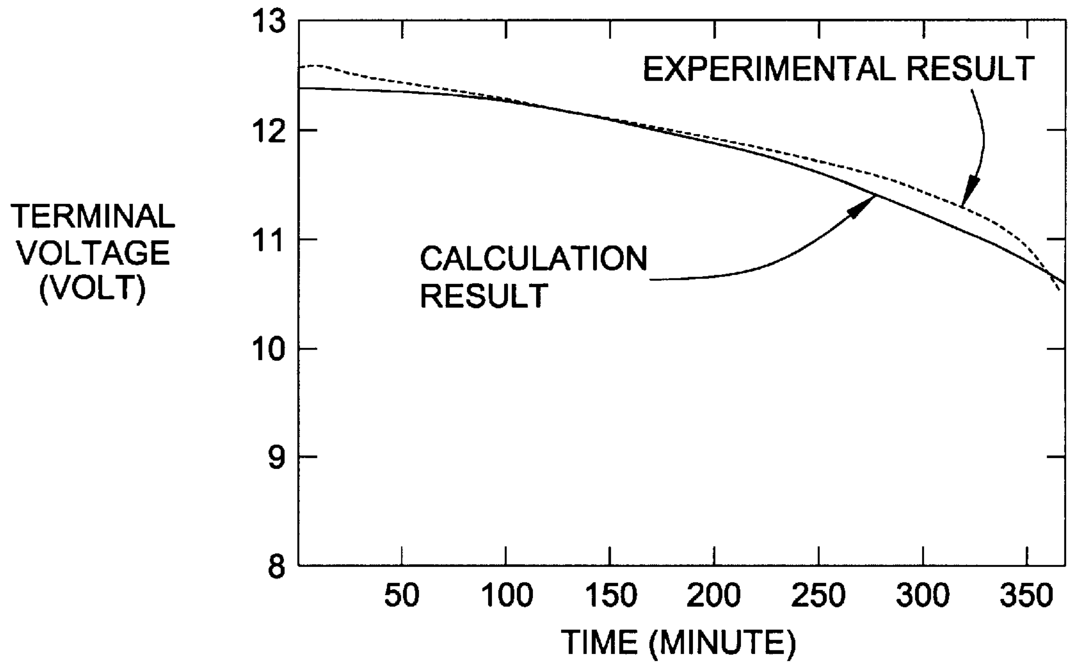
FIG. 29*a* is a relationship diagram between time, experimental discharge voltages and calculated discharge voltages based on embodiment 10.
Figure 29B:
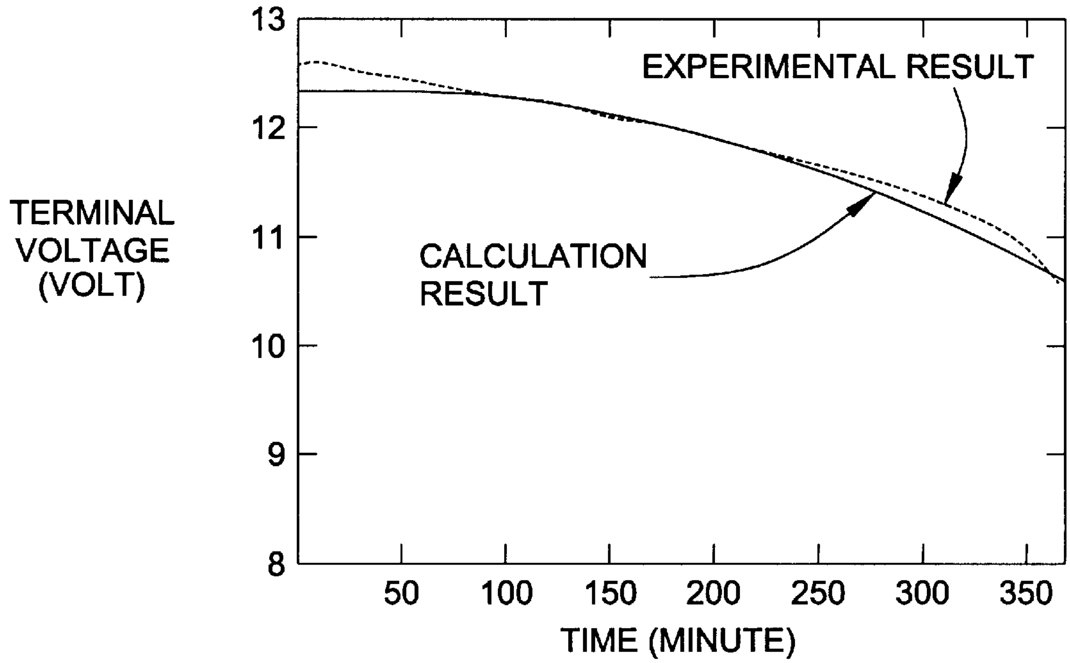
FIG. 29*b* is a relationship diagram between time, experimental discharge voltages and calculated discharge voltages based on comparison example 4.

For the above conditions, the optimum values of A, B, C and R were 12.51 V, 0.405 V, 1.43 V, and 0.01962 ohms, respectively. Using these optimum values, the terminal voltages were calculated for the time intervals noted above in the ninth embodiment for the nine constant current discharges. A relationship between the calculated and experimental terminal voltages and time for the 80 A discharge is shown in FIG. 21(*a*). Similarly, a plot showing the same results for the 70 A discharge is shown in FIG. 22(*a*). A plot showing the same results for the 60 A discharge is shown in FIG. 23(*a*). A plot showing the same results for the 50 A discharge is shown in FIG. 24(*a*). A plot showing the same results for the 40 A discharge is shown in FIG. 25(*a*). A plot showing the same results for the 30 A discharge is shown in FIG. 26(*a*). A plot showing the same results for the 20 A discharge is shown in FIG. 27(*a*). A plot showing the same results for the 10 A discharge is shown in FIG. 28(*a*). A plot showing the same results for the 5 A discharge is shown in FIG. 29(*a*). As can be seen from these figures the calculated terminal voltages and the experimental terminal voltages substantially coincide with each other.

Thus, when using the function $f(I,S)=(S\times I/I_0)^Y/TANH\{(S\times I/I_0)^Y\}$, and the selected values of $S_{ZONE1}$ and $S_{ZONE2}$ equation (28) is a useful equation for estimating the battery terminal voltage as a function of I and S. Because equation (28) is a simple rearrangement of equation (2), it follows that equation (2) is a useful equation for estimating the battery discharge current I as a function of V and S.

In this fourth comparison example, a comparison is made between an actually measured discharge curve and a calculated discharge curve by employing the following function f(I) used in the first comparison example, but not employing the function f(I, S) of the equation (3) of the present invention as in the ninth embodiment:

$$f(I)=(I/I_0)^Y/TANH[(I/I_0)^Y] \quad (30)$$

Using a spreadsheet program on a personal computer and the general means as described above in the ninth embodiment, the equation (28) was again fit to the 12 V 30 Ah lead acid battery constant current discharge data. For the purpose of comparison with the embodiment 10, $S_{ZONE1}$, and $S_{ZONE2}$ are again fixed arbitrarily as 0. As shown above in the first comparison example, this function, using the optimum values of $I_0$=6.50 A, Y=0.406, and M=39.14 Ah, gives substantial agreement between calculated battery capacities and experimental capacities for constant current discharges. The function $f(I, S)=(I/I_0)^Y/\mathrm{TANH}\{(I/I_0)^Y\}$ did not represent, however, the second general characteristic of batteries that belongs to the major group.

The general means as described in the ninth embodiment was employed to obtain optimum values of A, B, C, R. These values were 12.41 V, −0.378 V, 2.09 V and 0.01810 ohms, respectively. Using these optimum values, the terminal voltages were calculated for the time intervals noted above in the ninth embodiment for the nine constant current discharges. A plot showing the calculated and experimental terminal voltages vs. time for the 80 A discharge is shown in FIG. 21(*b*). A plot showing the same results for the 70 A discharge is shown in FIG. 22(*b*). A plot showing the same results for the 60 A discharge is shown in FIG. 23(*b*). A plot showing the same results for the 50 A discharge is shown in FIG. 24(*b*). A plot showing the same results for the 40 A discharge is shown in FIG. 25(*b*). A plot showing the same results for the 20 A discharge is shown in FIG. 27(*b*). A plot showing the same results for the 10 A discharge is shown in FIG. 28(*b*). A plot showing the same results for the 5 A discharge is shown in FIG. 29(*b*).

As can be seen from these figures, the calculated terminal voltages and the experimental terminal voltages substantially coincide with each other. In this case, the coincidence degree between calculated terminal voltages and experimental terminal voltages is slightly lower than that obtained in this tenth embodiment.

As was noted previously in the third comparison example, to establish coincidence between calculated terminal voltages and experimental voltages using equation (28) and selected values of $S_{ZONE1}$ and $S_{ZONE2}$, it is not absolutely necessary to use S values calculated using a function f(I, S). The function f(I, S) increases monotonically as S increases from 0 to 1, is equal to 1 when S=0 regardless of the value of I, is equal to or nearly equal to 1 when S=0 regardless of the value of I, is equal to or nearly equal to 1 when S=1 for small values of I and is equal to or nearly equal to $(I \div I_0)^Y$ when S=1 for large values of I. As was shown in the first and second comparisons, however, the results do not represent the second general characteristic of batteries, which belongs to the major group, when using a function such as $f(I)=(I/I_0)^Y/\mathrm{TANH}\{(I/I_0)^Y\}$, which does not fall within the scope of the claims of this invention.

From this comparison example, as well as the third comparison example, it can be seen that equation (28) is a useful equation for estimating the battery terminal voltage as a function of I and S, but that the equation is not very sensitive to the value of S. Since equation (28) is a simple rearrangement of equation (2), it follows that equation (2) is a useful equation for estimating the battery discharge current I as a function of V and S. As for equation (28), it follows that equation (2) is not very sensitive to the value of S.

In the following examples, the application of the present invention to actual battery discharges obtained from an electric scooter operated on public roads is shown. Of course, the general concepts of the present invention, as elaborated in the above embodiments, are included in these examples.

Figure 3:
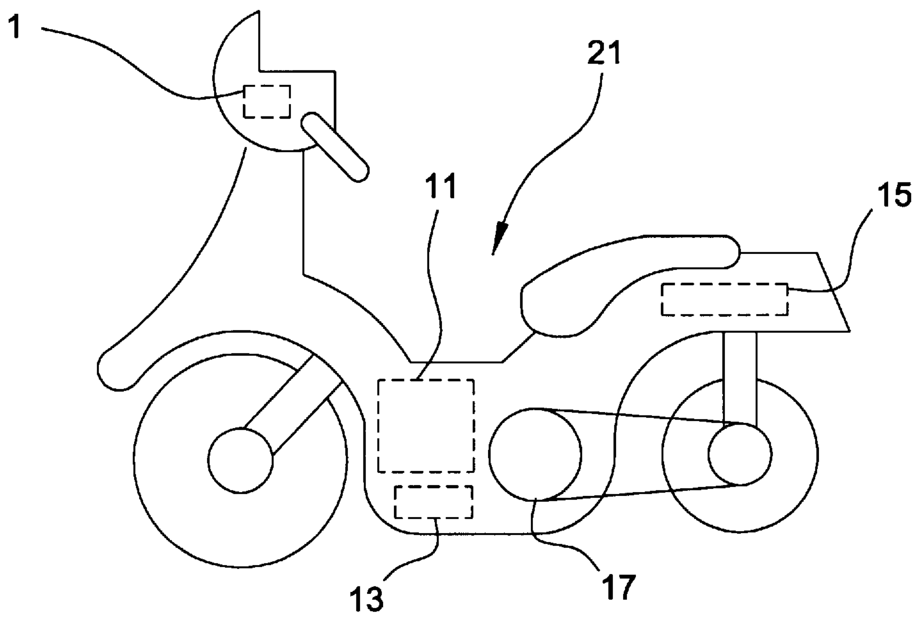
FIG. 3 is a schematic diagram of an electric scooter mounted with this embodiment.

The electric scooter 21 used in experiments with the battery capacity meter 1 of the present invention is shown schematically in FIG. 3. The components that are relevant to the present invention are highlighted: the battery capacity meter 1; the battery 11; the battery charger 13; the motor controller 15; and the electric motor 17. As the battery for the electric scooter, four 12 V 30 Ah sealed lead acid batteries connected in series were employed. These batteries are of the same type as used in the embodiments 1–5 and the embodiments 9 and 10, respectively.

Figure 1:
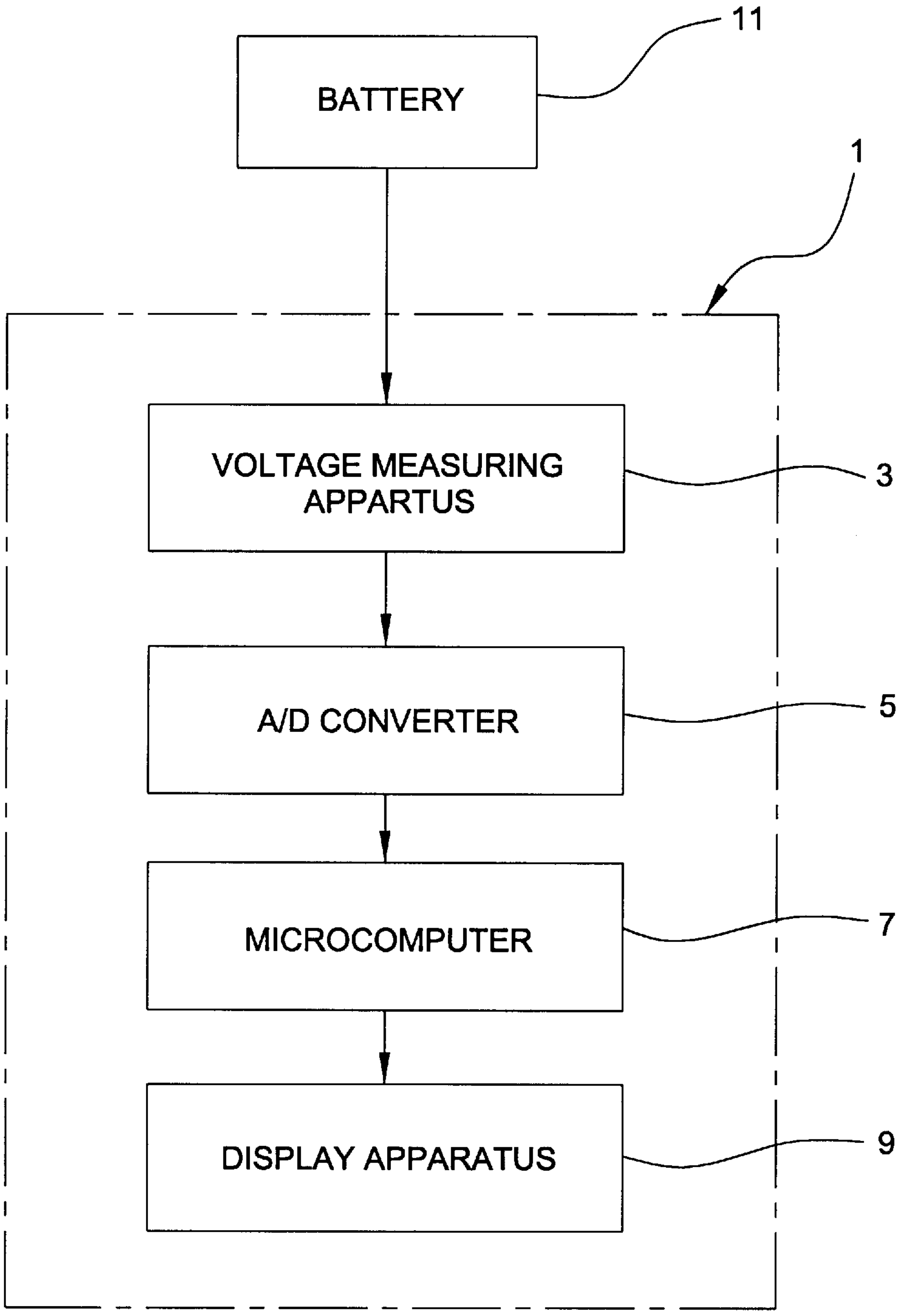
FIG. 1 is a schematic diagram for showing an overall circuit arrangement of a battery capacity meter according to an embodiment of the present invention.

One concrete example of an apparatus for determining the remaining capacity of the battery in the electric scooter is shown in FIG. 1. This battery capacity meter 1 is comprised of the following components: a voltage measuring apparatus 3, an analog-to-digital converter (A/D converter) 5, a microcomputer 7, and a display device 9. The voltage measuring apparatus is connected to the terminals of the battery 11. The microcomputer 7, which contains ROM and RAM, executes the steps of the programs for calculating either the remaining capacity or the fuel-gauge normalized remaining capacity of the battery. Program steps, and/or data values, and data tables are stored in ROM. The output value from the microcomputer 7, which is used as the input value for the display device 9, is either 1) directly proportional to the remaining capacity of a battery, expressed as a percentage of the total capacity of the battery, or 2) directly proportional to the fuel-gauge normalized remaining capacity of the battery, expressed as a percentage of the full scale of a fuel gauge.

Figure 4:
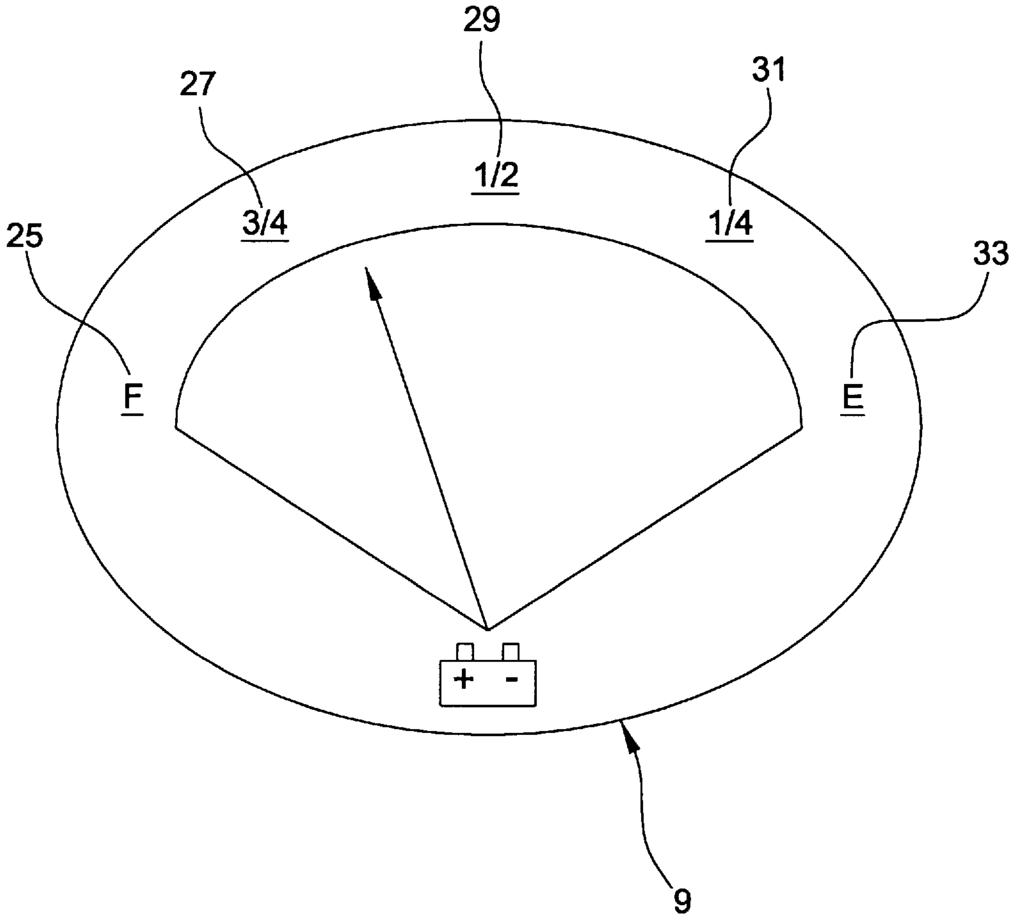
FIG. 4 is a front view for showing an outer view of a display apparatus according to this embodiment.

One concrete example of a display device 9 of the present invention is shown in FIG. 4. This is a needle-type fuel gauge with the full position (F) 25 being equal to a value of 100%, the three-quarter position 27 being equal to 75%, the one-half position 29 being equal to 50%, the one-quarter positional 31 being equal to 25%, and the empty position (E) 33 being equal to 0%.

Figure 2:
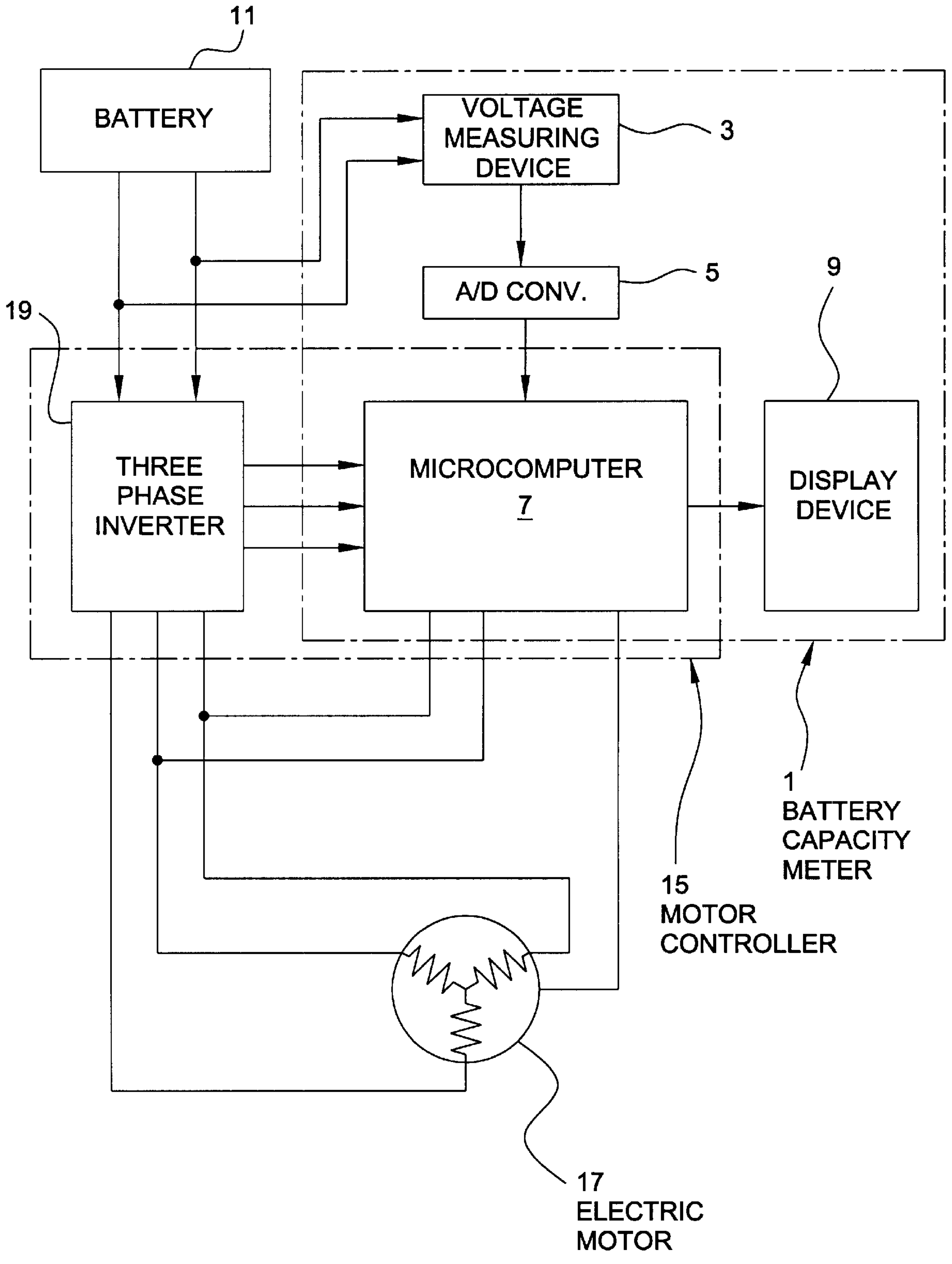
FIG. 2 is a schematic diagram for representing an overall circuit arrangement of a battery capacity meter (commonly using a microcomputer of a motor controller) according to this embodiment.

Another concrete example of an apparatus for determining the remaining capacity of the battery in the electric scooter is shown in FIG. 2. In this figure, the motor controller 15 and electric motor 17 components of the EV are also included. The battery capacity meter 1 is comprised of the following components: a voltage measuring device 3, an analog-to-digital converter (A/D converter) 5, a microcomputer 7 and a display device 9. The voltage measuring device 3 is connected to the two terminals of the battery 11. The microcomputer 7, which contains ROM and RAM, is used primarily to control the power being supplied to the electric motor 17. In this particular embodiment, the microcomputer 7 controls a three-phase inverter 19 with current sensing feedback and rotor-position sensing feedback. The microcomputer 7 is used secondarily to execute the steps of the programs for calculating either the remaining capacity or the fuel-gauge normalized remaining capacity of the battery. Program steps, and/or data values, and data tables are stored in ROM. The output value from the microcomputer 7, which is used as the input value for the display device 9, is either 1) directly proportional to the remaining capacity of a battery, expressed as a percentage of the total capacity of the battery or 2) directly proportional to the fuel gauge normalized remaining capacity of the battery, expressed as a percentage of the full scale of a fuel gauge.

Figure 5:
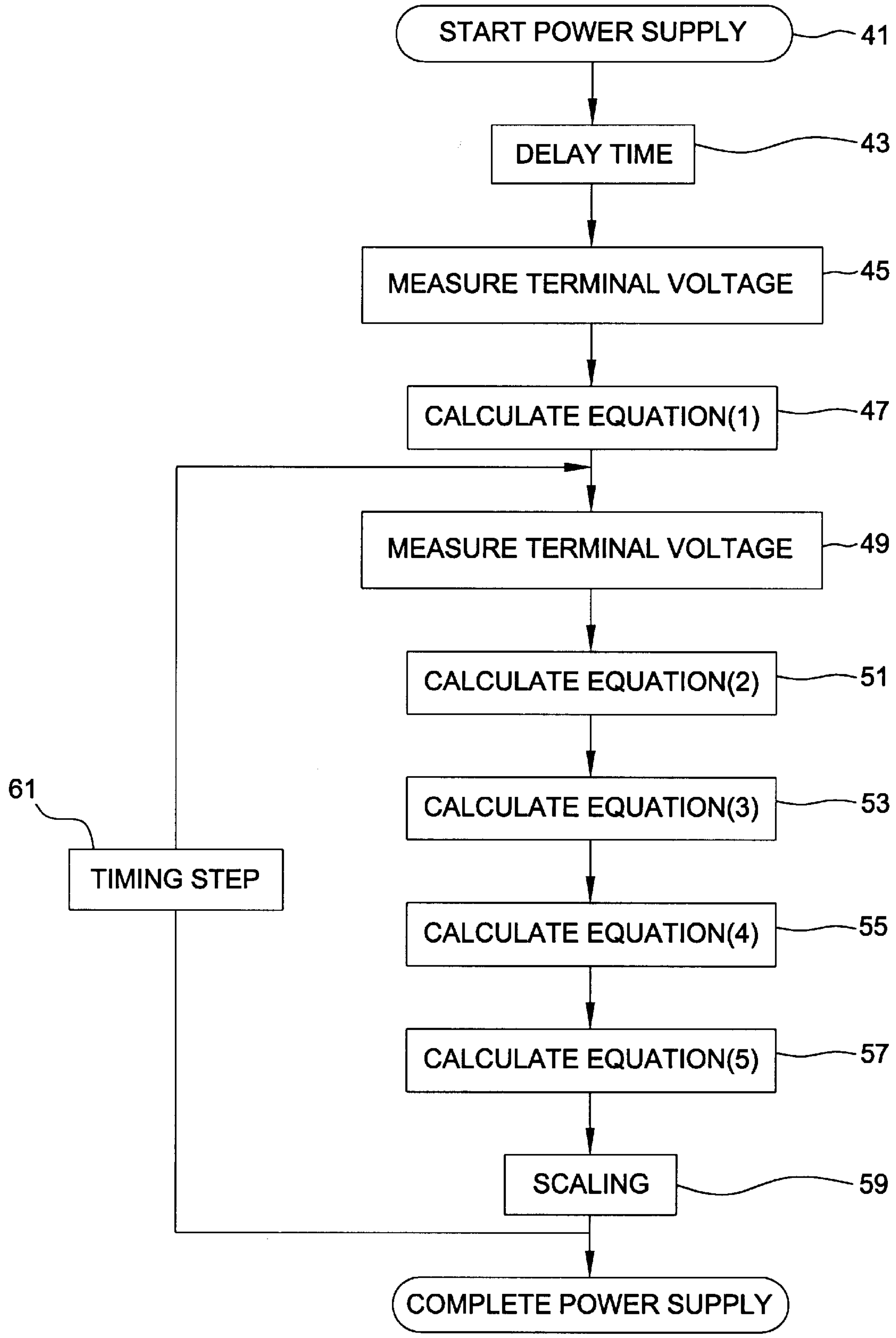
FIG. 5 is a flow chart for representing a process step of an embodiment of the present invention.

The program steps that are executed by the microcomputer in implementing embodiments 1–10 of the present invention are shown in the form of a flowchart in FIG. 5. In the initial step, power is supplied to the EV and the battery capacity meter, as shown in Block 41. A short time period is allowed (delay) to elapse after power has been supplied as shown in Block 43. The length of the short time period is such that a stable initial terminal voltage value (free from voltage surges such as noise) can be measured. After the short time period has elapsed, the initial terminal voltage $V_0$ is measured as shown in Block 45. In the next step, the initial value $S_0$ of the battery state of charge, is determined by calculating, using equation (1). This value of $S_0$ is stored in RAM. The calculation of the initial value of S is shown in Block 47.

The program then enters a continuous loop, which operates until the power supplied to the EV and the battery remaining meter is discontinued and the program stops running. In the first step of the continuous loop, the terminal voltage Vi is measured as shown in Block 49. Next, the estimated battery discharge current Ii is determined by an equation having the general form of (2) as shown in Block 51. Next, the charge amount $\Delta S_i$ of the state of charge indication value consumed during a time interval Δt is determined by calculating using a equation having the general form of (3) as shown in Block 53. In the next step using equation (4), the value of the charging state S is updated by adding $\Delta S_i$ to the value of Si currently stored in RAM and then storing the new value of $S_{i+1}$ in RAM as shown in Block 55. Next, the remaining capacity of a battery, expressed as a percentage of the total capacity of the battery, is determined by calculating using an equation having the general form of (5). The calculation of the remaining capacity is shown in Block 57. In the last step of the continuous loop, the output value from the microcomputer, which is used as the input value for the display device, is determined such that it is directly proportional to the remaining capacity of a battery, expressed as a percentage of the total capacity of the battery. This scaling step is shown in Block 59. The program then returns to Block 49 after pausing until the time interval Δt since the terminal voltage V for the current pass of the loop was measured has elapsed. This timing step is shown in Block 61.

The program steps that are executed by the microcomputer in implementing the present invention, as explained above, were loaded into the ROM of the microcomputer. For the electric scooter equipped with the battery capacity meter of the present invention, equations, constants, and/or data tables were also stored in ROM. For determining the initial value of the charge state S, the following form of equation was stored:

$$S_0=13-0.25V_0(K_0=13 \text{ and } K_1==0.25 \text{ volt}^{-1}). \quad (31)$$

For determining the estimated discharge current, the following form of equation (2)was stored:

$$I_i=[50-5\cdot(S_i-0.2)-40\cdot(S_i-0.7)^2-V_i]\div 0.09(A=50V, B=5V, C=40V, R=0.09 \text{ ohms}, S_{ZONE1}=0.2, \text{ and } S_{ZONE2}=0.7). \quad (32)$$

With the restrictions on this equation, as the value of $S_i$ increases from 0 to 0.2, $(S_i-S_{ZONE1})$ is unchanged from 0, but as the value of $S_i$ increases from 0.2 to 1, $(S_i-S_{ZONE1})$ increases linearly from 0 to 0.8. In the same way, as the value of $S_i$ increases from 0 to 0.7, $(S_i-S_{ZONE2})$ is unchanged from 0, but as the value of $S_i$ increases from 0.7 to 1, $(S_i-S_{ZONE2})$ increases linearly from 0 to 0.3. For determining the estimated discharge current, the following form of equation (3) was used:

$$\Delta S_i=[I_i\cdot 1\cdot f(I_i, S_i)]\div 140400 \quad (33)$$

where $f(I, S)=(S*I/3)^{0.47}/\text{TANH}\ [(S*I/3)^{0.47}]$ (Δt=1 sec, M=39 Ah·3600 sec/hr, $I_0$=3 A and Y=0.47 in equation (3)).

In the following examples used to explain the method and apparatus of the present invention, to evaluate display conditions on the computer, the terminal voltage data have been acquired at a 1 second intervals and then stored on an IC card when the electric scooter was operated.

The same scooter was used for examples 1–9. The data for each of the runs for these examples were collected sequentially on different days. A different but identical model scooter was used for the examples 10 and 11. The data for each of the runs in these embodiments were collected on two different days. Drivers and driving styles were varied during runs and from run to run. Tests runs were conducted with the electric scooter headlight both on and off. In all cases, the battery was in the full condition before being driven.

The driving course for examples 1–6 and 9 was two complete circuits around a lake on public roads. The course was relatively flat and had relatively few stop lights. In subsequent references to this course it will be referred to as the lake course. The driving course for the examples 7 and 8 was three complete circuits up and down a steep hill on public roads. The course had relatively few stop lights. In subsequent references to this course it will be referred to as the hill course. The driving course for the examples 10 and 11 was in a metropolitan area on public roads. The course had a substantial number of stoplights. In subsequent references to this course it will be referred to as the city course.

Figure 30:
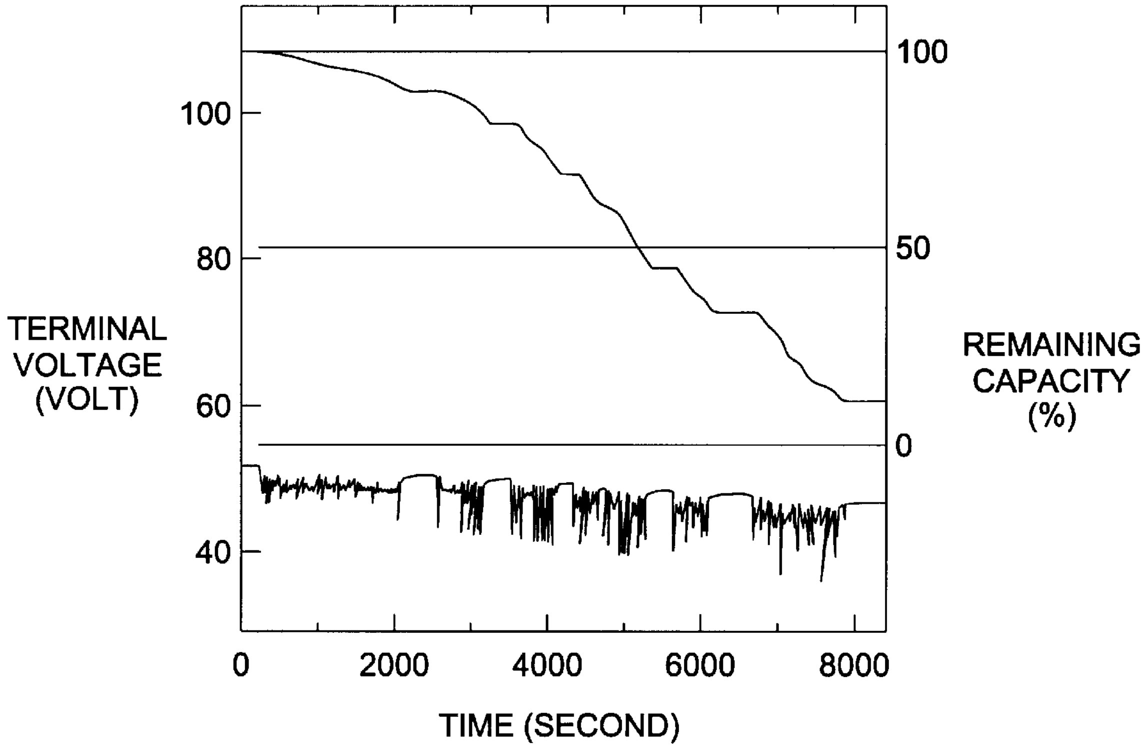
FIG. 30 is a graphic representation for showing a relationship (left vertical axis) between drive time and terminal voltages, and also for indicating a relationship (right vertical axis) between drive time and remaining capacity % in example 1.

In example 1, the scooter running with the headlights off completed two circuits of the lake course. At this time, the power source was not interrupted. (This scooter will, cut off power when the motor controller makes power demands on the battery such that the 28 V minimum voltage level of the motor controller cannot be met for the level of current required). In FIG. 30, the terminal voltage vs. time in seconds is shown in the lower part of the figure. The terminal voltage axis is the left vertical axis. Also in FIG. 30, the decrease in the remaining capacity vs. time in seconds, expressed as a percentage of the total capacity of the battery (remaining capacity %), is shown in the upper part of the figure. A scale of the remaining capacity % is the right vertical axis. Also, in the following examples two through twelve, the remaining capacity is calculated based on the drive data is represented in a similar manner.

As can be seen from FIG. 30, about 15% of battery capacity remains at the completion of the run. This is consistent with the fact that the power was not cut off. The decrease in the remaining capacity % is smooth with the rate of decrease, increasing gradually in the latter half of the discharge. This behavior is expected for an actual representation of the amount of electrical energy remaining in the battery. Fuel gauge normalization is needed to make the decrease nearly linear with respect to the distance covered by the EV traveling at a steady rate of speed. A similar effect is observed in the below-mentioned examples 2–11.

Figure 31:
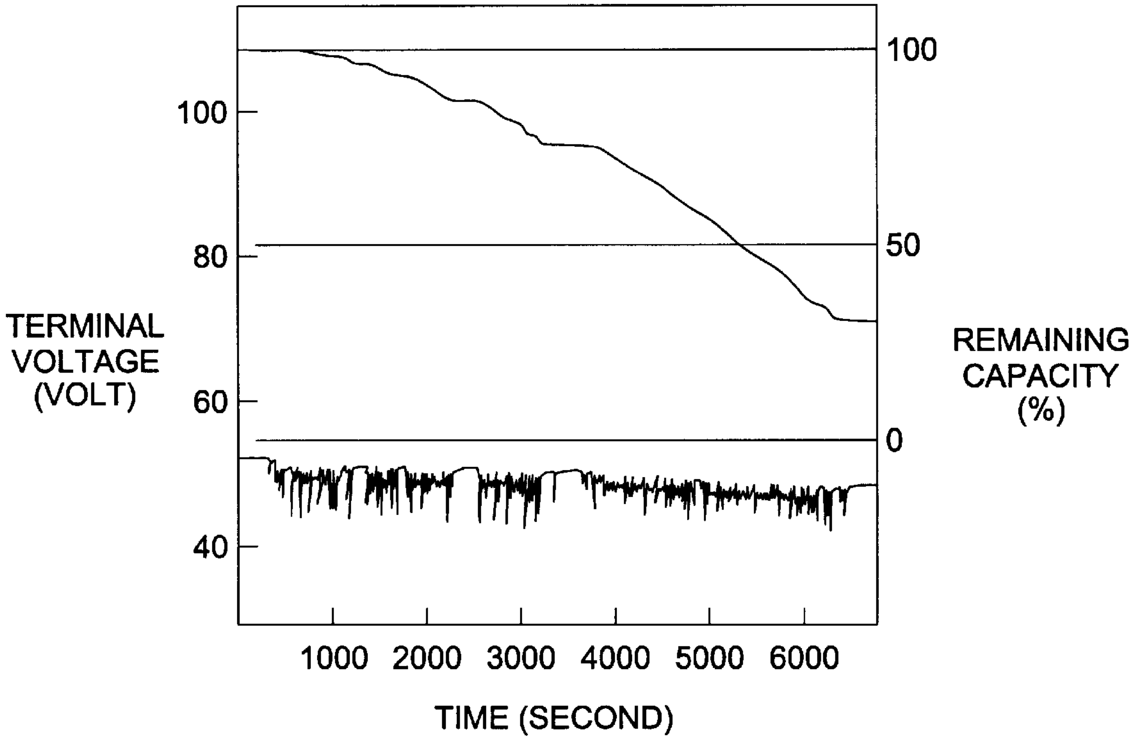
FIG. 31 is a graphic representation for showing a relationship (left vertical axis) between drive time and terminal voltages, and also for indicating a relationship (right vertical axis) between drive time and remaining capacity % in example 2.

In example 2, the scooter running with the headlights off completed two circuits of the lake course. At this time, the power source was not cut off. In FIG. 31, a relationship between the drive time, the terminal voltage and the remaining capacity % is shown for this example.

As can be seen from FIG. 31, about 31% of battery capacity remains at the completion of the run. This is consistent with such a fact that the power was not cut off. The decrease in the remaining capacity % is smooth with the rate of decrease, increasing slightly in the latter half of the discharge. This behavior is expected for an actual representation of the amount of electrical energy that remains in the battery.

Figure 32:
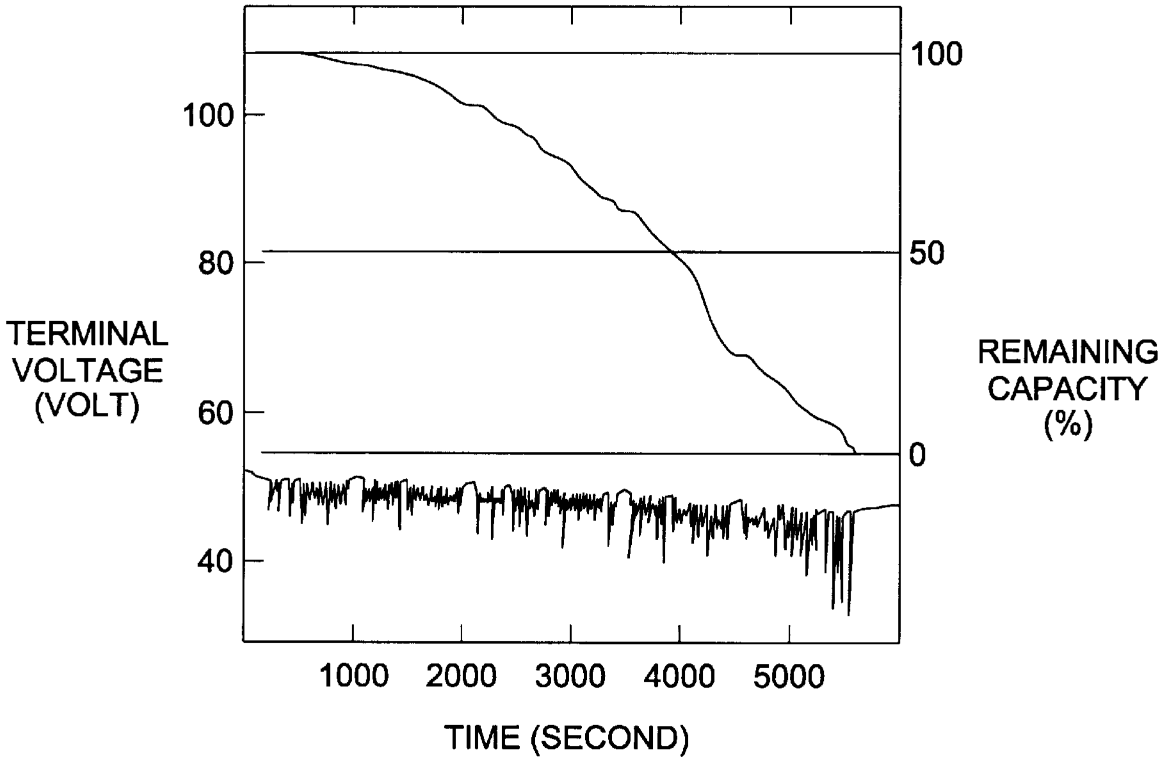
FIG. 32 is a graphic representation for showing a relationship (left vertical axis) between drive time and terminal voltages, and also for indicating a relationship (right vertical axis) between drive time and remaining capacity % in example 3.

In example 3, the scooter running with the headlights on completed two circuits of the lake course. At this time, the power source was not cut off. In FIG. 32, a relationship between the drive time, the terminal voltage and the remaining capacity % is shown for this example.

As can be seen from FIG. 32, less than 1% of battery capacity remains at the completion of the run. This is consistent with the power not being cut off, but very nearly being cut off. The decrease in the remaining capacity % is smooth with the rate of decrease increasing slightly in the latter half of the discharge. This behavior is expected for an actual representation of the amount of electrical energy remaining in the battery.

Figure 33:
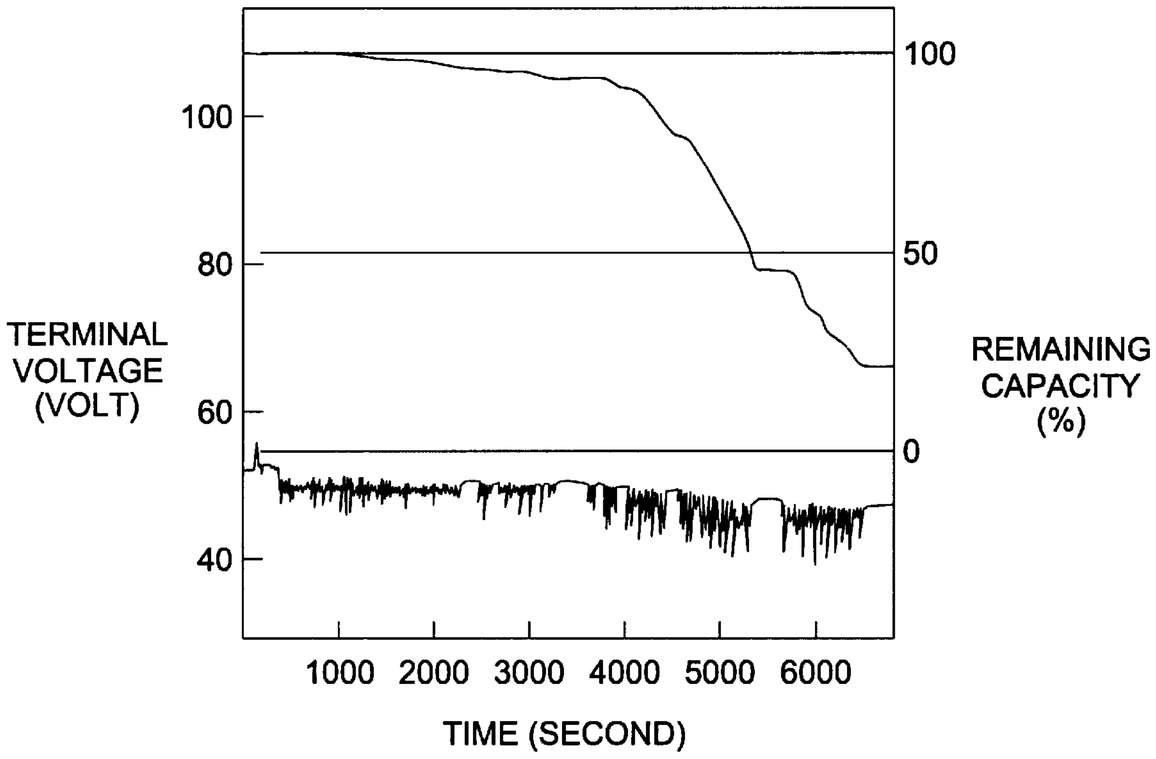
FIG. 33 is a graphic representation for showing a relationship (left vertical axis) between drive time and terminal voltages, and also for indicating a relationship (right vertical axis) between drive time and remaining capacity % in example 4.

In example 4, the scooter running with the headlights on completed two circuits of the lake course without the power being cut off. In FIG. 33, a relationship between the drive time, the terminal voltage and the remaining capacity % is shown for this example.

As can be seen from FIG. 33, about 20% of battery capacity remains at the completion of the run. This is consistent with the power not being cut off. The decrease in the remaining capacity % is smooth with the rate of decrease being significantly higher in the latter half of the discharge. Although this behavior is not unexpected for an actual representation of the amount of electrical energy remaining in the battery, it appears that the driver in the second half of the course made greater power demands on the battery than the driver did in the first half of the course.

Figure 34:
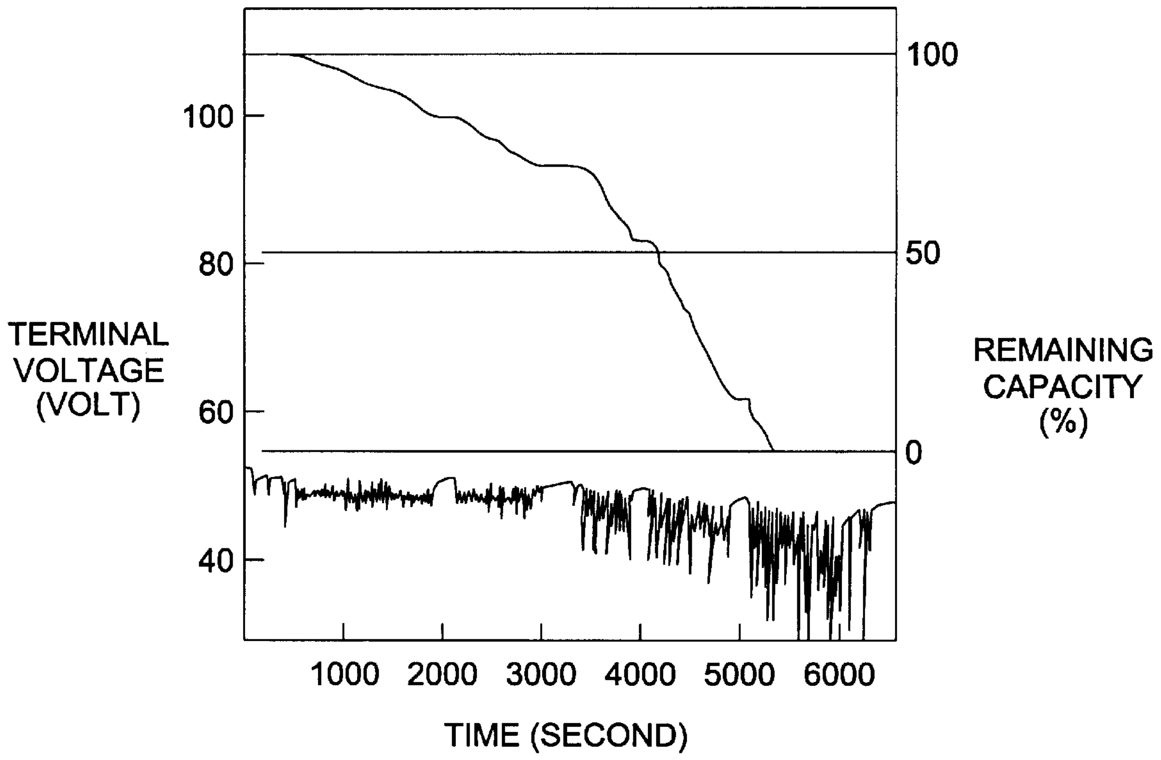
FIG. 34 is a graphic representation for showing a relationship (left vertical axis) between drive time and terminal voltages, and also for indicating a relationship (right vertical axis) between drive time and remaining capacity % in example 5.

In example 5, the scooter running with the headlights off completed two circuits of the lake course. When approximately 5,300 seconds had passed, the power source was cut off. After the power was cut off, the scooter was restarted and driven slowly over the remaining part of the course. In FIG. 34, a relationship between the drive time, the terminal voltage and the remaining capacity % is shown for this example.

As can be seen from FIG. 34, the battery capacity becomes 0% at 5,350 seconds. This is consistent with the power being cut off during the run. The decrease in the remaining capacity % is smooth with the rate of decrease increasing slightly in the latter half of the discharge. This behavior is expected for an actual representation of the amount of electrical energy remaining in the battery.

Figure 35:
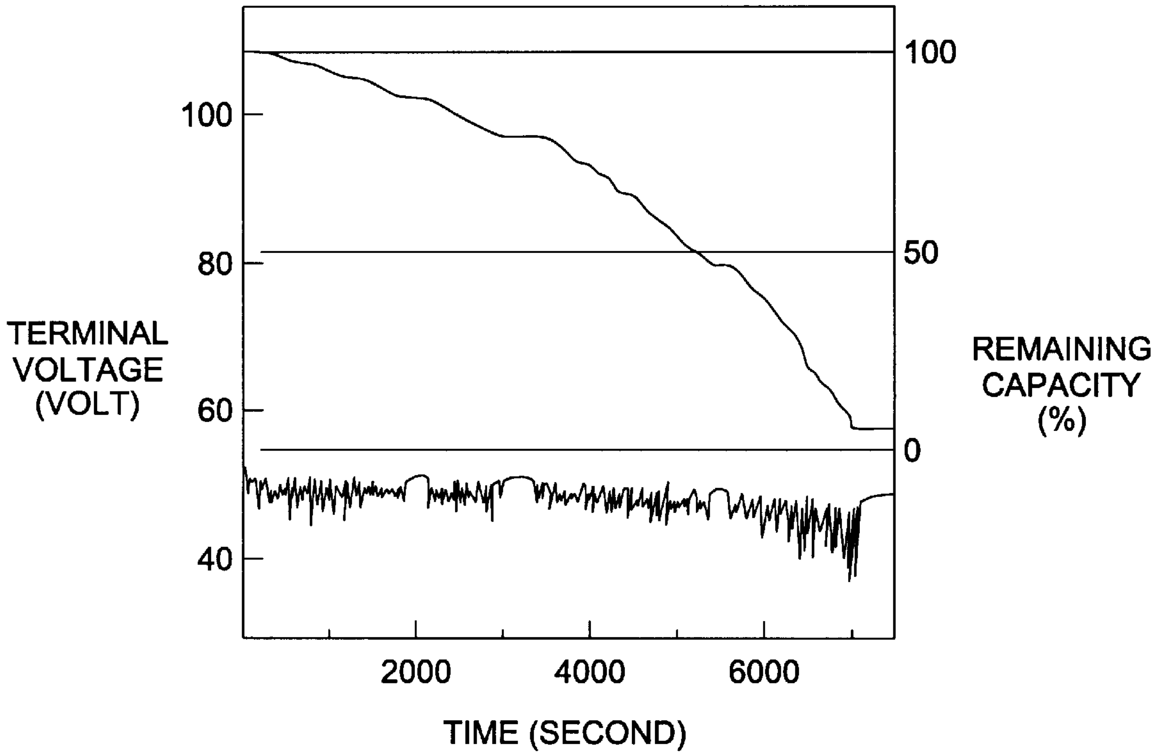
FIG. 35 is a graphic representation for showing a relationship (left vertical axis) between drive time and terminal voltages, and also for indicating a relationship (right vertical axis) between drive time and remaining capacity % in example 6.

In example 6, the scooter running with the headlights off for the first half and on for the second half completed two circuits of the lake course. At this time, the power source was not cut off. In FIG. 35, a relationship between the drive time, the terminal voltage and the remaining capacity % is shown for this example.

As can be seen from FIG. 35, about 5% of battery capacity remains at the completion of the run. This is consistent with the power not being cut off. The decrease in the remaining capacity % is smooth with the rate of decrease increasing slightly in the latter half of the discharge. This behavior is expected for an actual representation of the amount of electrical energy remaining in the battery.

Figure 36:
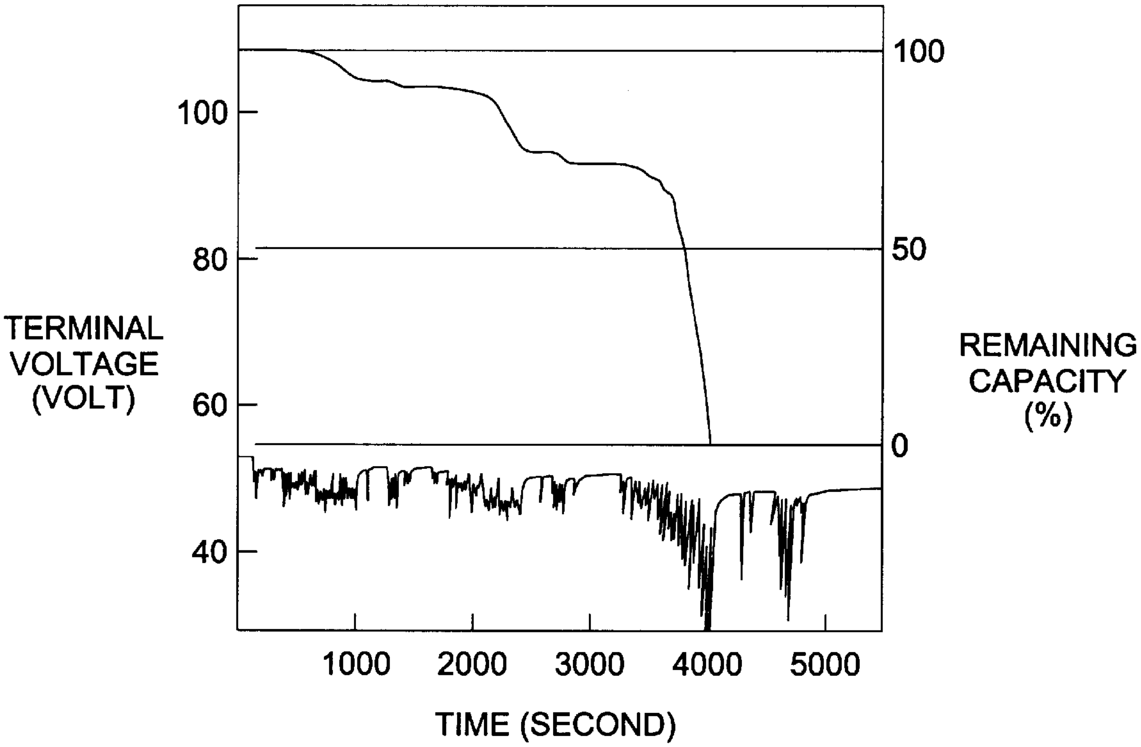
FIG. 36 is a graphic representation for showing a relationship (left vertical axis) between drive time and terminal voltages, and also for indicating a relationship (right vertical axis) between drive time and remaining capacity % in example 7.

In example 7, the scooter running with the headlights off completed three circuits of the slope course. The power source was cut off at about 4000 seconds. After the power was cut off, the scooter was restarted and driven slowly over the remaining part of the slope course, which was mostly downhill. In FIG. 36, a relationship between the drive time, the terminal voltage and the remaining capacity % is shown for this example.

As can be seen from FIG. 36, the battery capacity is 0% at 4000 seconds. This is consistent with the power being cut off during the run. The decrease in the remaining capacity % is smooth with the rate of decrease increasing for each successive circuit of the hill course. Especially for the high power demands of the slope course, this behavior is expected for an actual representation of the amount of electrical energy remaining in the battery.

Figure 37:
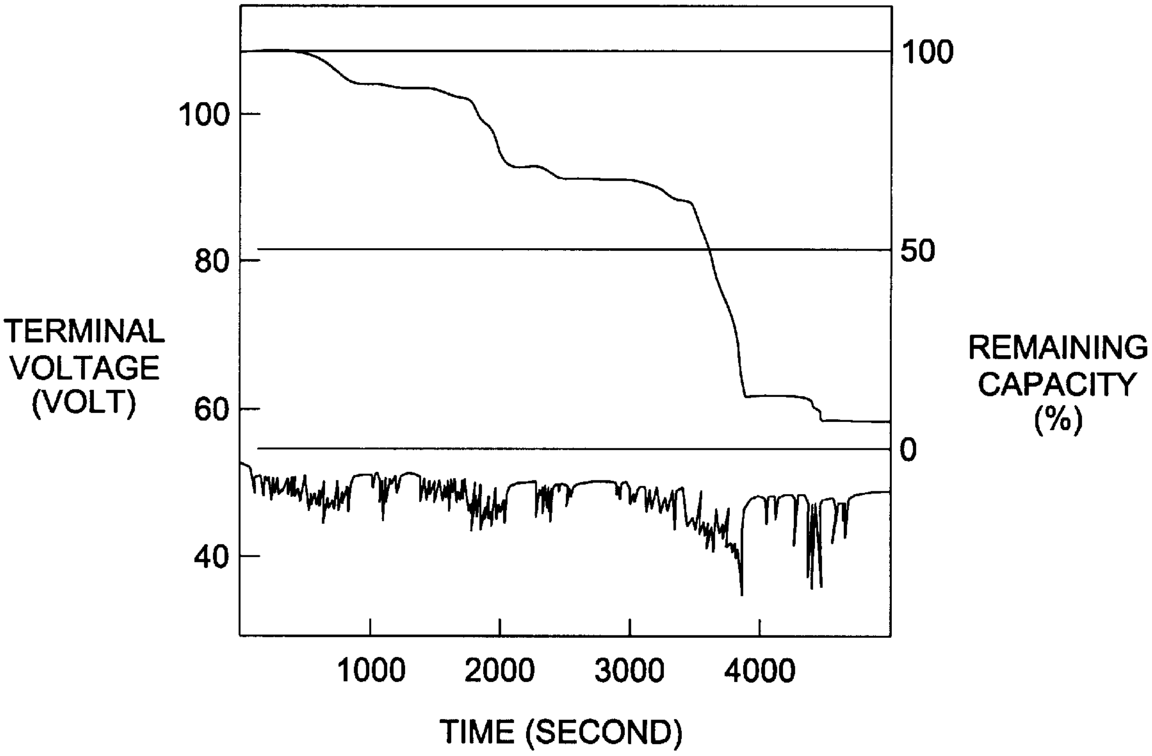
FIG. 37 is a graphic representation for showing a relationship (left vertical axis) between drive time and terminal voltages, and also for indicating a relationship (right vertical axis) between drive time and remaining capacity % in example 8.

In example 8, the scooter running with the headlights on completed three circuits of the slope course. At this time, the power source was not cut off. In FIG. 37, a relationship between the drive time, the terminal voltage and the remaining capacity % is shown for this example.

As can be seen from FIG. 37, about 15% of battery capacity remains at the completion of the run. This is consistent with the power not being cut off. The decrease in the remaining capacity % is smooth with the rate of decrease increasing for each successive circuit of the slope course. Especially for the high power demands of the slope course, this behavior is expected for an actual representation of the amount of electrical energy remains in the battery.

Figure 38:
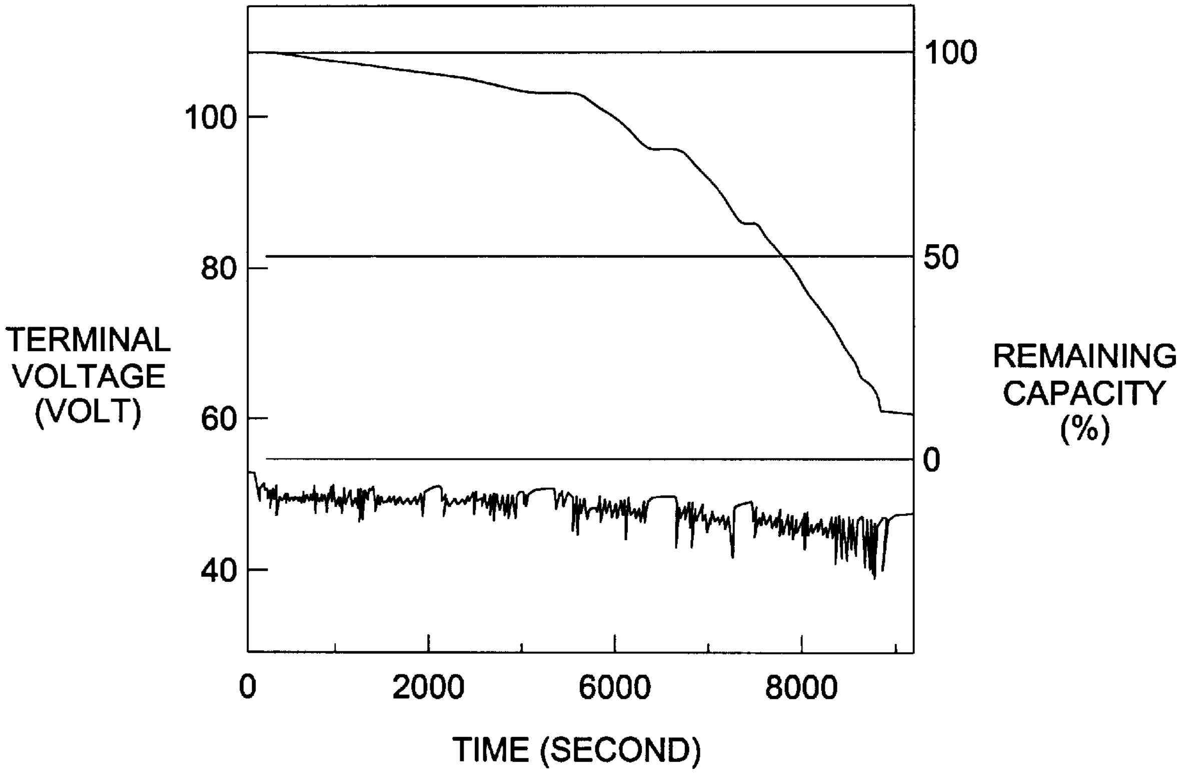
FIG. 38 is a graphic representation for showing a relationship (left vertical axis) between drive time and terminal voltages, and also for indicating a relationship (right vertical axis) between drive time and remaining capacity % in example 9.

In example 9, the scooter running with the headlights off completed two circuits of the lake course. At this time, the power was not cut off. In FIG. 38, a relationship between the drive time, the terminal voltage, and the remaining capacity % is shown for this example.

As can be seen from FIG. 38, about 15% of battery capacity remains at the completion of the run. This is consistent with the power not being cut off. The decrease in the remaining capacity % is smooth with the rate of decrease increasing slightly in the latter half of the discharge. This behavior is expected for an actual representation of the amount of electrical energy remaining in the battery.

Figure 39:
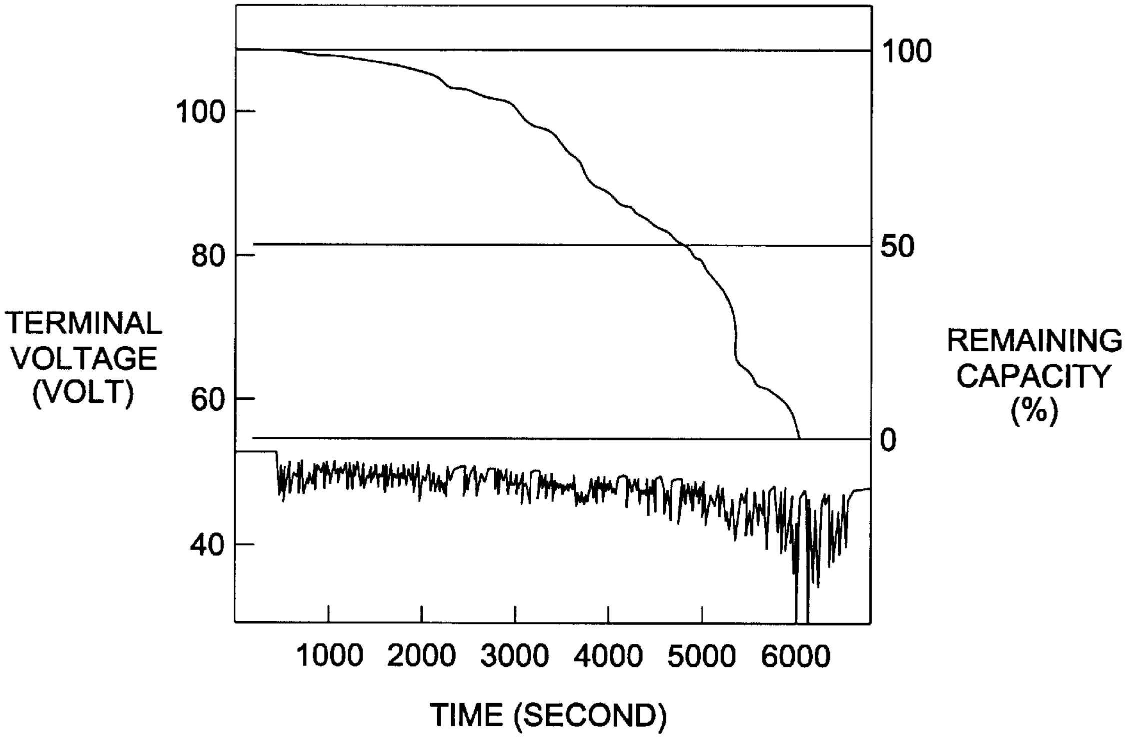
FIG. 39 is a graphic representation for showing a relationship (left vertical axis) between drive time and terminal voltages, and also for indicating a relationship (right vertical axis) between drive time and remaining capacity % in example 10.

In example 10, the scooter running with the headlights on completed the city course. The power was cut off at about 6100 seconds. After the power was cut off, the scooter was restarted and driven slowly over the remaining part of the course. In FIG. 39, a relationship between the time, the terminal voltage and the remaining capacity % is shown for this example.

As can be seen from FIG. 39, the battery capacity becomes 0% at 6100 seconds. This is consistent with the power being cut off during the run. The decrease in the remaining capacity % is smooth with the rate of decrease increasing slightly in the latter half of the discharge. This behavior is expected for an actual representation of the amount of electrical energy remaining in the battery.

Figure 40:
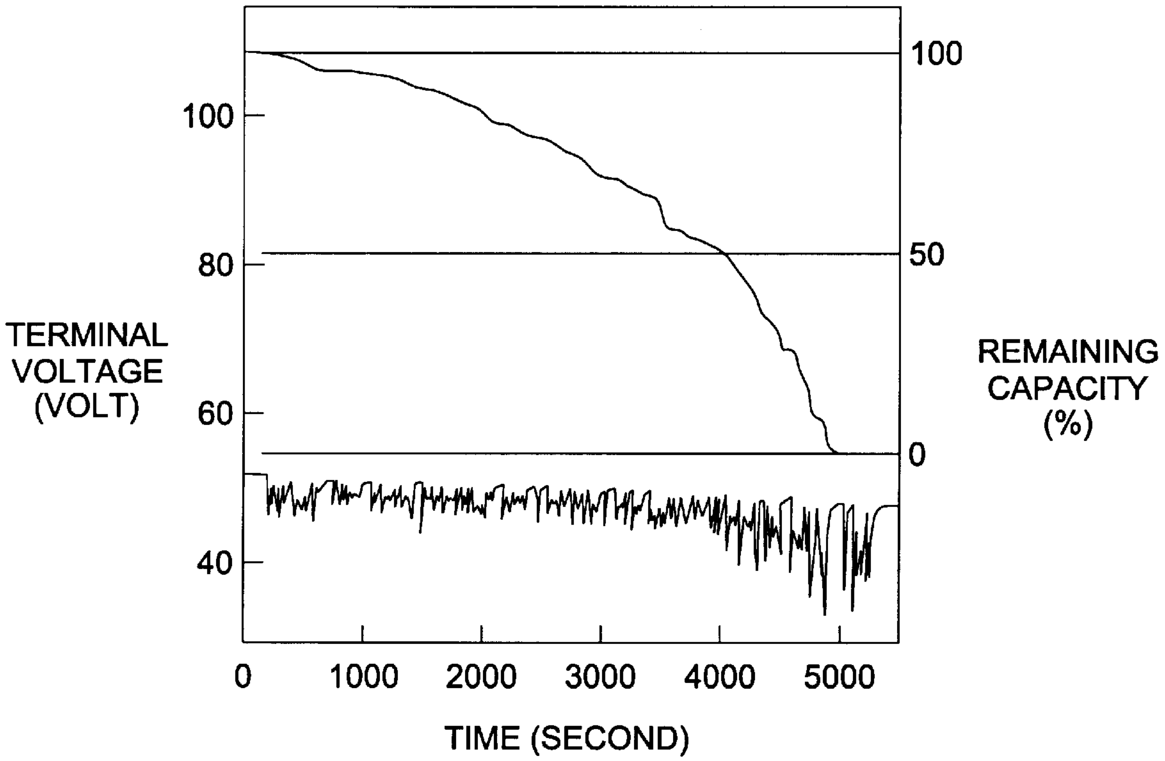
FIG. 40 is a graphic representation for showing a relationship (left vertical axis) between drive time and terminal voltages, and also for indicating a relationship (right vertical axis) between drive time and remaining capacity % in example 11.

In example 11, the scooter running with the headlights on was completed the city course. The power was cut off at about 5000 seconds. After the power was cut off, the scooter was restarted and driven slowly over the remaining part of the course. In FIG. 40, a relationship between the drive time, the terminal voltage and the remaining capacity according to this embodiment is represented.

As can be seen from FIG. 40, the battery capacity becomes 0% at 5000 seconds. This is consistent with the power being cut off during the run. The decrease in the remaining capacity % is smooth with the rate of decrease increasing slightly in the latter half of the discharge. This behavior is expected for an actual representation of the amount of electrical energy remaining in the battery.

In all of the examples 1–11, a highly accurate determination of a value of the remaining capacity %, which is an actual representation of the amount of electrical energy remaining in the battery, was obtained. In all cases, the decrease in the remaining capacity % was smooth with the rate of decrease increasing slightly in the latter half of the discharge.

In examples 5, 7, 10 and 11, the method and apparatus of the present invention accurately indicated the empty condition of the battery that occurred when the power was cut off. In the other seven cases, varying amounts of the remaining capacity were indicated at the conclusion of the test runs.

Figure 6:
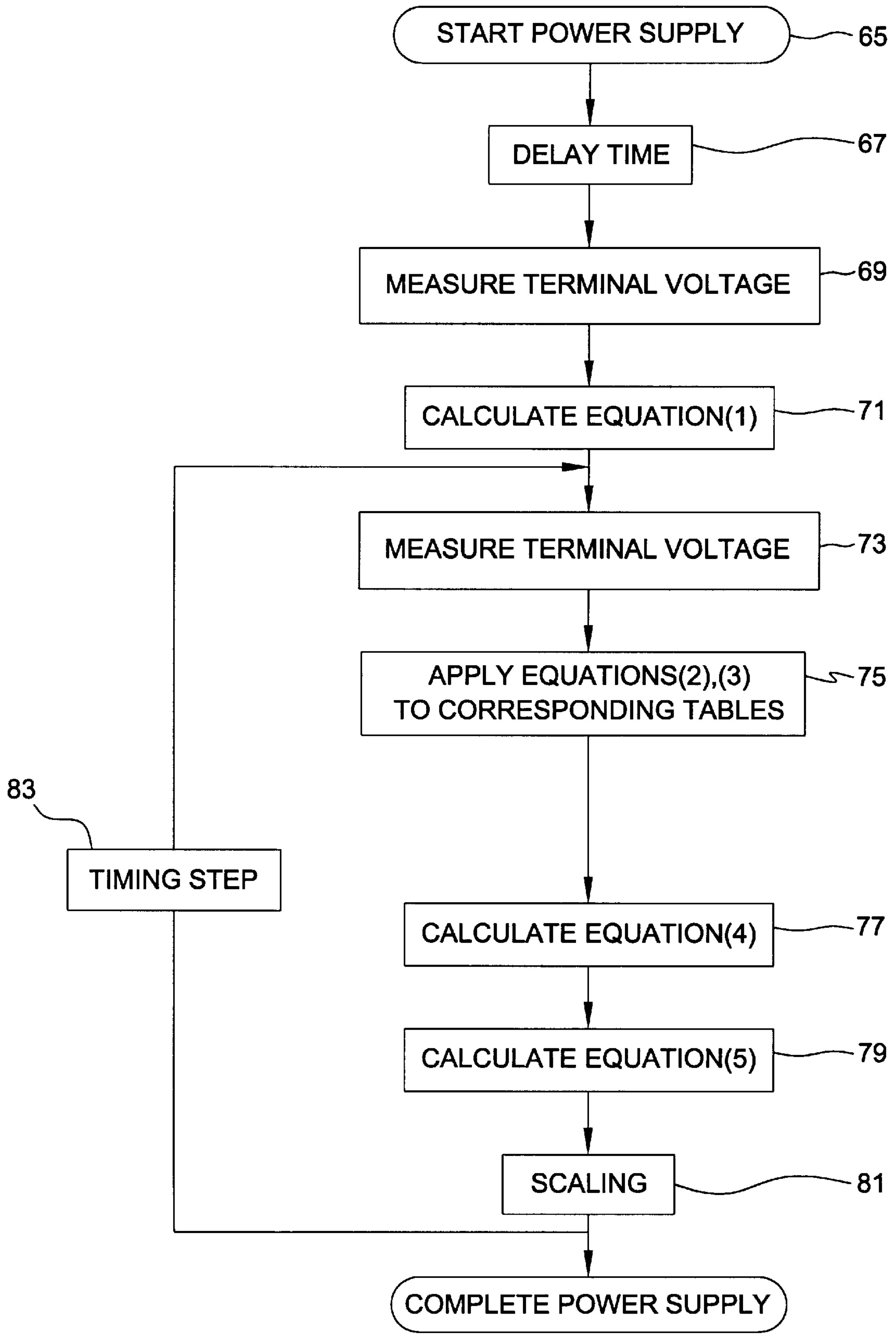
FIG. 6 is a flow chart for showing a process step of another embodiment of the present invention.

In an eleventh embodiment of the present invention, the program steps executed by the microcomputer are represented in a flow chart of FIG. 6. In the initial step, power is supplied to the EV and the battery capacity meter as shown in Block 65. A short time period (delay) is allowed to elapse after power has been supplied as shown in Block 67. The length of the short time period is such that a stable initial terminal voltage value (free from voltage surges such as noise) can be measured. After the short time period has elapsed, the initial terminal voltage $V_0$ is measured as shown in Block 69. In the next step, the initial value $S_0$ of the charge state, is determined by calculating using a equation having the general form of (1). This value of $S_0$ is stored in RAM. The calculation of the initial value of $S_0$ is shown in Block 71.

A series of subsequent steps are repeatedly executed until the supply of power to the EV and the battery capacity meter is interrupted and the program is stopped. In the first step of the continuous loop, the terminal voltage Vi is measured as shown in Block 73. Next, a discrete value of ΔSi is determined by reading a value from a multi-row, multi-column table representing a change amount ΔS of the state of charge with respect to V and S. Either the rows or the columns of this table indicates a typical value produced by discretely subdividing the voltage range under use, and either the rows or the columns of this table indicates a typical value produced by discretely subdividing S. The content of this table is calculated by employing the equations (2) and (3). This table look up step is shown in Block 75. In the next step, using equation (4), the value of the state of charge indication value S is renewed by adding $\Delta S_i$ to the value of $S_i$ currently stored in RAM and then storing the new value of $S_{i+1}$ in RAM as shown in Block 77. Next, the remaining capacity of a battery, expressed as a percentage of the total capacity of the battery, is determined by calculating using a equation (5). The calculation of the remaining capacity is shown in Block 79. In the last step of the continuous loop, the output value from the microcomputer, which is used as the input value for the display device, is determined such that it is directly proportional to the remaining capacity of the battery, expressed as a percentage of the total capacity of the battery. This scaling step is shown in Block 81. The program then returns to Block 73 after pausing until the time interval Δt since the terminal voltage V for the current pass of the loop was measured has elapsed. This timing step is shown in Block 83.

The program steps that are executed by the microcomputer in implementing the present invention as explained above were loaded into the ROM of the microcomputer. For the electric scooter equipped with the battery capacity meter of the present invention, equations, constants, and/or data table values were also stored in ROM. For determining the initial value of the charge state S, the following form of equation (1) was stored:

$$S_0=13-0.25V_0 (K_0=13 \text{ and } K_i=-0.25 \text{ volt}^{-1})$$

To calculate the state of charge change amount ΔS, a plurality of voltage values and a table of ΔS values constructed of a plurality of rows/columns corresponding to the S values were stored. One span of the table consisted of 0.05 volt ranges of V values from 50 V to 30 V. The other span of the table consisted of 0.05 unit ranges of S values from 0 to 1. The respective numeral values of the table were based on the following forms of equation (2) and equation (3) into which concrete constants were substituted:

$$I_i=[50-5\times(S_i-0.2)-40\cdot(S_i-0.7)^2-V_i]\div 0.09$$

(A=50 V, B=5 V, C=40 V, R=0.09 ohms, $S_{ZONE1}$=0.2, and $S_{ZONE2}$=0.7)

$$\Delta S_i=[I_i\cdot 1\cdot f(I_i, S_i)]\div 140400,$$

where $f(I, S)=(S\times I/3)^{0.47}/\text{TANH}[(S\times I/3)^{0.47}]$, (in equation (3), Δt=1sec, M=39Ah·3600sec/hr, $I_0$=3A, Y=0.47).

In the equation (2), as the value of $S_i$ increases from 0 to 0.2, $(S_i-S_{ZONE1})$ is unchanged from 0, but as the value of $S_i$ increases from 0.2 to 1, $(S_i-S_{ZONE1})$ increases linearly from 0 to 0.8. In the same way, as the value of $S_i$ increases from 0 to 0.7, $(S_i-S_{ZONE2})$ is unchanged from 0, but as the value of $S_i$ increases from 0.7 to 1, $(S_i-S_{ZONE2})$ increases linearly from 0 to 0.3.

The above-described calculation method for the remaining capacity according to the present invention has been applied to the data acquired from the same electric scooter as described in the examples 1–11. A relationship between the time (second) and the remaining capacity % was obtained, which is similar to that shown in the upper side of FIGS. 30 to 40. Although a large number of calculation steps was required in the calculation method with employment of the microcomputer so as to obtain the change amount ΔS of the state of charge, the program steps can be executed within a short time since the look-up table is used in this method. Since the program is simple and the processing speed is high, a low cost microcomputer may be employed to execute this program. This method is useful even when the major function of the microcomputer is to control the power supplied to the motor.

Figure 7:
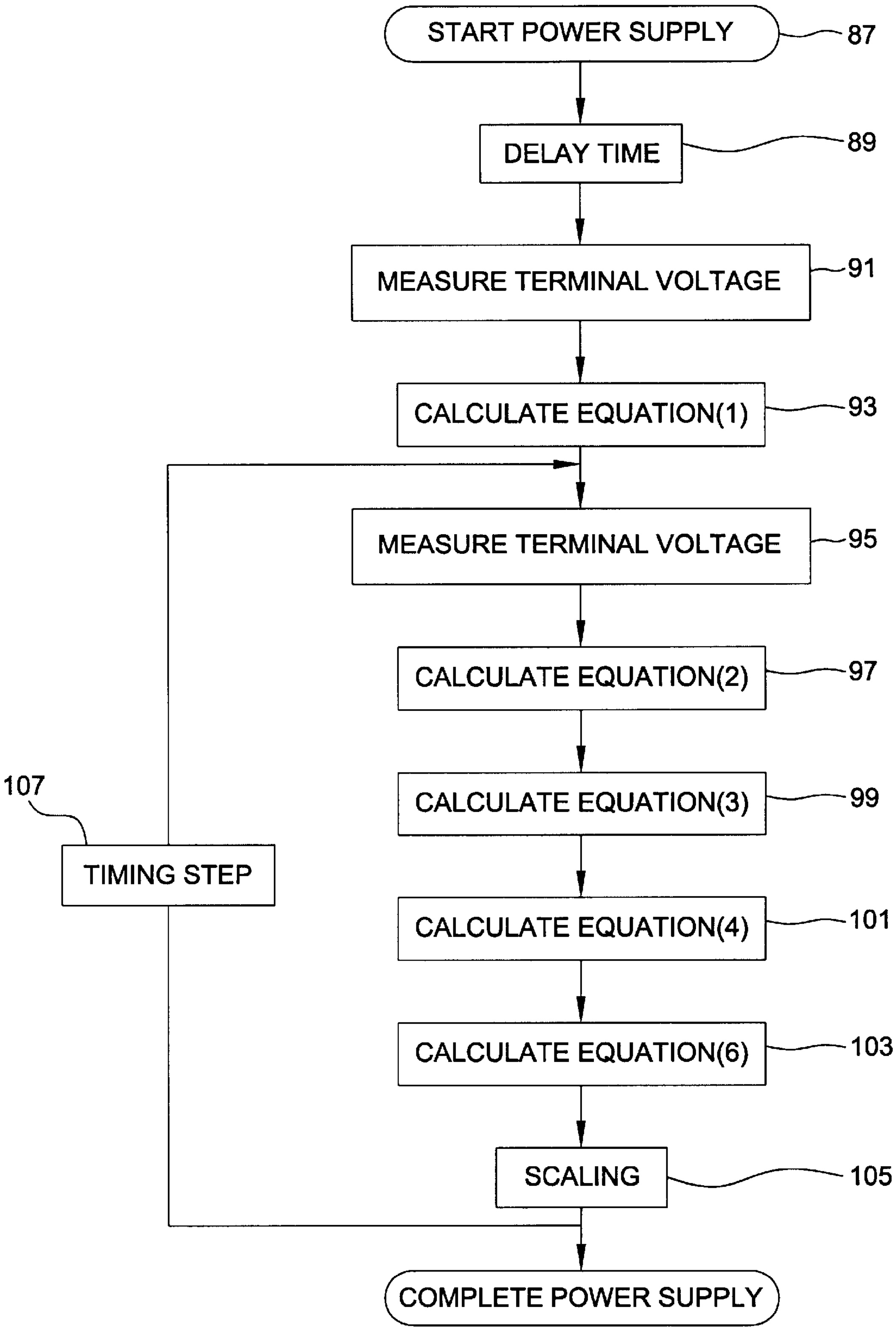
FIG. 7 is a flow chart for indicating a process step of a further embodiment of the present invention.

In a twelfth embodiment of the present invention, the program steps executed by the microcomputer are indicated in a flow chart of FIG. 7.

In the initial step, power is supplied to the EV and the battery capacity meter as shown in Block 87. A short time period (delay) is allowed to elapse after power has been supplied as shown in Block 89. The length of the short time period is such that a stable initial terminal voltage value (free from voltage surges such as noise) can be measured.

After the short time period has elapsed, the initial terminal voltage $V_0$ is measured as shown in Block 91. In the next step, the initial value $S_0$ of the charge state is determined by calculation, using an equation (1). This value of $S_0$ is stored in RAM. The calculation of the initial value of S is shown in Block 93.

A series of subsequent steps is repeatedly executed until the supply of power to the EV and the battery capacity meter is interrupted and the program is stopped. In the first step of this step series, the terminal voltage $V_i$ is measured as shown in Block 95. Next, the estimated battery discharge current $I_i$ is determined by calculating using an equation (2) as shown in Block 97. Next, the change amount $\Delta S_i$ of the state of charge indication value consumed during a time interval Δt is determined by an equation (3) as shown in Block 99. In the next step, the value S of the state of charge is renewed by adding $\Delta S_i$ to the value of $S_i$ currently stored in RAM and then storing the new value of $S_{i+1}$ in RAM as shown in Block 101. Next, the fuel gauge normalized remaining capacity of the battery, expressed as a percentage of the full scale of a fuel gauge, is determined by calculating using an equation (6). The calculation of the fuel-gauge normalized remaining capacity is shown in Block 103. In the last step of the step series, the output value from the microcomputer, which is used as the input value for the display device, is determined such that it is directly proportional to the fuel-gauge normalized remaining capacity of a battery, expressed as a percentage of the full scale of a fuel gauge. This scaling step is shown in Block 105. The program then returns to Block 95 after pausing until the time interval Δt since the terminal voltage V for the current pass of the loop was measured has elapsed. This timing step is shown in Block 107.

The program steps that are executed by the microcomputer implementing the present invention as explained above were loaded into the ROM of the microcomputer. For the electric scooter equipped with the battery capacity meter of the present invention, equations, constants, and/or data tables were also stored in ROM. For determining the initial value of the charge state S, the following form of equation (1) into which actual constants were substituted was stored:

$$S_0=13-0.25V_0\ (K_0=13 \text{ and } K_i=-0.25 \text{ volt}^{-1})$$

To estimate the current value, the actual constants were substituted into equation (2), which is stored and used:

$$I_i=[50-5\cdot(S_i-0.2)-40\cdot(S_i-0.7)^2-V_i]\div 0.09$$

in the equation (2), A=50V, B=5V, C=40V, R=0.09Ω, $S_{ZONE1}=0.2$, $S_{ZONE2}=0.7$)

In this equation, as the value of $S_i$ increases from 0 to 0.2, ($S_i-S_{ZONE1}$) is unchanged from 0, but as the value of $S_i$ increases from 0.2 to 1, ($S_i$31 $S_{ZONE1}$) increases linearly from 0 to 0.8. In the same way, as the value of $S_i$ increases from 0 to 0.7, ($S_i-S_{ZONE2}$) is unchanged from 0, but as the value of $S_i$ increases from 0.7 to 1, ($S_i-S_{ZONE2}$) increases linearly from 0 to 0.3.

For determining the estimated discharge current the following form of equation (3) into which the actual constants are substituted was used:

$$\Delta S_i=[I_i\cdot 1\cdot f(I_i, S_i)]\div 140400,$$

where $f(I, S)=(S\times I/3)^{0.47}/\text{TANH}\ [(S\times I/3)^{0.47}]$ in equation (3), Δt=1sec, M=39Ah·3600sec/hr, $I_0$=3A, Y=0.47) For determining the fuel-gauge normalized remaining capacity, the following form of equation (6) was used:

$$\text{Fuel-gauge normalized remaining capacity\%}=(1-h(S_i))\cdot 100\%$$

where $h(S_i)=0.35S_i\div 0.651\{1-(1-S_i)^2\}^{1/2}$. This function increases monotonically as S increases from 0 to 1, is equal to 0 when S=0, and is equal to 1 when S=1. The value of h(S) when S is equal to ½ is 0.738, which is greater than ½ and less than $3^{1/2}/2$.

In the following examples, which demonstrate the above-described embodiment of the present invention, the same data obtained from the electric scooter as was described above in the examples 1–11 were used.

Figure 41:
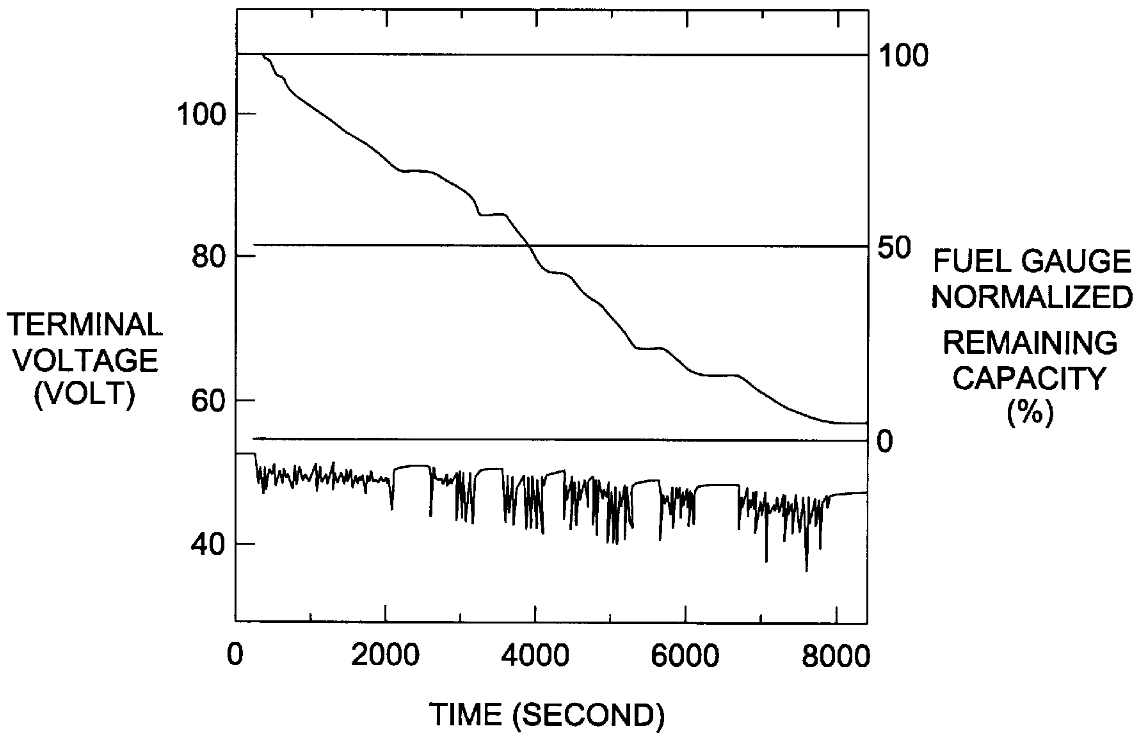
FIG. 41 is a graphic representation for showing a relationship (left vertical axis) between drive time and terminal voltages, and also for indicating a relationship (right vertical axis) between drive time and remaining capacity % in example 12.

In example 12, the scooter running with the headlights off completed two circuits of the lake course. At this time, the power was not cut off. In FIG. 41, the terminal voltage vs. time in seconds is shown in the lower part of the figure.

The terminal voltage is indicated in the left vertical axis. Also in FIG. 41, the decrease in the fuel-gauge normalized battery capacity vs. time in seconds, expressed as a percentage of the full scale of a fuel gauge (fuel-gauge normalized remaining capacity %), is shown in the upper part of the figure. The indication of the fuel-gauge normalized remaining capacity % axis is the right vertical axis. Also in the following examples 12–21, the remaining capacities are calculated based on the drive data in the respective embodiments, and are displayed on a similar scale.

As can be seen from FIG. 41, about 5% of the fuel-gauge normalized capacity remained at the completion of the run. This is consistent with the power not being cut off at the completion of the run. The decrease in the fuel-gauge normalized remaining capacity % is smooth and nearly linear with respect to time. The half-way point of the run occurred at approximately 3700 seconds according to the value calculated by the capacity meter. This is roughly half of the total actual running time of 7900 seconds. In view of the fact the EV was traveling at a relatively steady rate of speed, it is recognized that the decrease in the fuel-gauge normalized remaining capacity % was nearly linear with respect to the distance covered by the EV.

Figure 42:
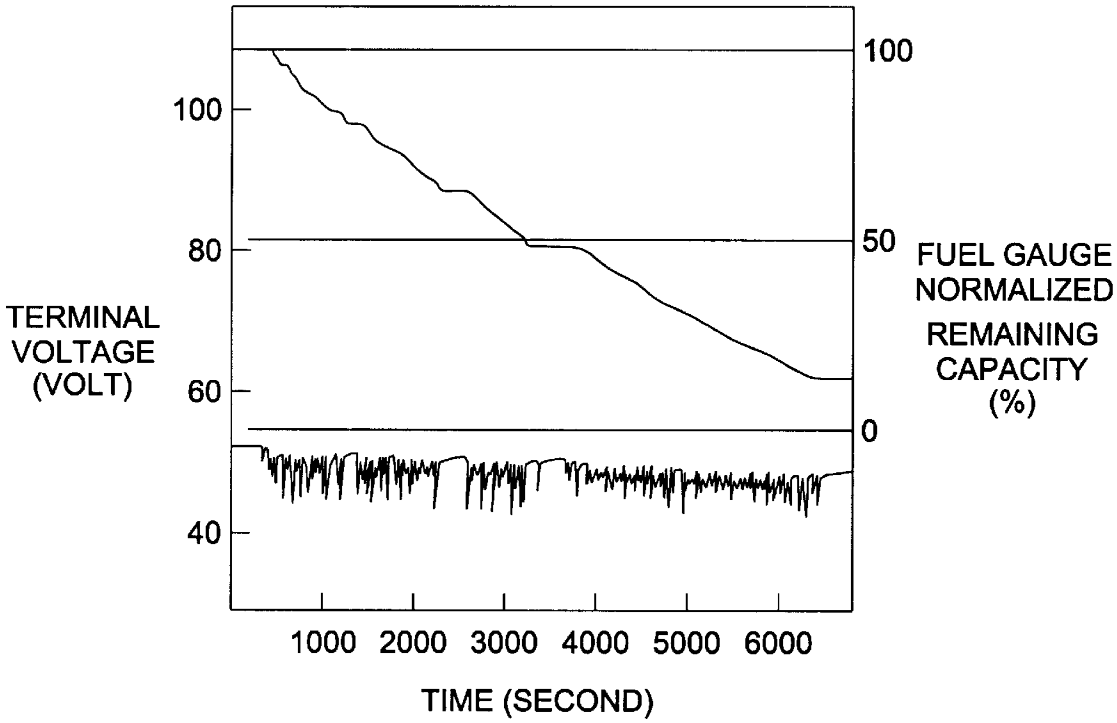
FIG. 42 is a graphic representation for showing a relationship (left vertical axis) between drive time and terminal voltages, and also for indicating a relationship (right vertical axis) between drive time and remaining capacity % in example 13.

In example 13, the scooter running with the headlights off completed two circuits of the lake course. At this time, the power was not cut off. In FIG. 42, a relationship between the drive time, the terminal voltage and the fuel-gauge normalized remaining capacity % according to this example is represented.

As can be seen from FIG. 42, about 15% of the fuel-gauge normalized remaining capacity remains at the completion of the run. This is consistent with the power not being cut off. The decrease in the fuel-gauge normalized remaining capacity % is smooth and nearly linear with respect to time. The half-way point of the run occurred at approximately 2800 seconds according to the value calculated by the capacity meter. This is roughly half of the total actual running time of 6500 seconds. In view of the fact that the EV was traveling at a relatively steady rate of speed, it is recognized that the decrease in the fuel-gauge normalized remaining capacity % was nearly linear with respect to the distance covered by the EV.

Figure 43:
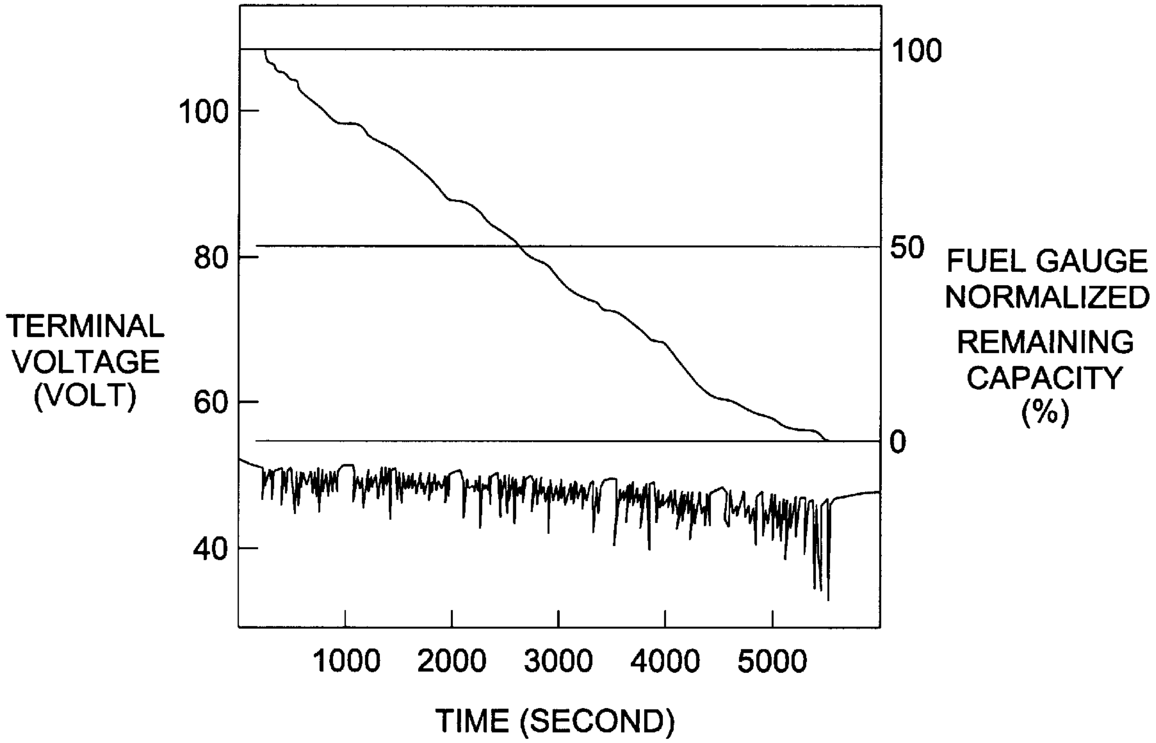
FIG. 43 is a graphic representation for showing a relationship (left vertical axis) between drive time and terminal voltages, and also for indicating a relationship (right vertical axis) between drive time and remaining capacity % in example 14.

In example 14, the scooter running with the headlights off completed two circuits of the lake course. At this time, the power was not cut off. In FIG. 43, a relationship between the drive time, the terminal voltage and the fuel-gauge normalized remaining capacity % according to this example is represented.

As can be seen from FIG. 43, less than 1% of the fuel-gauge normalized remaining capacity remains. This is consistent with the power not being cut off, but very nearly being cut off. The decrease in the fuel-gauge normalized capacity % is smooth and nearly linear with respect to time. The half-way point of the run occurred at approximately 2600 seconds according to the value calculated by the capacity meter. This is roughly half of the total actual running time of 5800 seconds. In view of the fact that the EV was traveling at a relatively steady rate of speed, it is recognized that the decrease in the fuel-gauge normalized capacity % was nearly linear with respect to the distance covered by the EV.

Figure 44:
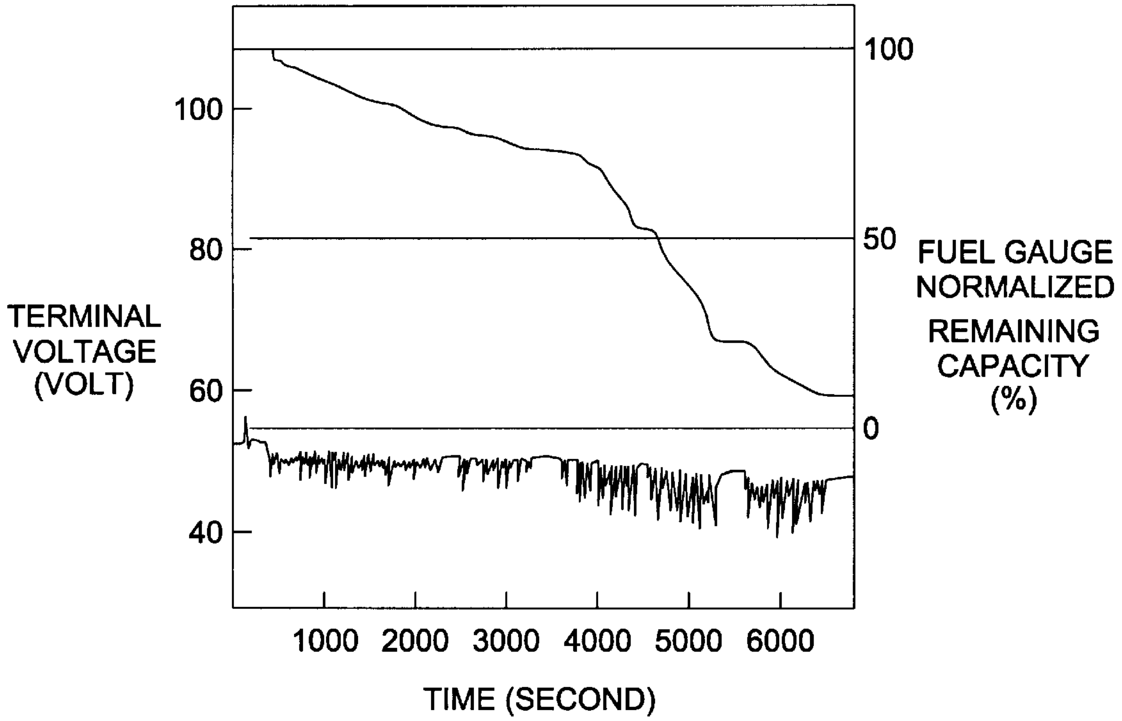
FIG. 44 is a graphic representation for showing a relationship (left vertical axis) between drive time and terminal voltages, and also for indicating a relationship (right vertical axis) between drive time and remaining capacity % in example 15.

In example 15, the scooter running with the headlights on completed two circuits of the lake course. At this time, the power was not cut off. In FIG. 44, a relationship between the drive time, the terminal voltage and the fuel-gauge normalized remaining capacity % is shown.

As can be seen from FIG. 44, about 10% of the fuel-gauge normalized remaining capacity remains at the completion of the run. This is consistent with the power not being cut off. For the first circuit of the lake course, the decrease in the fuel-gauge normalized remaining capacity % is smooth and nearly linear with respect to time. For the second circuit of the same lake course, the decrease in the fuel-gauge normalized remaining capacity % is also smooth and nearly linear with respect to time. The rate of decrease for the second circuit is roughly twice that for the first circuit. A reasonable interpretation of this result is that the driver in the second half of the course made greater power demands on the battery than the driver did in the first half of the course.

Figure 45:
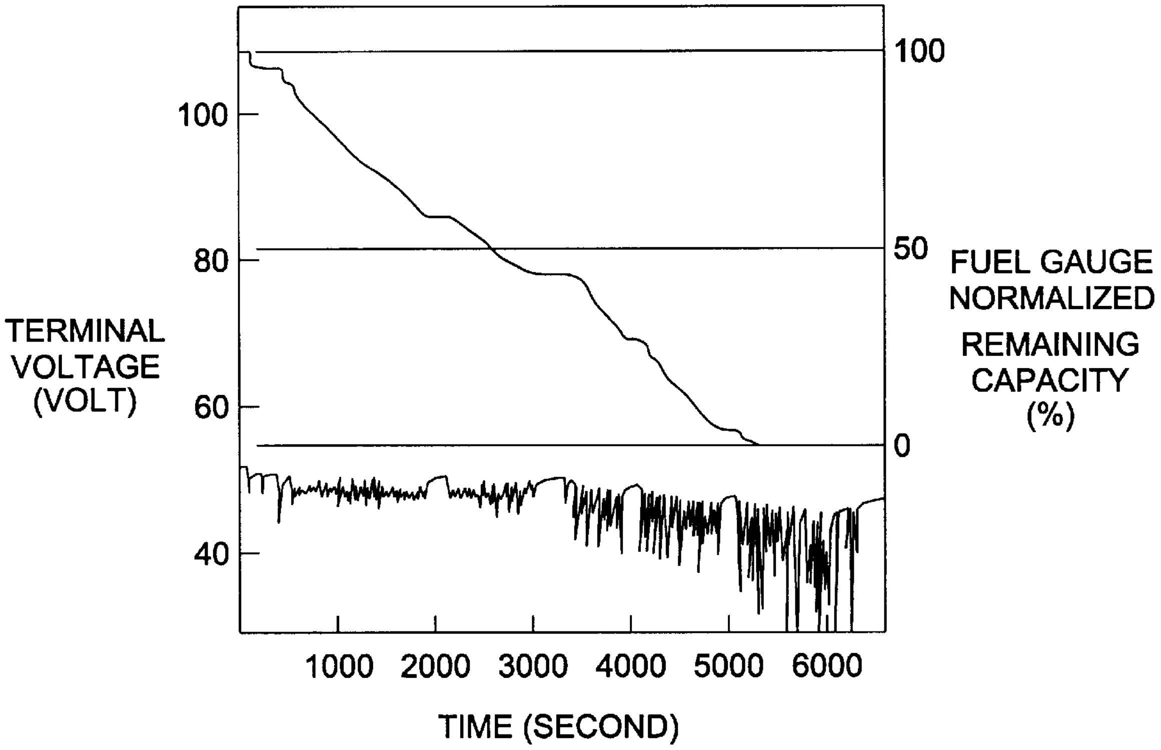
FIG. 45 is a graphic representation for showing a relationship (left vertical axis) between drive time and terminal voltages, and also for indicating a relationship (right vertical axis) between drive time and remaining capacity % in example 16.

In example 16, the scooter running with the headlights off completed two circuits of the lake course. At this time, the power was cut off at about 5300 seconds. After the power was cut off, the scooter was restarted and driven slowly over the remaining part of the course. In FIG. 45, a relationship between the drive time, the terminal voltage and the fuel-gauge normalized remaining capacity % according to this example is shown.

As can be seen from FIG. 45, the battery capacity is 0% at 5350 seconds. The fact that the indication value became 0% when the power was cut off shows that this calculation method is consistent with the actual case. The decrease in the fuel-gauge normalized remaining capacity % is smooth and nearly linear with respect to time.

The half-way point of the run occurred at approximately 2600 seconds according to the value calculated by the capacity meter. This is roughly half of the time at which the power was cut off. In view of the fact that the EV was traveling at a relatively steady rate of speed, it is recognized that the decrease in the fuel-gauge normalized remaining capacity % was nearly linear with respect to the distance covered by the EV.

Figure 46:
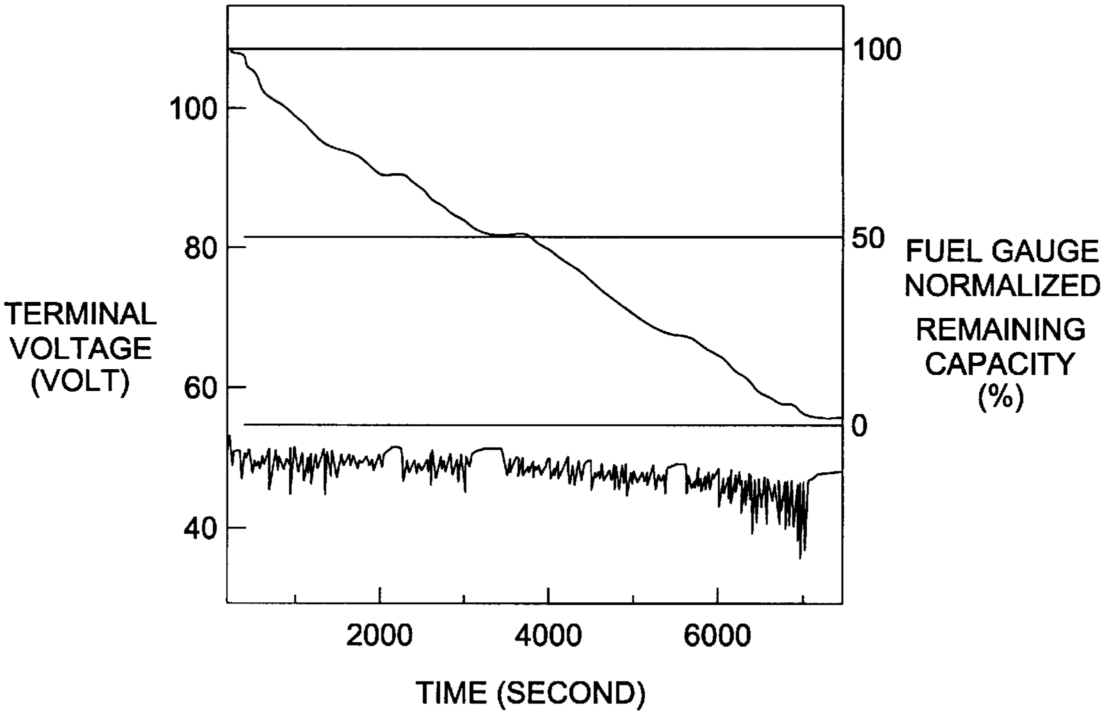
FIG. 46 is a graphic representation for showing a relationship (left vertical axis) between drive time and terminal voltages, and also for indicating a relationship (right vertical axis) between drive time and remaining capacity % in example 17.

In example 17, the scooter running with the headlights OFF for the first half and ON for the second half completed two circuits of the lake course. In FIG. 46, a relationship between the drive time, the terminal voltage and the fuel-gauge normalized remaining capacity %, is shown according to the present embodiment.

As can be seen from FIG. 46, about 1% of the fuel-gauge normalized remaining capacity remaining at the completion of the run. This calculation result is consistent with the power not being cut off. The decrease in the fuel-gauge normalized remaining capacity % is smooth and nearly linear with respect to time. The half-way point of the run occurred at approximately 3400 seconds according to the value calculated by the capacity meter. This is roughly half of the total actual running time of 7100 seconds. In view of the fact that the EV was traveling at a relatively steady rate of speed, it is recognized that the decrease in the fuel-gauge normalized remaining capacity % was nearly linear with respect to the distance covered by the EV.

Figure 47:
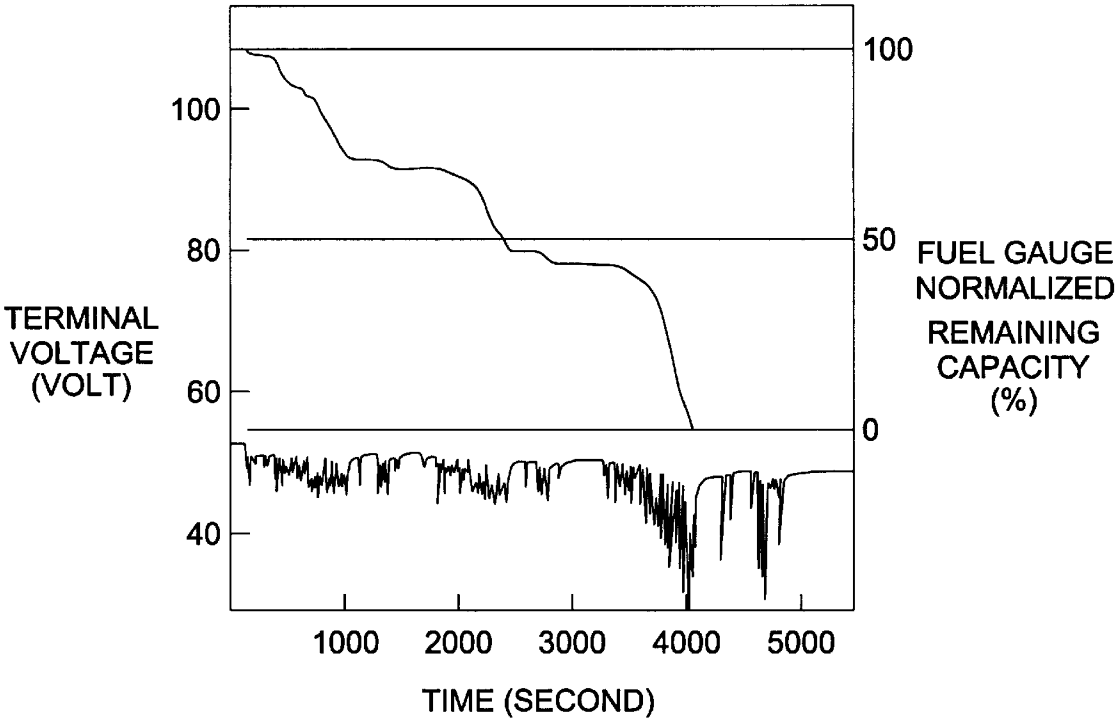
FIG. 47 is a graphic representation for showing a relationship (left vertical axis) between drive time and terminal voltages, and also for indicating a relationship (right vertical axis) between drive time and remaining capacity % in example 18.

In example 18, the scooter running with the headlights off completed three circuits of the slope course. At this time, the power was cut off at about 4000 seconds. After the power was cut off, the scooter was restarted and driven slowly over the remaining part of the course, which was mostly downhill. In FIG. 47, a relationship between the drive time, the terminal voltage and the fuel-gauge normalized remaining capacity % according to this example is shown.

As can be seen from FIG. 47, the indication value of the battery capacity meter of the present invention is 0% at 4000 seconds. This fact that the indication value became 0% when the power was cut off is consistent with the fact that this calculation method reflects the actual condition. The decrease in the fuel-gauge normalized remaining capacity % is smooth and nearly linear with respect to time for the parts of the three circuits in which the scooter is going up the hill. Similarly, the decrease in the fuel-gauge normalized remaining capacity % is smooth and nearly linear with respect to time for the parts of the three circuits in which the scooter is going down the hill.

Figure 48:
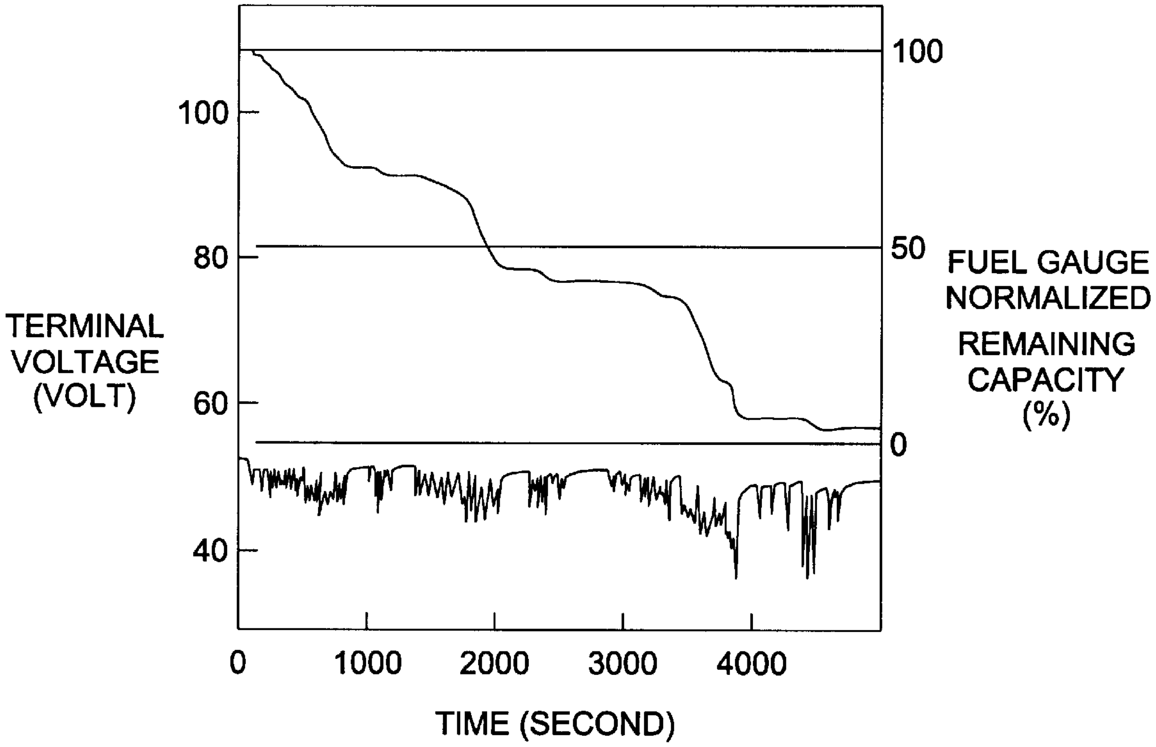
FIG. 48 is a graphic representation for showing a relationship (left vertical axis) between drive time and terminal voltages, and also for indicating a relationship (right vertical axis) between drive time and remaining capacity % in example 19.

In example 19, the scooter running with the headlights on completed three circuits of the slope course. During this drive, the power was not cut off. In FIG. 48, a relationship between the drive time, the terminal voltage and the fuel-gauge normalized remaining capacity % according to the present example is shown.

As can be seen from FIG. 48, about 5% of battery capacity remains at the completion of the run. The calculation result of the remaining capacity is consistent with the fact that the power was not cut off. The decrease in the fuel-gauge normalized remaining capacity % is smooth and nearly linear with respect to time for the parts of the three circuits in which the scooter is going up the hill. Similarly, the decrease in this fuel-gauge normalized remaining capacity % is smooth and nearly linear with respect to time for the parts of the three circuits in which the scooter is going down the hill.

It is assumed that it took about 1200 seconds to run one circuit of the course from the time when the indication of the capacity meter became ⅓. This is equal to approximately ⅓ of the actual total driving time of 4500 seconds. Similarly, it is assumed that it took about 3400 seconds to run two circuits of the course based upon the capacity meter. This is equal to about ⅔ of the actual total drive hours of 4500 seconds. In view of the fact that the EV was traveling at a relatively steady rate of speed, it is recognized that the decrease in the fuel-gauge normalized remaining capacity % was nearly linear with respect to the distance covered by the EV.

Figure 49:
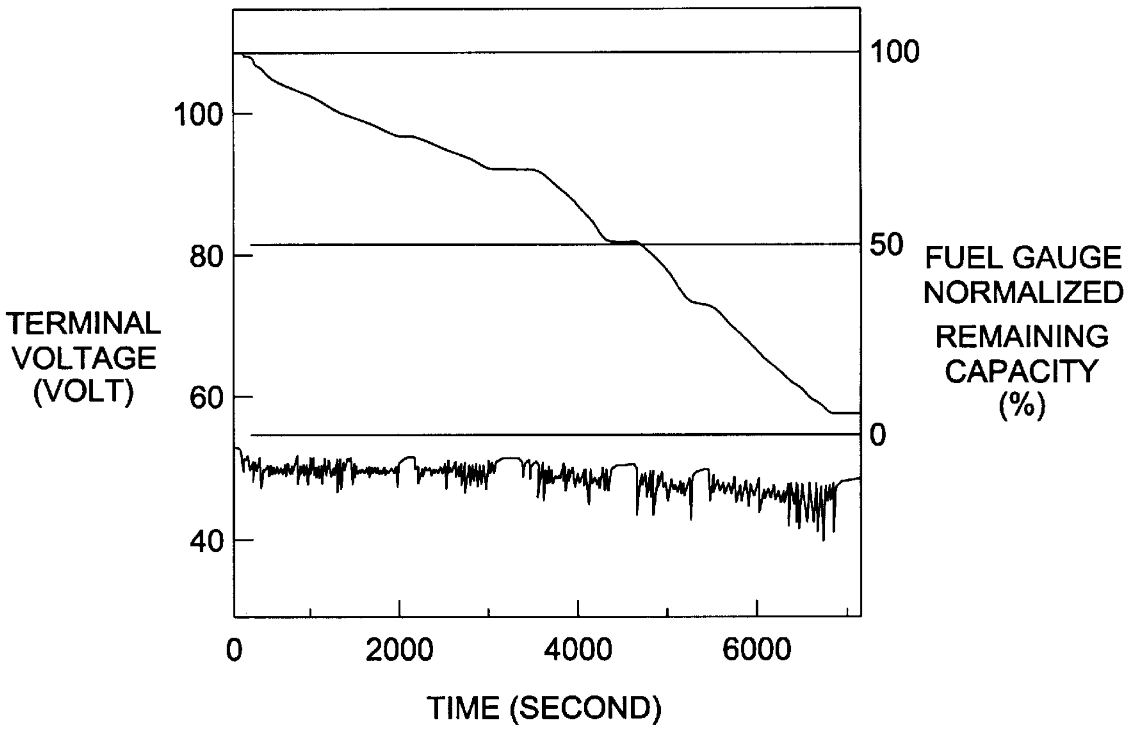
FIG. 49 is a graphic representation for showing a relationship (left vertical axis) between drive time and terminal voltages, and also for indicating a relationship (right vertical axis) between drive time and remaining capacity % in example 20.

In example 20, the scooter running with the headlights off completed two circuits of the lake course. At this time, the power was not cut off. In FIG. 49, a relationship between the drive time, the terminal voltage and the fuel-gauge normalized remaining capacity % according to this example is shown.

As can be seen from FIG. 49, about 5% of the fuel-gauge normalized remaining capacity remains at the completion of the run. This calculation result of the remaining capacity is consistent with such a fact that the power was not cut off. The fuel-gauge normalized remaining capacity % is decreased smoothly, or linearly with respect to the time. The half-way point of the run occurred at approximately 4200 seconds according to the value calculated by the capacity meter. This is roughly half of the total actual running time of 7100 seconds.

In view of the fact that the EV was traveling at a relatively steady rate of speed, it is recognized that the decrease in the fuel-gauge normalized remaining capacity % was nearly linear with respect to the distance covered by the EV.

Figure 50:
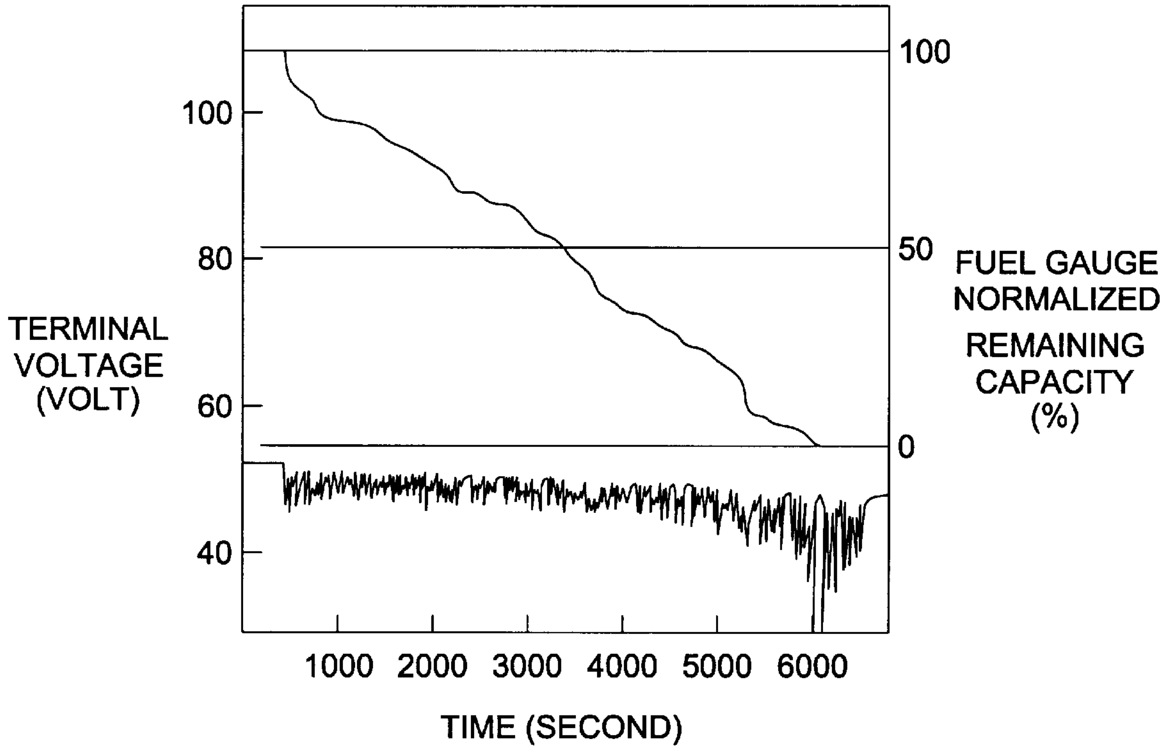
FIG. 50 is a graphic representation for showing a relationship (left vertical axis) between drive time and terminal voltages, and also for indicating a relationship (right vertical axis) between drive time and remaining capacity % in example 21.

In example 21, the scooter running with the headlights on competed the city course. At this time, the power was cut off after about 6100 seconds had passed. After the power was cut off, the scooter was restarted and driven slowly over the remaining part of the course. In FIG. 50, a relationship between the drive time, the terminal voltage and the fuel-gauge normalized remaining capacity % according to the present example is shown.

As can be seen from FIG. 50, the battery capacity is 0% at 6100 seconds. The fact that the display value becomes 0% when the power is stopped implies that the present calculation method is consistent with the actual case. The decrease in the fuel-gauge normalized remaining capacity % is smooth and nearly linear with respect to time. The half-way point of the run occurred at approximately 3400 seconds according to the value calculated by the capacity meter. This is roughly half of the time at which the power was cut off. In view of the fact that the EV was traveling at a relatively steady rate of speed, it is recognized that the decrease in the fuel-gauge normalized remaining capacity % was nearly linear with respect to the distance covered by the EV.

Figure 51:
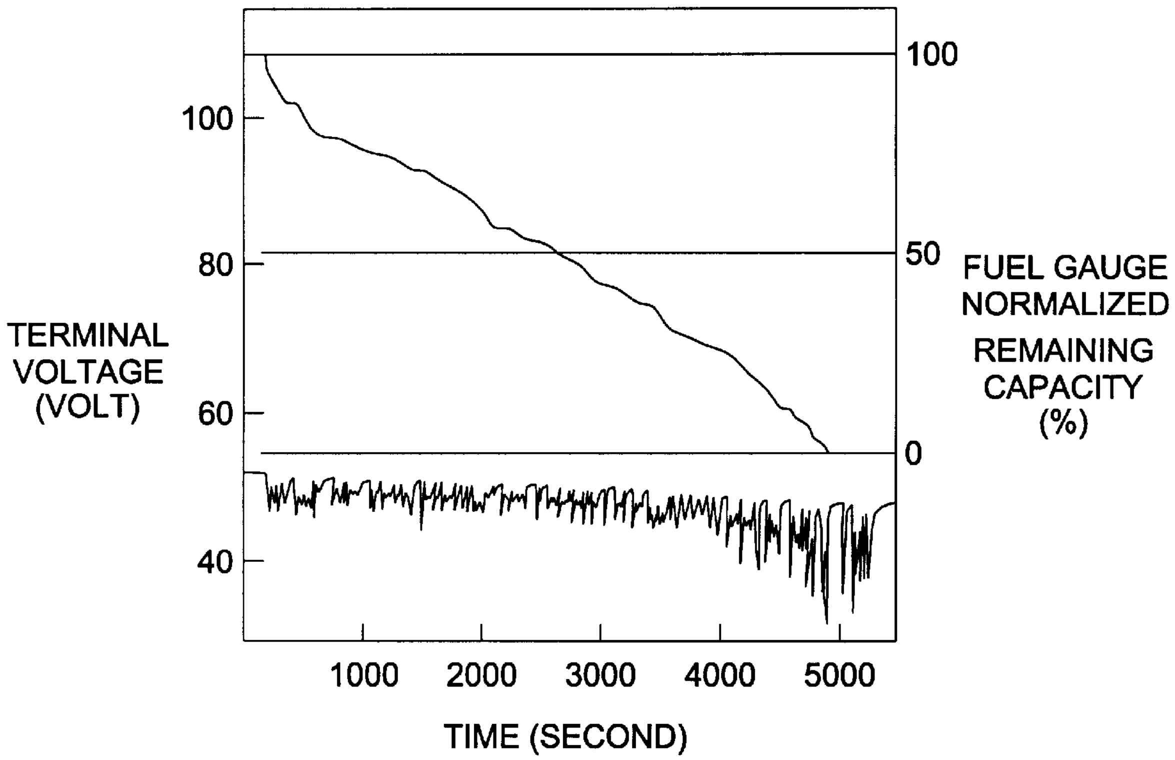
FIG. 51 is a graphic representation for showing a relationship (left vertical axis) between drive time and terminal voltages, and also for indicating a relationship (right vertical axis) between drive time and remaining capacity % in example 22.
Figure 52:
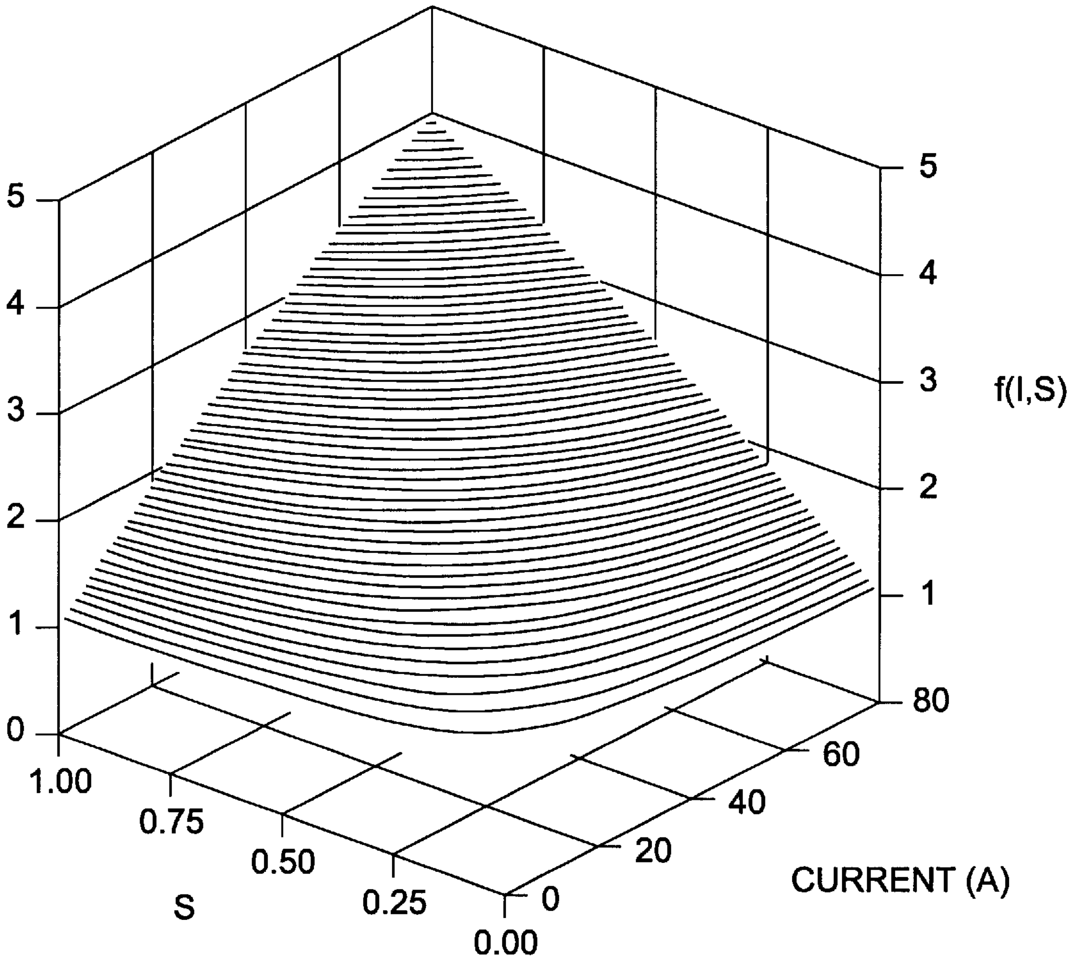
FIG. 52 is a three dimensional diagram for indicating a concrete example in change states of the correction coefficient $f(I_i, S_i)$ in the equation (3) of the present invention.
Figure 53A:
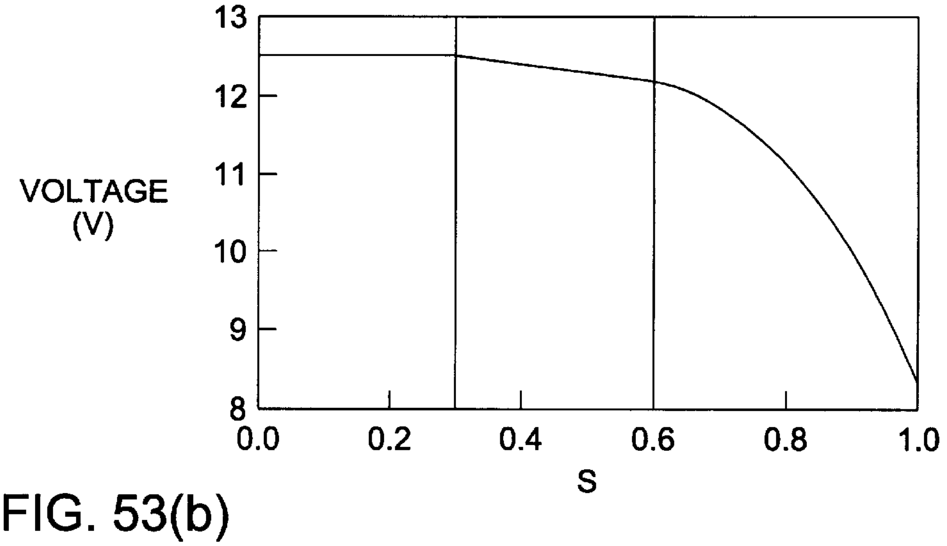
FIGS. 53(*a*) and 53(*b*) show graphs of the three term approximation of $E_0$, $E_0=A-B\cdot(S-S_{ZONE1})-C\cdot(S-S_{ZONE2})^2$ VS. S shown for three possible embodiments of the present invention (the values of $S_{ZONE1}$ and $S_{ZONE2}$ in (a) are 0.30 and 0.60, in (*b*) are 0.00 and 0.10, and in (*c*) are 0.00 and 0.95, respectively)
Figure 53B:
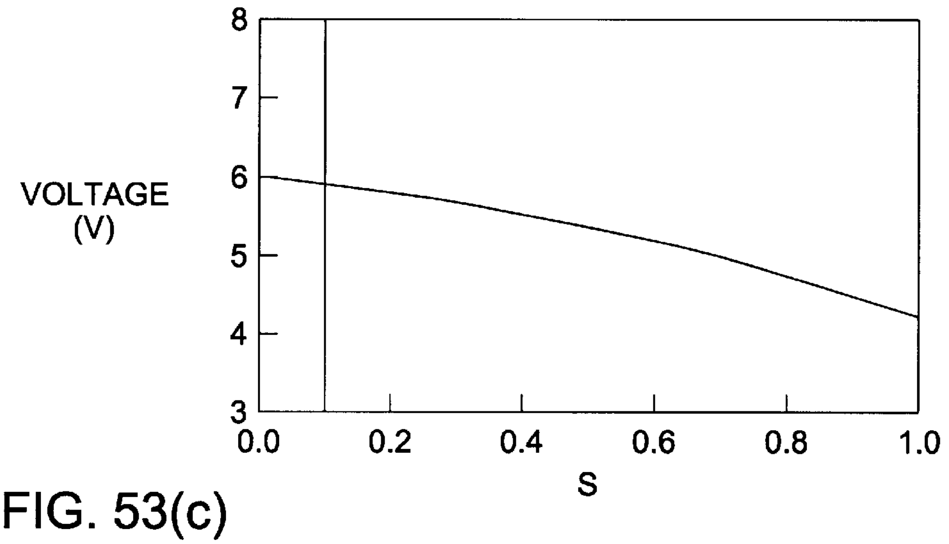
Figure 53C:
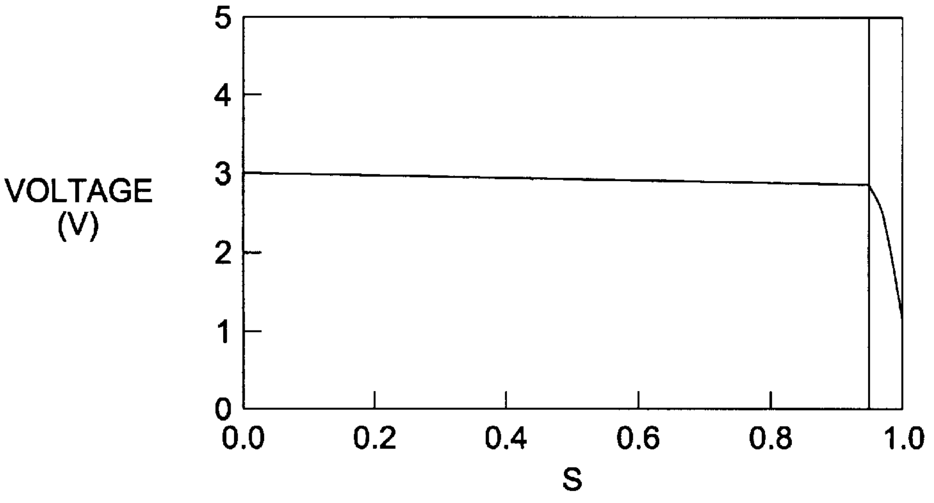
Figure 54:
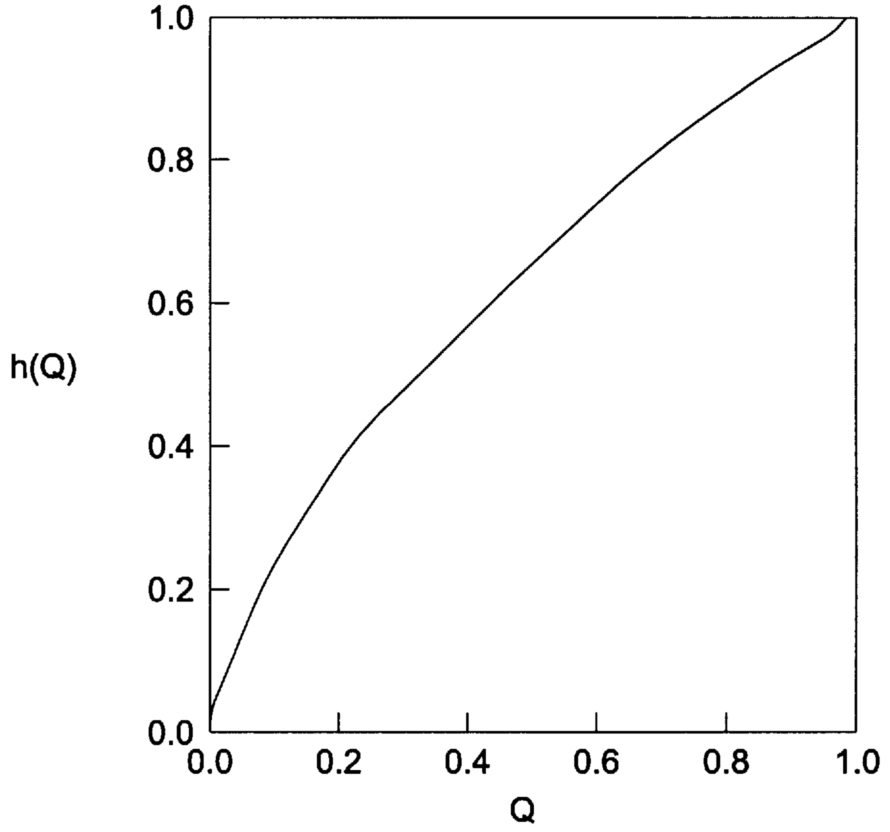
FIG. 54 shows a graph of one embodiment of the fuel-gauge normalizing function $h(S_i)$, in equation 6 of the present invention.

In example 22, the scooter running with the headlights on completed the city course. At this time, the power was cut off after about 5000 seconds had passed. After the power was cut off, the scooter was restarted and driven slowly over the remaining part of the course. In FIG. 51, a relationship, according to this example, is represented between the drive time, the terminal voltage and the fuel-gauge normalized remaining capacity %.

As apparent from FIG. 51, the battery capacity indication value of the capacity meter according to the present invention becomes 0% at 5000 seconds. The fact that the display value becomes 0% when the power is cut off shows that this calculation method is consistent with the actual case. The half-way point of the run occurred at approximately 2600 seconds according to the value calculated by the capacity meter. This is roughly half of the time at which the power was cut off. In view of the fact that the EV was traveling at a relatively steady rate of speed, it is recognized that the decrease in the fuel-gauge normalized remaining capacity % was nearly linear with respect to the distance covered by the EV.

In all of the examples 12–22, an accurate determination of a value of fuel-gauge normalized remaining capacity %, which decreases nearly linearly with respect to the distance covered by an EV traveling at a steady rate of speed, was obtained. In four cases, examples 16, 18, 21 and 22, the capacity meter accurately indicated the empty condition of the battery, which occurred when the power was cut off. In the other seven cases, various amounts of the fuel-gauge normalized remaining capacity were indicated at the conclusion of the test runs.

Figure 8:
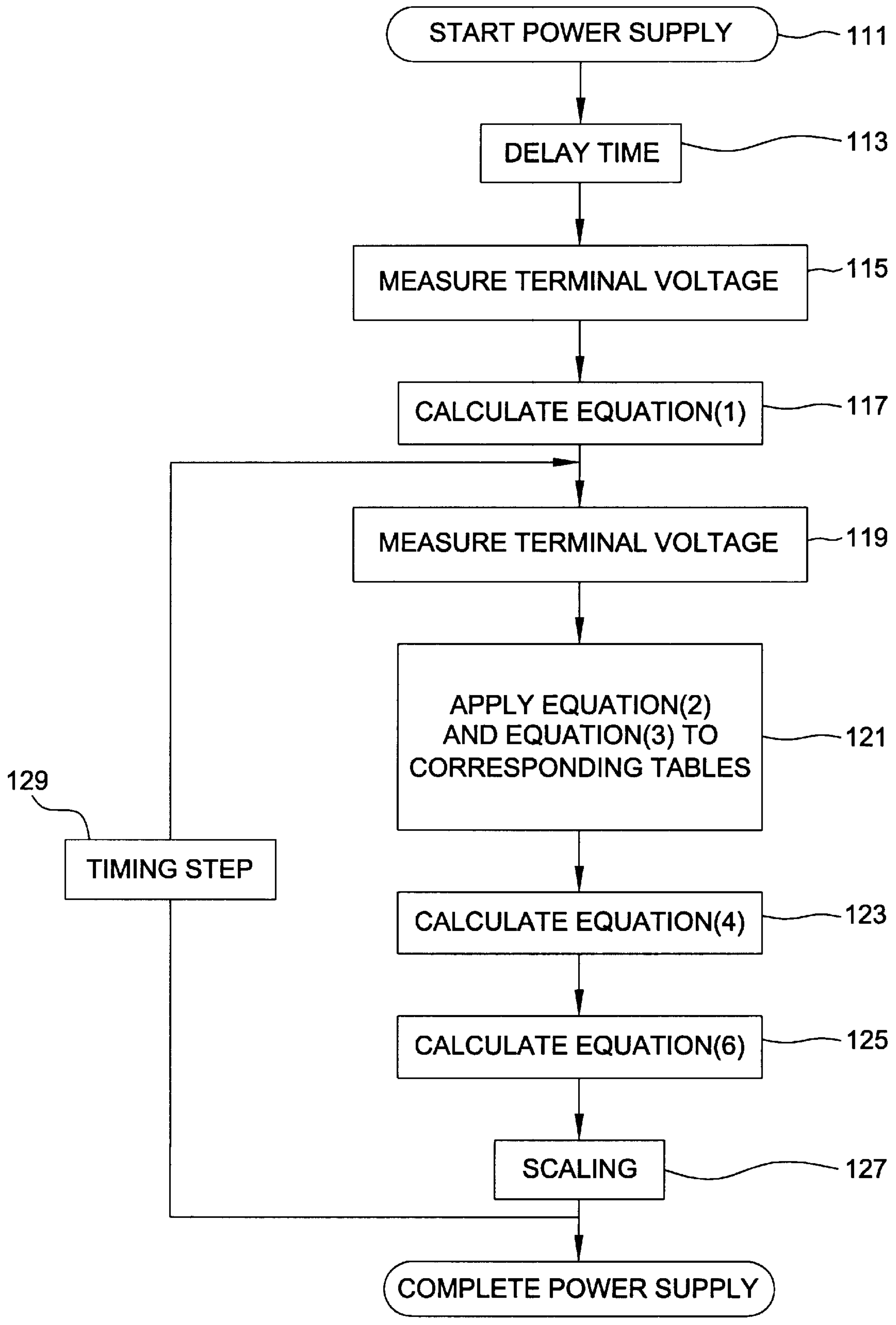
FIG. 8 is a flow chart for indicating a process step of a still further embodiment of the present invention.
Figure 9:
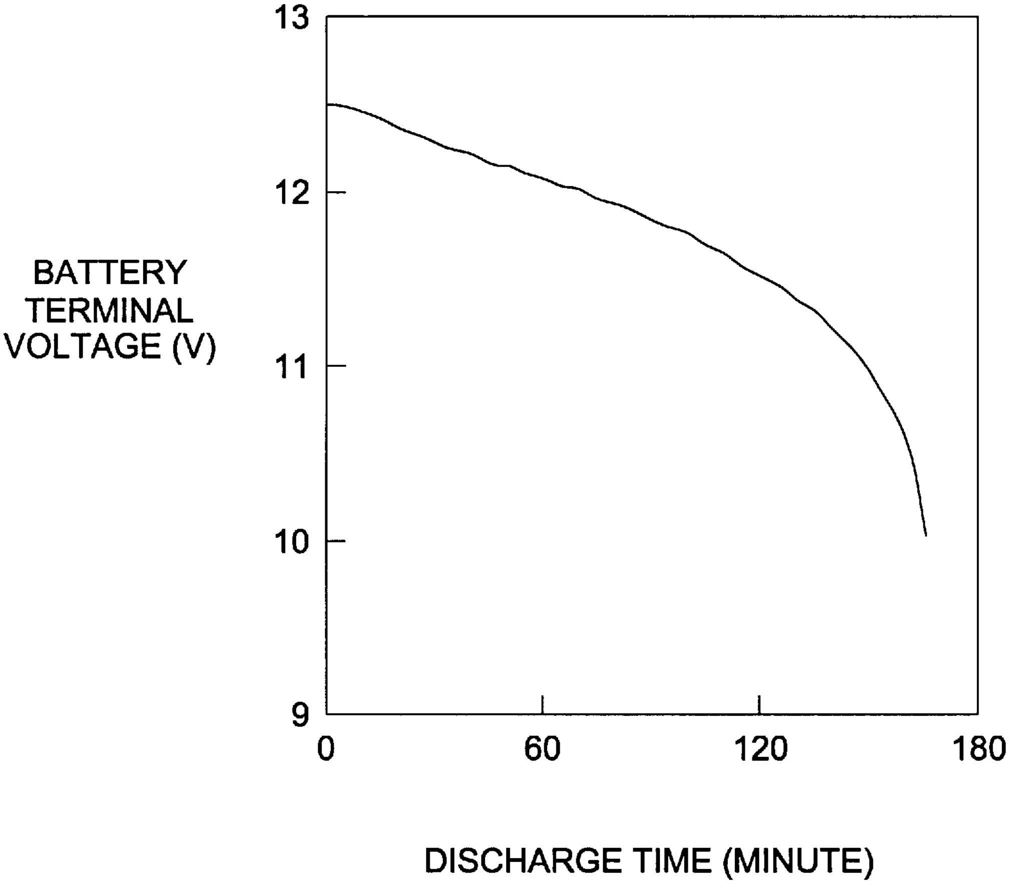
FIG. 9 is a diagram for showing a constant current discharge characteristic of 30 Ah 12 V lead battery under a current of 10 A.
Figure 10:
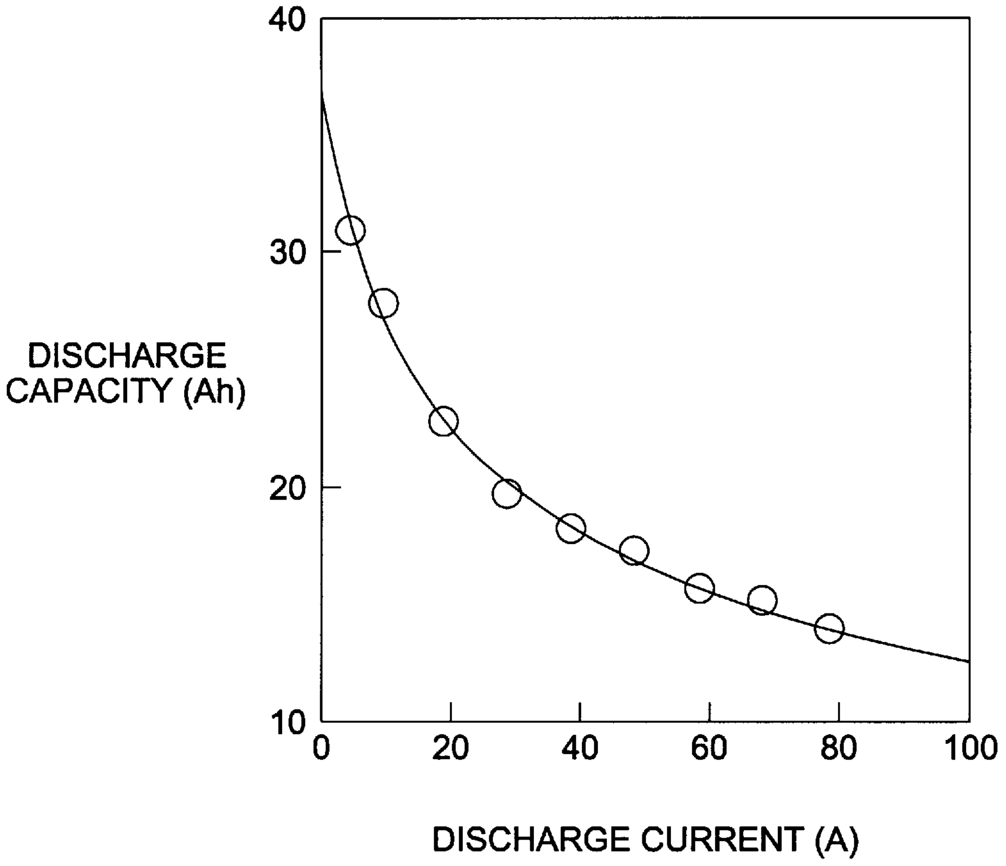
FIG. 10 is a diagram for representing a relationship between a discharge capacity and a battery discharge current value of 30 Ah 12 V lead battery.

The program steps that are executed by the microcomputer in implementing the thirteenth embodiment of the present invention are shown in the form of a flowchart in FIG. 8. In the initial step, power is supplied to the EV and the battery capacity meter as shown in Block 111. A short time period is allowed (delay) to elapse after power has been supplied as shown in Block 113. The length of the short time period is such that a stable initial terminal voltage value (free from voltage surges such as noise) can be measured. After the shorter time period has elapsed, the initial terminal voltage $V_0$ of the charge state, is determined by calculating using equation (1). This value of $S_0$ is stored in RAM. The calculation of the initial value of S is shown in Block 117.

The program then enters a continuous loop, which operates until the power that is supplied to the EV and the battery remaining capacity is discontinued and the program stops running. In the first step of the continuous loop, the terminal voltage $V_i$ is measured as shown in Block 119. Subsequently, a discrete value of $\Delta S_i$ is read out from a table having either plural rows or plural columns, which represents the change amount ΔS of the state of charge with respect to V and S. In one row or one column of this table, the voltage range to be used is discretely subdivided and the typical subdivided range value is arranged. In another row, or column, S is discretely subdivided and the subdivided S is arranged. The contents of the table are based on equations (2) and (3). This table look up step is shown in Block 121. In the next step, using equation (4), the value of the charge state S value is renewed by adding $\Delta S_i$ to the value of $S_i$ currently stored in RAM and then storing the new value of $S_{i+1}$ in RAM as shown in Block 123. Next, the fuel-gauge normalized remaining capacity of a battery, expressed as a percentage of the full scale of a fuel-gauge, is determined by calculating using an equation (6).

The calculation of the fuel-gauge normalized remaining capacity is shown in Block 125. In the last step of the continuous loop, the output value from the microcomputer, which is used as the input value for the display device, is determined such that it is directly proportional to the fuel-gauge normalized remaining capacity of a battery, expressed as a percentage of he full scale of a fuel gauge. This scaling step is shown in Block 127. The program then returns to Block 119 after pausing until the time interval Δt since the terminal voltage V for the current pass of the loop was measured has elapsed. This timing step is shown in Block 129.

The program steps, which are executed by the microcomputer in implementing the present invention as explained above, were loaded into the ROM of the microcomputer. For the electric scooter equipped with the battery capacity meter of the present invention, equations, constants, and/or data table values were also stored in ROM. For determining the initial value of the self-consistent state of charge S, the following form of equation (1) into which actual constants are substituted was stored:

$$S_0=13-0.25V_i(K_0=13 \text{ and } K_i=-0.25 \text{ volts}^{-1}).$$

For determining the change amount ΔS of the state of charge, a multi-row, multi-column table of discrete ΔS values was stored. One span of the table consisted of 0.05 volt ranges of V values from 50 V to 30 V. The other span of the table consisted of 0.05 unit ranges of S values from 0 to 1. The contents of the table are constituted by combinations of the respective voltages and the S values in correspondence with the ΔS values. The respective ΔS values were calculated by employing the following equations made by substituting the actual constants for the equations (2) and (3):

$$I_i=[50-5\cdot(S_i-0.2)-40\cdot(S_i-0.7)^2-V_i]\div 0.09$$

in equation (2), A=50 V, B=5 V, C=40 V, R=0.09Ω, $S_{ZONE1}$=0.2, $S_{ZONE2}$=0.7

$$\Delta S_i=[I_i\cdot 1\cdot f(I_i, S_i)]\div 140400$$

Here, f(I, S)=$(S*I/3)^{0.47}$/TANH $[(S*I/3)^{0.47}$ (in equation (3), Δt=1 sec, M=39 Ah·3600 sec/hr, $I_0$=3 A, Y=0.47).

In the equation (2), as the value of $S_i$ increases from 0 to 0.2 ($S_i-S_{ZONE1}$) is unchanged from 0, but as the value of $S_i$ increases from 0.2 to 1, ($S_i-S_{ZONE1}$) increases linearly from 0 to 0.8. In the same way, as the value of $S_i$ increases from 0 to 0.7, ($S_i-S_{ZONE2}$) is unchanged from 0, but as the value of $S_i$ increases from 0.7 to 1, ($S_{i-ZONE2}$) increases linearly from 0 to 0.3.

The above-described method with employment of the data table, was used on the same data obtained from the electric scooter as was described above in the examples 12–22. The same decreases in the fuel-gauge normalized remaining capacity vs. time in seconds, as are shown in the upper parts of FIGS. 44–54, were obtained. A very cumbersome calculation step is omitted, since the table indicating the equation (3) stores the change amount ΔS of the state of charge. Accordingly, the calculation of the remaining capacity can be executed quickly. Because the program is simpler and faster, one can use a simpler and less costly microcomputer. Rapid data processing speed is also extremely important for the microcomputer in which the primary function of the microcomputer is to control power being supplied to an electric motor.

In the above-described first method (flowchart shown in FIG. 5) and second method (flowchart shown in FIG. 6), the initial value of the charge state $S_0$ was determined by calculating using the equation (1) and the remaining capacity of the battery was determined by calculating using the equation (5). In implementing other embodiments of the present invention either one or both of these calculation steps is replaced by a table look-up step. For determining the initial value of the charge state $S_0$, a value is read from a table of discrete $S_0$ values corresponding to discrete ranges of $V_0$. The respective $S_0$ values of this table are calculated based on an equation having the general form of equation (1). Similarly, for determining the remaining capacity of the battery, a value is read from a table of discrete remaining capacity values corresponding to discrete ranges of the state of charge S. The respective remaining capacity values in this table were calculated based on the equation (5). Using the above look-up tables in both the first and second methods results in programs with simple steps that can be executed quickly. Because the programs are simpler and faster, one can use simpler and less costly microcomputers to execute the methods. Rapid data processing speed is extremely important for the microcomputer in which the primary function of the microcomputer is to control power being supplied to an electric motor.

In the above-described third method (flowchart shown in FIG. 7) and fourth method (flowchart shown in FIG. 8), the initial value of the charge state $S_0$ was determined by calculating using the equation (1) and the fuel-gauge normalized capacity percentage was determined by calculating using the equation (6). In implementing other embodiments of the present invention, either one or both of these calculation steps is replaced by a table look-up step. For determining the initial value of the charge state $S_0$, a value is read from a table of discrete $S_0$ values corresponding to discrete ranges of $V_0$ with the contents of the table being based on the equation (1). Similarly, for determining the fuel-gauge normalized capacity percentage, a value is read from a table of discrete the fuel-gauge normalized capacity percentage values corresponding to discrete ranges of the charge state S with the contents of the table being based on an equation (6). Using the above look-up tables in both the second and third methods results in programs with simple steps which can be executed quickly. Because the programs are simpler and faster, one can use simpler and less costly microcomputers to execute the means. Rapid data processing speed is extremely important for the microcomputer in which the primary function of the microcomputer is to control power being supplied to an electric motor.

While the above-described various embodiments have been described about the calculations of the battery capacities for the lead battery, a fourteenth embodiment of the present invention may be applied to other batteries such as lithium ion batteries. Also, as the appliances to be battery-powered, not only the electric vehicle such as the above-described scooter, but also other electric appliances using batteries may be realized.

In the following embodiments, a lithium ion battery is used as a battery, and a portable computer is used as a connected load. Based on the actual data obtained from the computer, the effects of the present invention will now be explained.

A structure of a battery capacitor meter itself is identical to that of FIG. 1 in the eleventh embodiment. The microcomputer shown in FIG. 1 may be exclusively used to measure the remaining capacity, and also the microcomputer of the portable computer may be commonly used.

To execute the present invention, program steps executed by the microcomputer are the same as those shown in the flow chart of FIG. 5 in the tenth embodiment. It should be noted that the respective constant values defined in the flow chart are different from those for the lead battery case. First, in this embodiment, the respective constants are optimized for the lithium ion cell. Various equations related to this calculation containing the optimized constants will now be expressed.

To obtain an initial value of a charge state S, the following equations are utilized:

$$S_0=106.75-58.34V_0+11.91V_0^2-1.061V_0^3+0.03453V_0^4$$

(in the equation (1), $K_0$=106.75, $K_1$=−58.34 volt$^{-1}$, $K_2$=11.91 volt$^{-2}$, $K_3$=−1.061 volt $^{-3}$, $K_4$=0.03453 volt$^{-4}$).

To calculate a predicted discharge current, the following equation is stored:

$$I_i=[8.17-1.2S_i-3.5(S_i-0.36)^2-V_i]\div 0.39.$$

Here, in the equation (2), A=8.17 V, B=1.2 V, C=3.5 V, R=0.39Ω, $S_{ZONE1}$=0.0, $S_{ZONE2}$=0.36. When the value of $S_i$ is increased from 0 to 0.36, ($S_i$–$S_{ZONE2}$) is unchanged, (remains 0). When the value of $S_i$ is increased from 0.36 to 1, ($S_i$–$S_{ZONE2}$) is linearly increased from 0 to 0.64.

To calculate a variation amount of the charge state, the following equation is employed:

$$\Delta S_i=[I_i\cdot 1\cdot f(I_i, S_i)]\div 4716$$

Here, f(I, S)=$(S*I/1)^{0.65}$/TANH $[(S*I/1)^{0.65}]$. Also, in the equation (3), Δt=1sec, M=1.31Ah·3600sec/hr, $I_0$=1A, Y=0.65.

In the below-mentioned embodiments for explaining the means of the present invention, in order to evaluate the display condition, when the portable computer was being operated, the terminal voltage data was acquired at 1 second intervals and stored an IC card. The battery was fully charged before use and the battery was operated by effecting such general operating conditions as calculations by the computer, scrolling of the screen, and printing. Generally speaking, a portable computer issues alarms when a specific voltage appears in order to protect various parts of the hard disk, or an operator's work, and then forcibly interrupts the work after a preselected time has passed. In this embodiment, the work is continued until such a forcible work interruption occurs.

Figure 55:
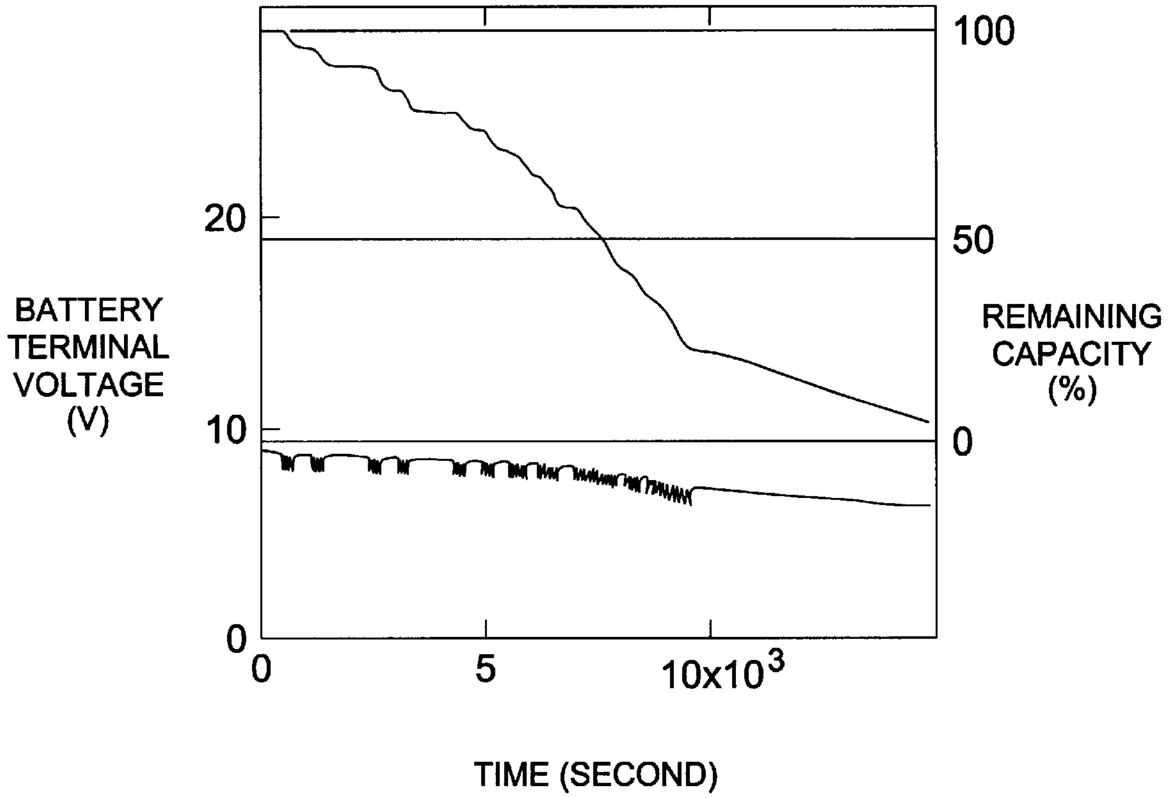
FIG. 55 is a graph for indicating a relationship (left vertical axis) between operation time of the portable computer and the discharge current, and a relationship (right vertical axis) between operation time and the remaining capacity % in the fourteenth embodiment.

In FIG. 55, a relationship between the operation time, the terminal voltage, and the remaining capacity %, according to this embodiment is shown. As is apparent from FIG. 55, after the operation is ended, about 4% of the battery capacity remains. Since the operable voltage of the portable computer (5.7 V) was slightly higher than the designed voltage (5.5 V), this calculation result of the remaining capacity was not in complete agreement with the fact that a forcible interruption occurred. However, this capacity indication is substantially coincident with the operation characteristics of the portable computer. If the operable voltage is equal to the designed voltage, then this capacity indication is highly consistent with the actual battery capacity. This remaining capacity % is smoothly reduced while the speed is gradually increased near the end of the discharge operation. This type of behavior was also observed in examples 1~11 without fuel gauge normalization.

It should be noted that the terminal voltage data in FIG. 55 shows that the printer could not be operated after about 9000 seconds from the start, and thereafter only the computer main body could be operated.

Also in this embodiment, the equation calculation portion of the remaining capacity is replaced by a preformed table, so that the calculation may be executed in a simple manner. If fuel-gauge normalization is carried out to display the remaining capacity, the reduction manner of the remaining capacity for the work amount (power consumption amount) may be made linear.

Although the current I has been calculated from the S value and the measured voltage value V in the above-described embodiments, these values may be directly, or indirectly measured by using various sorts of sensors, or detecting circuits, and may be used in the calculations of the present invention. To measure the current, the following methods can be employed, i.e., a direct measuring method with employment of a Hall element, or a shunt resistor detecting unit, an indirect current detecting method by detecting rotation speeds of a motor and a method in which previously measured currents, used in the respective portions of the appliance, are referenced and for calculating the used currents in response to the use conditions.

Figure 56:
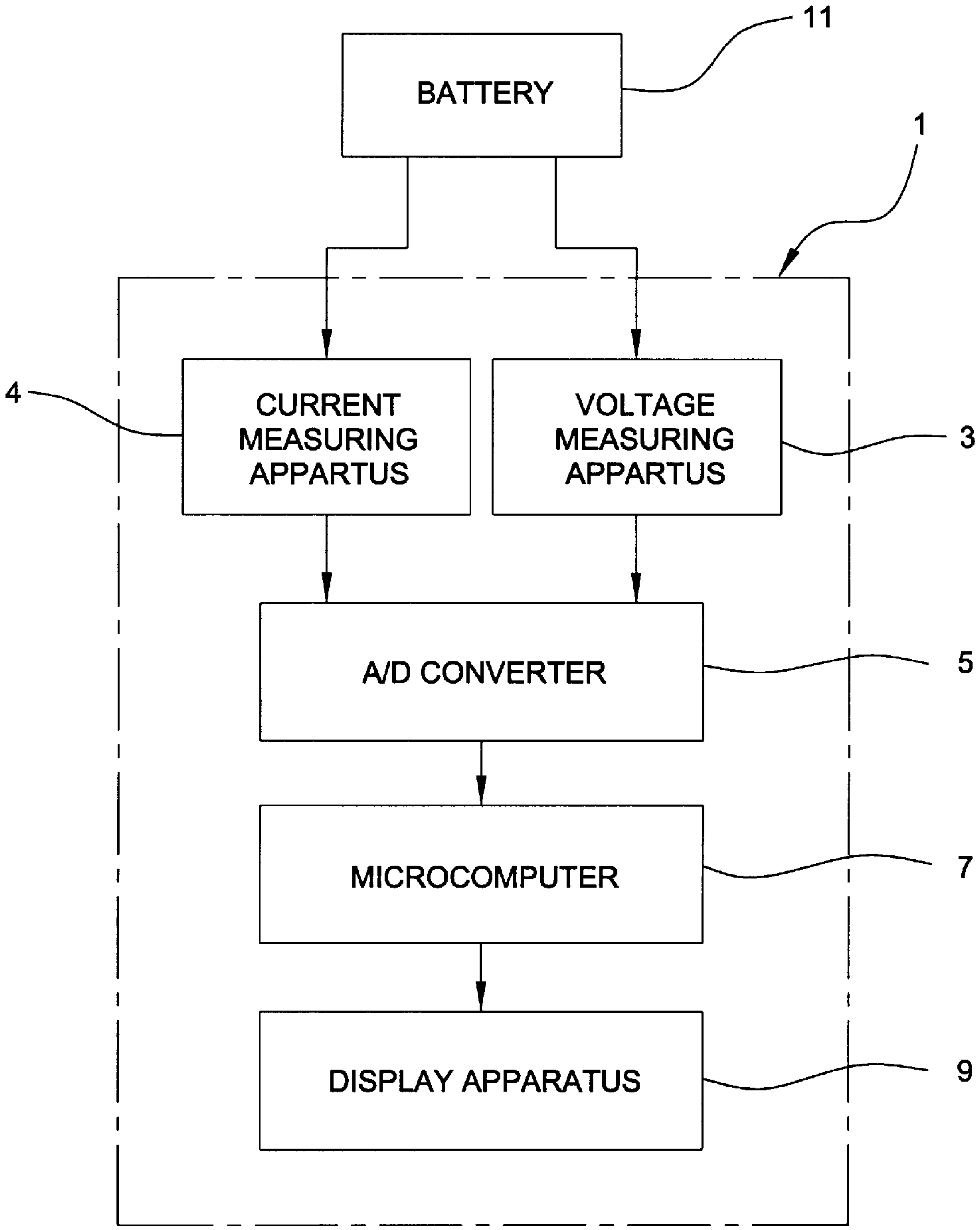
FIG. 56 is a schematic diagram for showing an overall circuit arrangement of a battery capacity meter having a current detecting unit in the fifteenth embodiment.

In the following fifteenth embodiment, there is shown a current detecting mechanism added to the methods for the eleventh and twelfth embodiments in which voltage only was measured. In this embodiment, the discharge data actually obtained from the electric scooter has been employed. Both the battery and the main apparatus are identical to those of the eleventh embodiment. A concrete example of the altered arrangement in which the current detection unit has been added is shown in FIG. 56. This battery capacity meter is characterized by a voltage measuring apparatus 3, an analog-to-digital converter (A/D converter) 5, a microcomputer 7, a display device 9, and a current detecting apparatus 4 including a detecting unit such as a Hall element. For example, a signal detected by the Hall element in the current measuring apparatus 4 is entered into the microcomputer 7 via the A/D converter 5. In the microcomputer 7, the remaining capacity calculation is carried out in a similar manner to the above embodiments.

Figure 57:
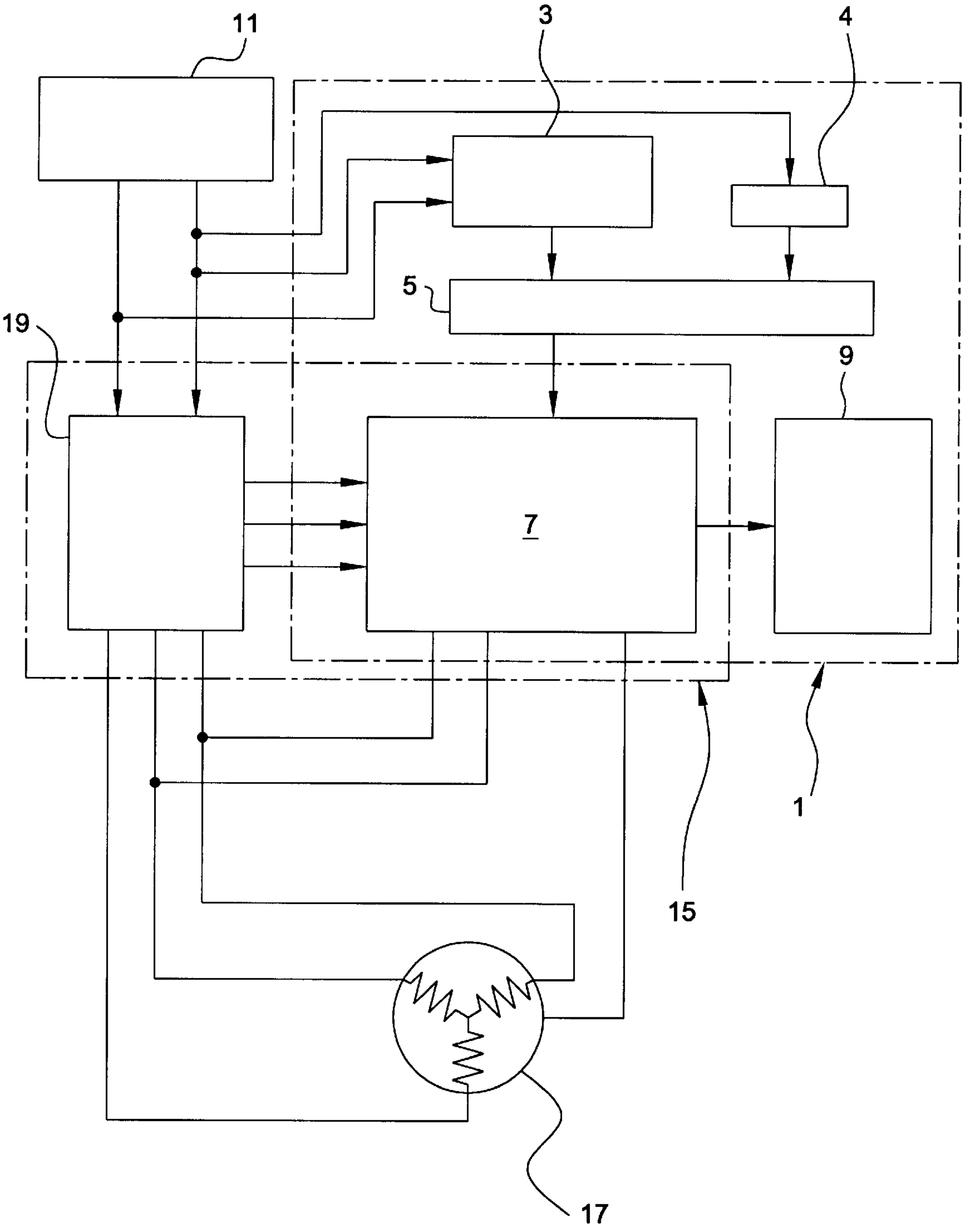
FIG. 57 is a schematic diagram for indicating an overall circuit arrangement of a battery capacity meter (commonly using a microcomputer for a motor controller) in the fifteenth embodiment.

Another concrete example of the apparatus for calculating the battery capacity of the electric scooter is shown in FIG. 57. This example of FIG. 57 is constructed by adding the current detecting apparatus 4 containing a detecting unit such as the Hall element as shown in FIG. 2 of the eleventh embodiment.

Figure 58:
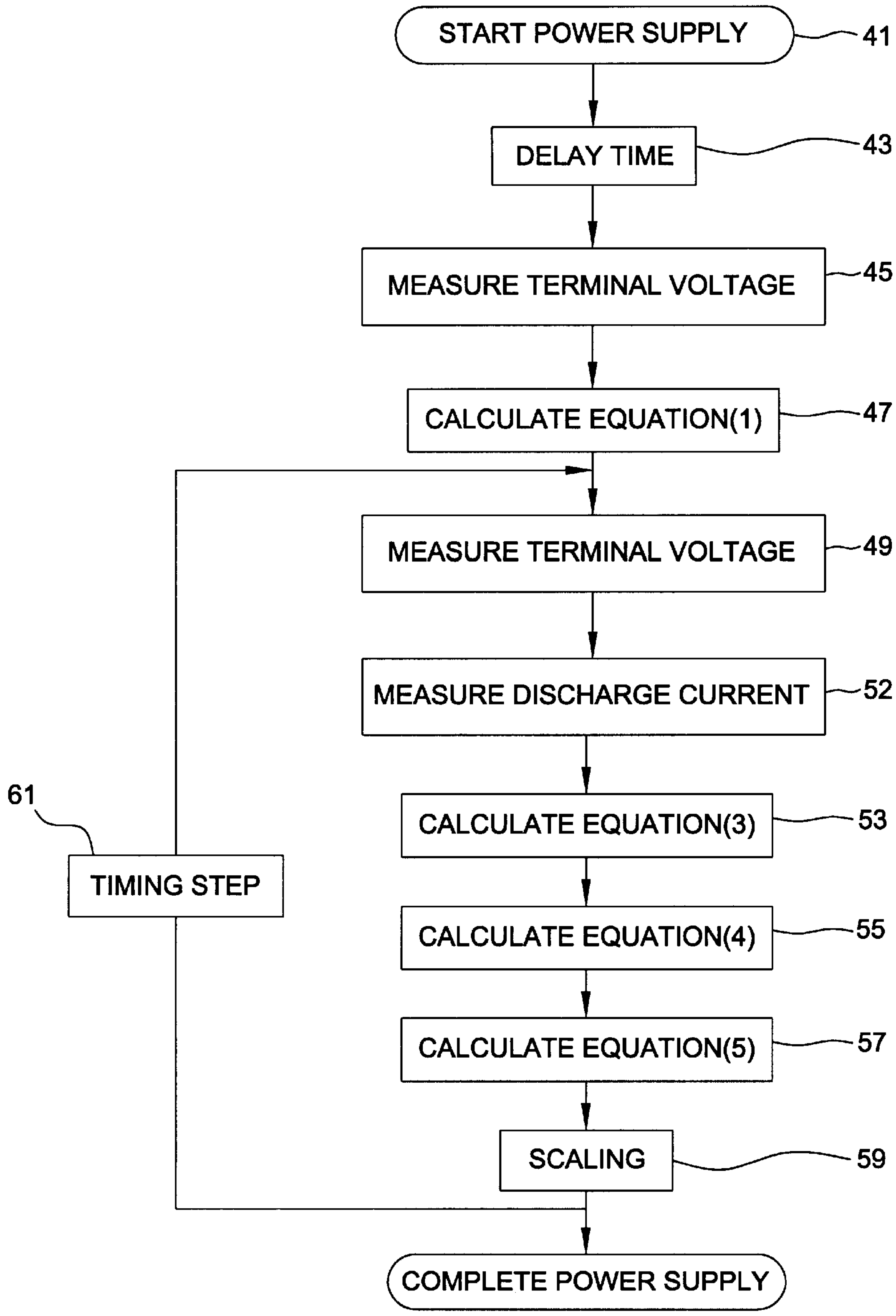
FIG. 58 is a flow chart for showing a process step in the fifteenth embodiment.

To execute the present invention, program steps executed by the microcomputer are shown in a flow chart of FIG. 58. The flow chart of FIG. 58 is substantially similar to that of FIG. 5. However, instead of the $I_i$ predicting calculation using the equation (2) shown in the block 51 of FIG. 5, the discharge current is actually measured in a block 51.

The program steps executed by the microcomputer 7 were loaded into the ROM of the microcomputer 7. In case of the electric scooter equipped with the battery capacity meter of the present invention, the equations, constants and/or data tables were stored in the ROM. To calculate the initial value of the charge state S, the following equation was stored:

$$S_0 = 13 - 0.25 V_0 \text{(in the equation (1), } K_0 = 13, K_1 = -0.25 \text{ volt}_{-1}\text{)}$$

To calculate a change amount of state of charge S, the following equation was utilized:

$$\Delta S_i = [I_i \cdot 1 \cdot f(I_i, S_i)] \div 140400$$

Here, $f(I, S) = (S*I/3)^{0.47}/\text{TANH}[(S*I/3)^{0.47}]$. In the equation (3), $\Delta t = 1 \text{sec}$, $M = 39 \text{Ah} \cdot 3600 \text{sec/hr}$, $I_0 = 3A$, $Y = 0.47$.

In the following example for explaining the present invention, to evaluate the display conditions on the computer, when the electric scooter was being operated, the discharge current data was acquired in 1 second intervals and stored on an IC card. As before, the battery was fully charged before the drive.

As the drive course of this example, the above-explained lake course was used, and the public roads were used. This lake course was relatively flat and a small number of signal lights was present.

The scooter was driven in two circuits of the lake course without turning ON the headlights. At the completion of the run, the power was not cut off.

Figure 59:
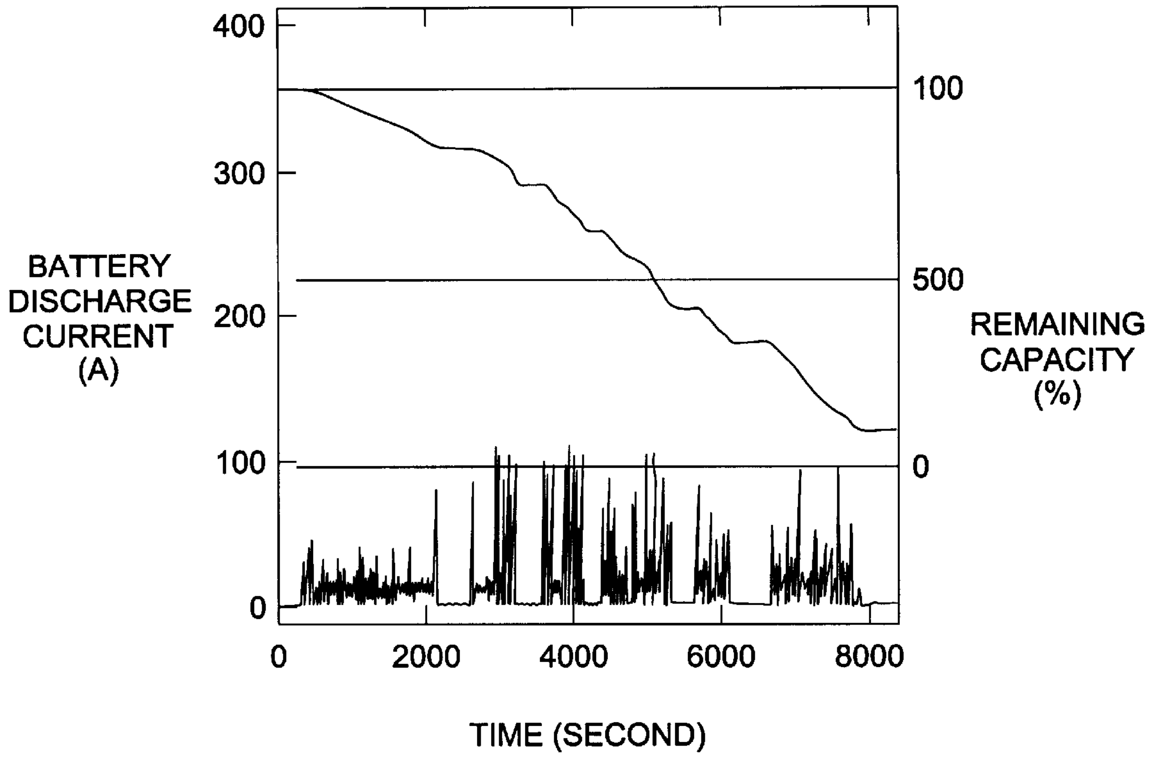
FIG. 59 is a graph indicating a relationship (left vertical axis) between drive time and terminal voltages, and a relationship (right vertical axis) between drive time and remaining capacity %.

In FIG. 59, a relationship between the drive time (seconds), the remaining capacity (%) and the discharge current is shown. A scale of the remaining capacity is indicated on the right vertical axis, whereas a scale of the discharge current is represented on the left vertical axis.

As apparent from FIG. 59, about 9% of the battery capacity remains after drive operation. This calculation result of the remaining capacity is consistent with the fact that the power was not cut off by the scooter drive. The remaining capacity % is smoothly reduced with the decrease gradually increasing in the latter half of the discharge operation. This display operation clearly reflects that the electric energy remains in the battery. In order that the display value of the battery capacity is linearly reduced in accordance with the distance over hich the EV is driven at a constant speed, the display value must be normalized. The fuel-gauge normalization should be carried out such that the display characteristic equivalent to a fuel gauge's display characteristic is obtained. Such a normalized display value is linearized with respect to power consumption.

As previously represented in the respective embodiments, the calculation portion of the capacity meter may be substituted by using a previously formed table, so that the calculation can be simply and quickly performed. Also, as apparent from the foregoing descriptions, if the remaining capacity indication is normalized, the decrease in the remaining capacity with respect to the drive distance will be nearly linear.

As previously explained, the following effects can be achieved according to the present invention.

In accordance with the present invention, the state of charge of the battery is specified by measuring the terminal voltage, and the change amount of the state of charge is obtained based on the state of charge condition and the discharge current, so that the state of charge can be specified in response to various discharging conditions. Accordingly, it is possible to obtain the remaining capacity with a high degree of accuracy, in response to the two battery characteristics which belong to the major group. Since these calculations consist of the simple data process steps, which can be quickly and easily executed by a low-cost microcomputer, an inexpensive capacity meter with low manufacturing costs can be obtained.

The discharge current amount can be reliably predicted from the terminal voltage. Since only the terminal voltage of the battery need be detected for operation of this invention, higher reliability can be achieved and moreover, the detection circuit can be made simple, and the total components can be reduced, resulting in a low manufacturing cost.

The battery discharge characteristics are based on several constants which depend on the battery type. These constants, once fixed, allow the calculation of the discharge currents with a high degree of accuracy.

The change amount of the state of charge can be calculated in accordance with the following equation which employs the function f(I, S) limited to having the predetermined characteristics of the present invention.

$$\Delta S = (I \times \Delta t \times f(I, S)) \div M.$$

As a result, the change amount of the state of charge can be accurately calculated, resulting in accurate determinations of the remaining capacity.

The current acquiring means may be implemented directly by measuring the discharge current.

The change amount of the state of charge can be calculated in the control unit of the device to which the power of the battery is supplied, so that the manufacturing cost of the constructive components required to calculate the remaining capacity can be reduced.

When S=0 in case of full charge state and S=1 in case of empty charge state, the indication value S of the battery charge state may be converted into an index value indicative of the remaining capacity.

The correction process can be performed so as to cause the variation characteristic of the indication value S to be substantially proportional to the power consumption of the battery, so that the remaining capacity can be displayed in response to the power consumption, and a display characteristic equivalent to that of a fuel gauge can be obtained. The correction process can also be performed so that the indication value is substantially proportional to a representative output of the powered device. This output may include, for example, the distance travelled by an EV.

The display characteristic of the indication value S can be corrected to be equal to the display characteristic of a fuel gauge using the correction function h(S). In this way, the display characteristic of the remaining capacity can be adjusted to the user's expectations.

Data stored in a table may be employed instead of the separate programming steps for performing calculation steps, so that the programming steps of the present method can be quickly processed.

Data processing based on tables may be employed at any one of the steps (a), (b), (c), (f) so that the calculation results can be quickly obtained.

Since the present invention is applied to an electric vehicle, it is possible to obtain a battery capacity meter especially suitable for the characteristics of the electric vehicle.

While this invention has been described in conjunction with specific embodiments thereof, it is evident that many alternatives, modifications and variations will be apparent to those skilled in the art. Accordingly, the preferred embodiments of the invention as set forth herein are intended to be illustrative, not limiting. Various changes may be made without departing from the scope of the invention as defined in the following claims.

What is claimed is:

1. A method for determining battery capacity comprising the steps of:

a) measuring an initial value $V_0$ of a terminal voltage of a battery to obtain an initial state of charge condition value $S_0$ of an indication value S indicative of a state of charge condition of the battery, in which S is defined to be equal to 0 when the battery is fully charged and is defined to be equal to 1 when the battery is effectively discharged;

b) determining a subsequent value $V_i$ of a terminal voltage after a time interval Δt and estimating a discharge current value I based on the determined subsequent value $V_i$;

c) calculating a change $\Delta S_0$ in the initial value state of charge condition $S_0$ of the battery over the time interval Δt as a function of the discharge current value I and the initial state of charge condition indication value $S_0$ using the following equation:

$$\Delta S_0 = I_i \times \Delta t \times f(I_i, S_0) \div M$$

wherein an average battery discharge current corresponding to said discharge current value I is $I_i$, where $f(I_i,S_0)$ is a function such that when $S_0=0$ $f(I_i,S_0)=\times 1$; when $S_0=1$, $f(I_i,S_0)=1$ if $I_i$ is low, $f(I_i S_0)=(I_i \div I_0)^Y$ if $I_i$ is high, and $f(I_i,S_0)$ increases monotonically when $S_0$ is increased from 0 to 1; and M, $I_0$, and Y are constants depending on the battery;

d) updating the state of charge condition by calculating a current state of charge condition value $S_i$ of the indication value S, wherein $S_i=S_0+\Delta S_0$;

e) repeating step b;

f) calculating a change $\Delta S_i$ in the current state of charge condition value $S_i$ of the battery over the time interval Δt as a function of the discharge current value $I_i$ and the state of charge condition indication value $S_i$ using the following equation;

$$\Delta S_i = I_i \times \Delta t \times f(I_i, S_i) \div M$$

wherein $f(I_i,S_i)$ is a function such that when $S_i=0$, $f(I_i,S_i)=1$; when $S_i=1$, $f(I_i S_i)=1$ if $I_i$ is low, $f(I_i S_i)=(I_i \div I_0)^Y$ if $I_i$ is high, and $f(I_i,S_i)$ increases monotonically when $S_i$ is increased from 0 to 1; and M, $I_0$, and Y are constants depending on the battery; and g) updating the state of charge condition by calculating a new value $S_{i+1}$ of the indication value S indicative of a new state of charge condition of the battery from the equation:

$$S_{i+1} = S_i + \Delta S_i.$$

2. The method of claim 1, wherein at said step a), said initial state of charge condition value $S_0$ of an indication value S indicative of the state of charge condition of said battery is calculated by employing the following equation:

$$S_0 = K_0 + K_1 V_0^1 + K_2 V_0^2 + \ldots + K_n V_0^n,$$

where symbols $K_0$, $K_1$, $K_2$, . . . , $K_n$ are constants depending on the battery.

3. The method of claim 1, wherein data representing a correspondence table among said indication value $S_i$, said terminal voltage $V_i$, and said variation amount $S_{Qi}$ are previously stored in a memory, and wherein said variation amount $\Delta S_i$ is calculated from said data at said step f).

4. The method of claim 1, further comprising:

calculating an index value of said battery capacity based upon the following equation:

$$\text{capacity} = (1 - S_{i+1}) xn,$$

where n is an arbitrary real number.

5. The method of claim 1, further comprising:

performing a correction process to said indication value $S_{i+1}$ so that a corrected value of said indication value is substantially proportional to a representative output value of a device powered by said battery.

6. The method of claim 5, wherein said correction process performing step comprises calculating a linearized index of said battery capacity by employing the following equation:

$$\text{capacity} = \{1 - h(S_{i+1})\} xn,$$

where symbol n indicates an arbitrary real number, and h(S) is a function such that when S is increased from 0 to 1, this function increases monotonically; when S=0, h(S)=0; when S=1; h(S)=1; and when S=½, ½<h(S)<$3^{1/2}$/2.

7. The method of claim 1, wherein in at least one of said steps a), b), and c) data representing a correspondence table between said used data and the calculation results are previously stored in a memory, and a process operation is carried out based on said data.

8. The method of claim 1, wherein at said step b), said subsequent value of the terminal voltage $V_i$ is sequentially measured at every time interval Δt, and the average battery discharge current $I_i$ at a time interval Δt is calculated by the following equation:

$$[I_i=\{A-B\times(Q_i-Q_{ZONE1})-C\times(Q_i-Q_{ZONE2})^2-V_i\}+R]I_i=\{A-B\times(S_i-S_{ZONE1})-C\times(S_i-S_{ZONE2})^2-V_i\}\div R,$$

where symbols A, B, C, R, $S_{ZONE1}$, $S_{ZONE2}$ are constants dependent on the battery, $0\leqq S_{ZONE1}\leqq 0.99$, $S_{ZONE1}\leqq S_{ZONE2}\leqq 0.99$, $0\leqq S-S_{ZONE1}$,$0\leqq S_{ZONE2}$, and $S_i$ is an indication value representative of the current battery state of charge condition.

* * * * *